US012805286B2

(12) United States Patent
Lee et al.

(10) Patent No.: US 12,805,286 B2

(45) Date of Patent: Nov. 17, 2026

(54) INTEGRATED CIRCUIT DEVICE

(71) Applicant: Samsung Electronics Co., Ltd., Suwon-si (KR)

(72) Inventors: Youngbin Lee, Suwon-si (KR); Man Chang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 325 days.

(21) Appl. No.: 18/492,946

(22) Filed: Oct. 24, 2023

(65) Prior Publication Data

US 2024/0321690 A1 Sep. 26, 2024

(30) Foreign Application Priority Data

Mar. 24, 2023 (KR) ........................ 10-2023-0039160
Apr. 12, 2023 (KR) ........................ 10-2023-0048286

(51) Int. Cl.

| | |
|---|---|
| ***H10W 20/20*** | (2026.01) |
| ***H10D 84/83*** | (2025.01) |
| ***H10W 20/00*** | (2026.01) |
| ***H10W 20/42*** | (2026.01) |

(52) U.S. Cl.

CPC ......... *H10W 20/20* (2026.01); *H10W 20/023* (2026.01); *H10W 20/075* (2026.01); *H10W 20/076* (2026.01); *H10W 20/42* (2026.01); *H10D 84/83* (2025.01)

(58) Field of Classification Search

CPC . H10D 30/501–509; H10D 30/43–435; H10D 62/119–123; H10D 30/014; Y10S 977/938

See application file for complete search history.

(56) References Cited

U.S. PATENT DOCUMENTS

| | | | | |
|---|---|---|---|---|
| 7,129,554 | B2 | 10/2006 | Lieber et al. | |
| 8,410,559 | B2 | 4/2013 | Li et al. | |
| 9,355,904 | B2 | 5/2016 | Ramachandran et al. | |
| 9,425,129 | B1 | 8/2016 | Zang et al. | |
| 9,691,658 | B1 | 6/2017 | Alptekin et al. | |
| 10,269,700 | B2 | 4/2019 | Chiu et al. | |
| 11,062,942 | B2 | 7/2021 | Ren et al. | |
| 11,521,896 | B2 | 12/2022 | Tien et al. | |
| 2018/0102285 | A1 * | 4/2018 | Siew | H10W 20/034 |
| 2019/0123051 | A1 * | 4/2019 | Park | H10B 12/0335 |
| 2021/0265501 | A1 | 8/2021 | Hung et al. | |
| 2022/0399251 | A1 * | 12/2022 | Cho | H01L 23/481 |
| 2023/0352346 | A1 * | 11/2023 | Lee | C23C 16/403 |

OTHER PUBLICATIONS

European Extended Search Report corresponding to EP 24152442.0; Date: Jul. 5, 2024, (10 pages).

(Continued)

*Primary Examiner* — Christine S. Kim
*Assistant Examiner* — Cole Leon Lindsey
(74) *Attorney, Agent, or Firm* — Wolf, Greenfield & Sacks, P.C.

(57) ABSTRACT

An integrated circuit device includes a substrate, an insulating structure on a frontside surface of the substrate, a contact structure including a first plug portion that extends through the substrate, and a self-assembled organic material insulating liner between the first plug portion and the substrate.

20 Claims, 47 Drawing Sheets

(56) References Cited

OTHER PUBLICATIONS

Barriga, J., et al., "Molecular dynamics study of optimal packing structure of OTS self-assembled monolayers on SiO2 surfaces", Tribology International 40, 2007, 960-966.
Fontaine, P., et al., "Octadecyltrichlorosilane monolayers as ultrathin gate insulating films in metal-insulator-semiconductor devices", Appl. Phys. Lett. 62(18), 1993, 2256-2258.
Halik, Marcus, et al., "Low-voltage organic transistors with an amorphous molecular gate dielectric", Nature, vol. 431, 2004, 963-966.
Park, Yeong Don, et al., "Low-voltage polymer thin-film transistors with a self-assembled monolayer as the gate dielectric", Appl. Phys. Lett. 87, 243509, 2005.
Rozlosnik, Noemi, et al., "Effect of Solvents and Concentration on the Formation of a Self-Assembled Monolayer of Octadecylsiloxane on Silicon (001)", Langmuir 19, 2003, 1182-1188.
Sugimura, Hiroyuki, et al., "Organosilane self-assembled monolayers formed at the vapour/solid interface", Surface and Interface Analysis 34, 2002, 550-554.

* cited by examiner

Y1 – Y1'

INTEGRATED CIRCUIT DEVICE

CROSS-REFERENCE TO RELATED APPLICATION

This application is based on and claims priority under 35 U.S.C. § 119 to Korean Patent Application No. 10-2023-0039160, filed on Mar. 24, 2023, and Korean Patent Application No. 10-2023-0048286, filed on Apr. 12, 2023, in the Korean Intellectual Property Office, the disclosure of which is incorporated by reference herein in its entirety.

BACKGROUND

The inventive concept relates to an integrated circuit device, and more particularly, to an integrated circuit device including a backside contact structure.

Due to the advance of electronics technology, integrated circuit devices have been rapidly down-scaled. Because highly down-scaled integrated circuit devices with accurate operations as well as high operation speeds may be beneficial, a wiring structure that is stable and optimized in a relatively small area has been proposed.

SUMMARY

The inventive concept provides an integrated circuit device exhibiting improved electrical reliability when the integrated circuit device has a device region having a reduced area due to down-scaling.

According to an aspect of the inventive concept, there is provided an integrated circuit device including a substrate, an insulating structure on a frontside surface of the substrate, a contact structure, which includes a first plug portion extending through the substrate, and a self-assembled organic material insulating liner disposed between the first plug portion and the substrate.

According to another aspect of the inventive concept, there is provided an integrated circuit device comprising a substrate that comprises a frontside surface and a backside surface opposite to the frontside surface, a plurality of fin-type active regions protruding in a vertical direction (e.g., Z direction) from the substrate and extending longitudinally (e.g., lengthwise) in a first horizontal direction, an insulating structure comprising a device isolation film, which extends on (e.g., covers) a sidewall of each of the plurality of fin-type active regions, a plurality of gate lines over (e.g., traversing) the plurality of fin-type active regions, a plurality of source/drain regions on the plurality of fin-type active regions respectively, a contact structure extending through the substrate and the insulating structure in the vertical direction, and an insulating liner comprising a self-assembled organic material between the contact structure and the substrate, wherein the contact structure includes a first plug portion, which extends through the substrate and is in contact with the self-assembled organic material insulating liner, and a second plug portion, which extends through the insulating structure and is connected to the first plug portion.

According to another aspect of the inventive concept, there is provided an integrated circuit device including a substrate comprising a frontside surface and a backside surface opposite to the frontside surface, a fin-type active region protruding in a vertical direction from the substrate and extending longitudinally in a first horizontal direction, a gate line arranged over (e.g., traversing) the fin-type active region and extending longitudinally in a second horizontal direction that intersects with the first horizontal direction, at least one nanosheet that is between the fin-type active region and the gate line and comprises a portion in the gate line, a source/drain region on the fin-type active region and contacting the at least one nanosheet, an insulating structure comprising a device isolation film, that is on (e.g., covers) both sidewalls of the fin-type active region, a contact structure extending through the substrate and the insulating structure in the vertical direction, and a self-assembled organic material insulating liner between the contact structure and the substrate, wherein the self-assembled organic material insulating liner comprises a plurality of organic carbon chains, each chain comprising a silicon atom and a C1 to C30 alkyl group. In some embodiments, the at least one nanosheet may be surrounded by the gate line.

BRIEF DESCRIPTION OF THE DRAWINGS

Embodiments will be more clearly understood from the following detailed description taken in conjunction with the accompanying drawings in which:

FIGS. 11A to 27 are diagrams respectively illustrating a sequence of processes of a method of fabricating an integrated circuit device, according to some of the present inventive concept, and in particular, FIGS. 11A, 12A, 14A, 15A, 16A, 17A, 22A, and 23A are cross-sectional views each illustrating an example of a cross-sectional structure of a portion of the integrated circuit device, which corresponds to the cross-section taken along the line X1-X1' of FIG. 2, according to the sequence of processes, FIGS. 11B, 12B, 13, 14B, 15B, 17B, 18, 19A, 20, 21, 22B, 23B, 24, 25, 26, and 27 are cross-sectional views each illustrating an example of a cross-sectional structure of a portion of the integrated circuit device, which corresponds to the cross-section taken along the line Y1-Y1' of FIG. 2, according to the sequence of processes.

DETAILED DESCRIPTION

Figure 1:
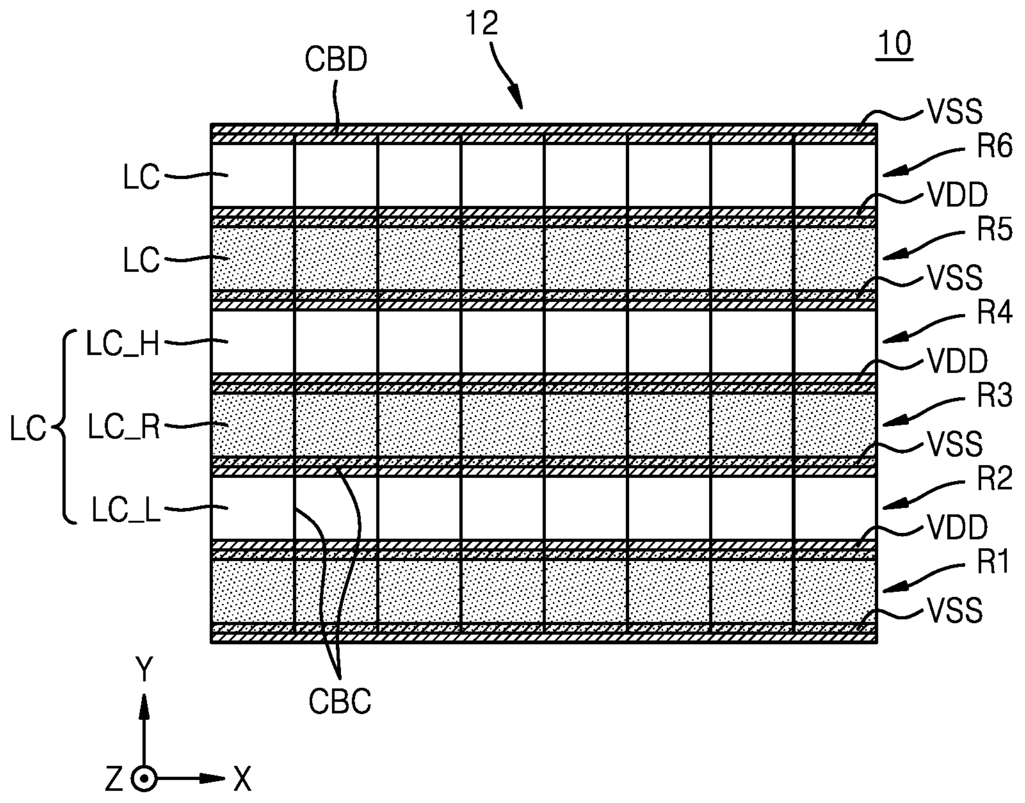
FIG. 1 is a schematic plan view of an example of a cell block of an integrated circuit device according to some embodiments of the present inventive concept.

Hereinafter, embodiments of the inventive concept will be described in detail with reference to the accompanying drawings. Like components are denoted by like reference numerals throughout the specification, and repeated descriptions thereof are omitted.

FIG. 1 is a schematic plan view of an example of a cell block 12 of an integrated circuit device 10 according to some embodiments.

Referring to FIG. 1, the cell block 12 of the integrated circuit device 10 may include a plurality of cells LC including circuit patterns for constituting various circuits. The plurality of cells LC may be arranged in a matrix in the width direction (X direction in FIG. 1) and the height direction (Y direction in FIG. 1) in the cell block 12.

The plurality of cells LC may comprise a circuit pattern having a layout designed by a Place and Route (PnR) technique to perform at least one logical function. The plurality of cells LC may perform various logical functions. In some embodiments, the plurality of cells LC may include, for example, a plurality of standard cells. In some embodiments, at least some of the plurality of cells LC may perform the same logical function. In some embodiments, at least some of the plurality of cells LC may perform different logical functions from each other.

The plurality of cells LC may include various types of logic cells including a plurality of circuit elements. For example, each of the plurality of cells LC may include, but is not limited to, an AND, a NAND, an OR, NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D flip-flop, a reset flip-flop, a master-slave flip-flop, a latch, or a combination thereof.

In the cell block 12, at least some of the plurality of cells LC constituting one row (that is, R1, R2, R3, R4, R5, or R6) in the width direction (X direction in FIG. 1) may have the same width. In addition, at least some of the plurality of cells LC constituting one row (that is, R1, R2, R3, R4, R5, or R6) may have the same height. However, the inventive concept is not limited to the example shown in FIG. 1, and at least some of the plurality of cells LC constituting one row (that is, R1, R2, R3, R4, R5, or R6) may have different widths and heights from each other.

The area of each of the plurality of cells LC in the cell block 12 of the integrated circuit device 10 may be defined by a cell boundary CBD. A cell interface portion CBC, at which respective cell boundaries CBD meet each other, may be arranged between two adjacent cells LC in the width direction (X direction in FIG. 1) or the height direction (Y direction in FIG. 1) from among the plurality of cells LC.

In some embodiments, two adjacent cells LC in the width direction from among the plurality of cells LC constituting one row (that is, R1, R2, R3, R4, R5, or R6) may be in contact with each other at the cell interface portion CBC without a separation distance therebetween. In some embodiments, two adjacent cells LC in the width direction from among the plurality of cells LC constituting one row (that is, R1, R2, R3, R4, R5, or R6) may be spaced apart from each other with a certain separation distance therebetween.

In some embodiments, in the plurality of cells LC constituting one row (that is, R1, R2, R3, R4, R5, or R6), two adjacent cells LC may perform the same function. In this case, the two adjacent cells LC may have the same structure. In some embodiments, in the plurality of cells LC constituting one row (that is, R1, R2, R3, R4, R5, or R6), two adjacent cells LC may perform different functions from each other.

In some embodiments, one cell LC selected from the plurality of cells LC, which are included in the cell block 12 of the integrated circuit device 10, and another cell LC adjacent to the selected cell LC in the height direction (Y direction in FIG. 1) may have symmetric structures to each other about the cell interface portion CBC therebetween. For example, a reference logic cell LC_R in the third row R3 and a lower logic cell LC_L in the second row R2 may have symmetric structures to each other about the cell interface portion CBC therebetween. In addition, the reference logic cell LC_R in the third row R3 and an upper logic cell LC_H in the fourth row R4 may have symmetric structures to each other about the cell interface portion CBC therebetween.

Although FIG. 1 illustrates the cell block 12 including six rows (that is, R1, R2, . . . , and R6), this is only one example, and the cell block 12 may include, in some embodiments, rows in various numbers selected as needed, and/or one row may include logic cells in various numbers selected as needed.

One selected from among a plurality of ground lines VSS and a plurality of power lines VDD may be arranged between a plurality of rows (that is, R1, R2, R3, R4, R5, and R6), which each include the plurality of cells LC arranged in a line in the width direction (X direction in FIG. 1). The plurality of ground lines VSS and the plurality of power lines VDD may each extend in a first horizontal direction (e.g., X direction) and may be alternately arranged to be spaced apart (e.g., to be separated) from each other in a second horizontal direction (e.g., Y direction). Therefore, each of the plurality of ground lines VSS and the plurality of power lines VDD may be arranged to overlap the cell boundary CBD of a logic cell LC, which extends in the second horizontal direction (e.g., Y direction).

Figure 2:
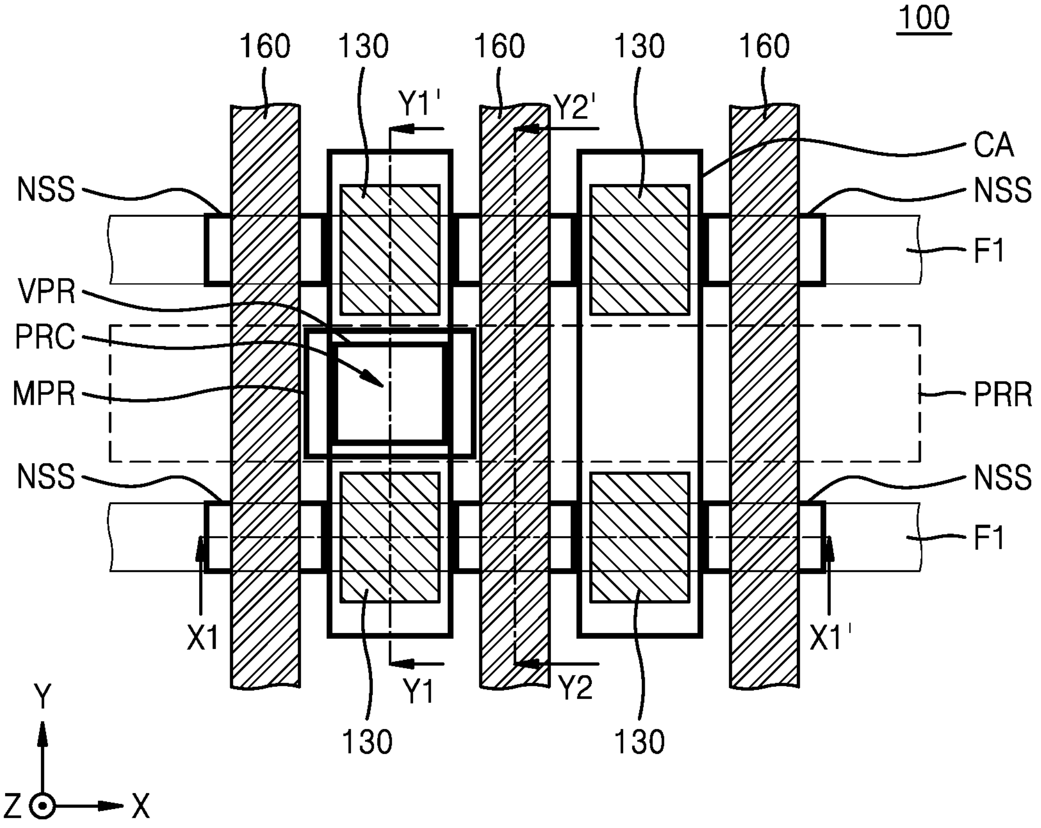
FIG. 2 is a planar layout diagram illustrating an integrated circuit device according to some embodiments of the present inventive concept.
Figure 3A:
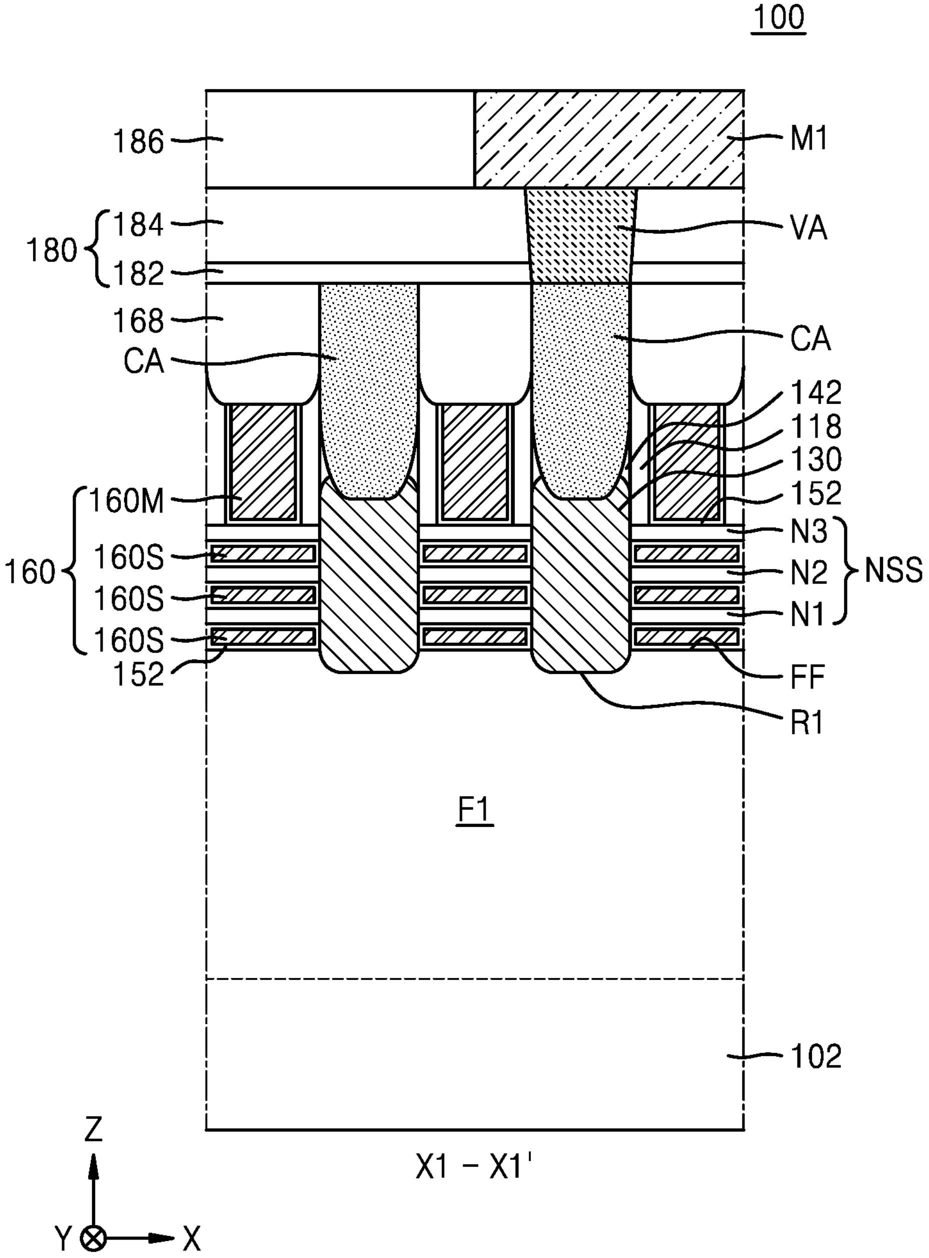
FIG. 3A is a cross-sectional view of the integrated circuit device according to some embodiments of the present inventive concept, taken along the line X1-X1' of FIG. 2.
Figure 3B:
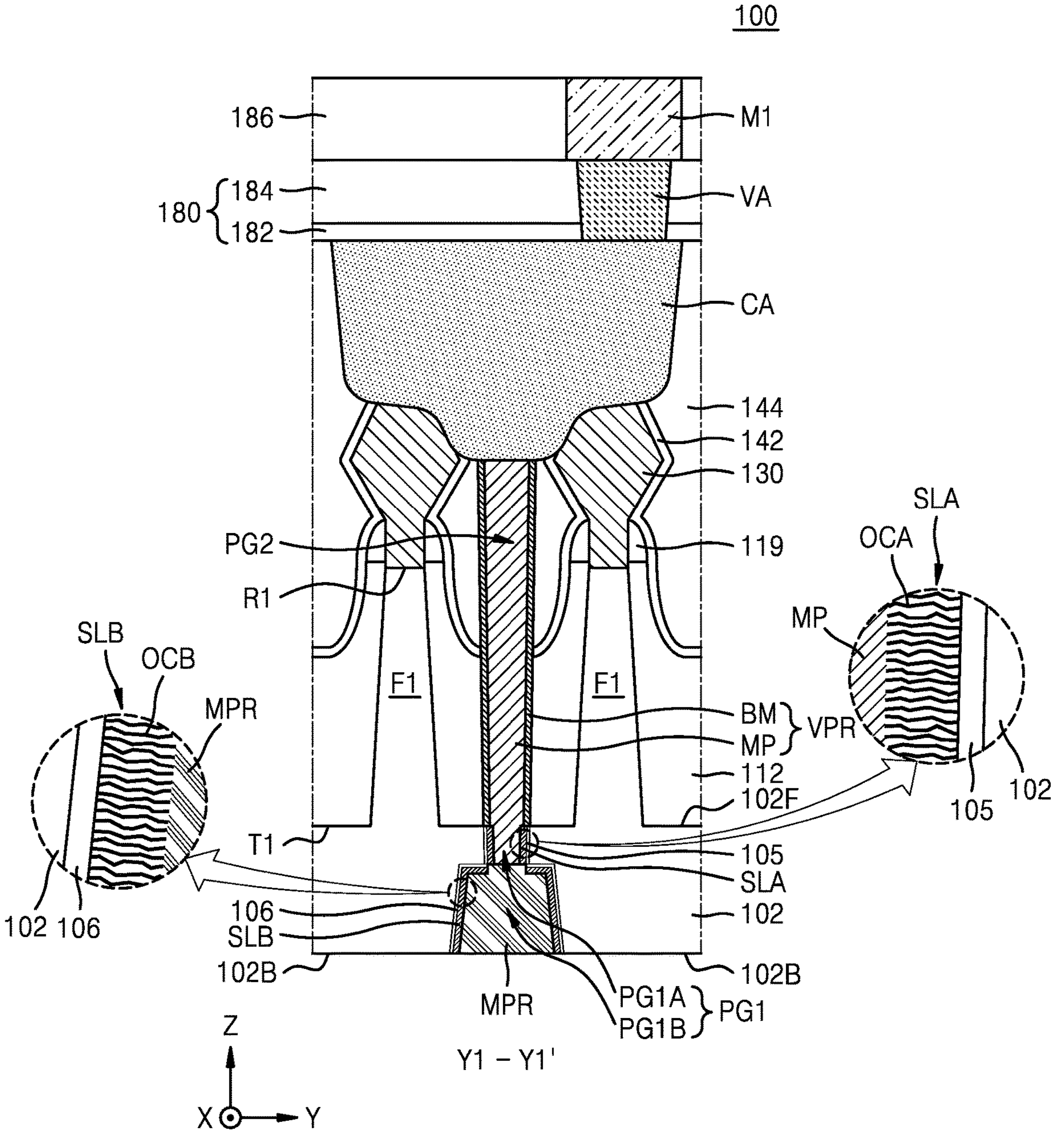
FIG. 3B is a cross-sectional view of the integrated circuit device according to some embodiments of the present inventive concept, taken along the line Y1-Y1' of FIG. 2.
Figure 3C:
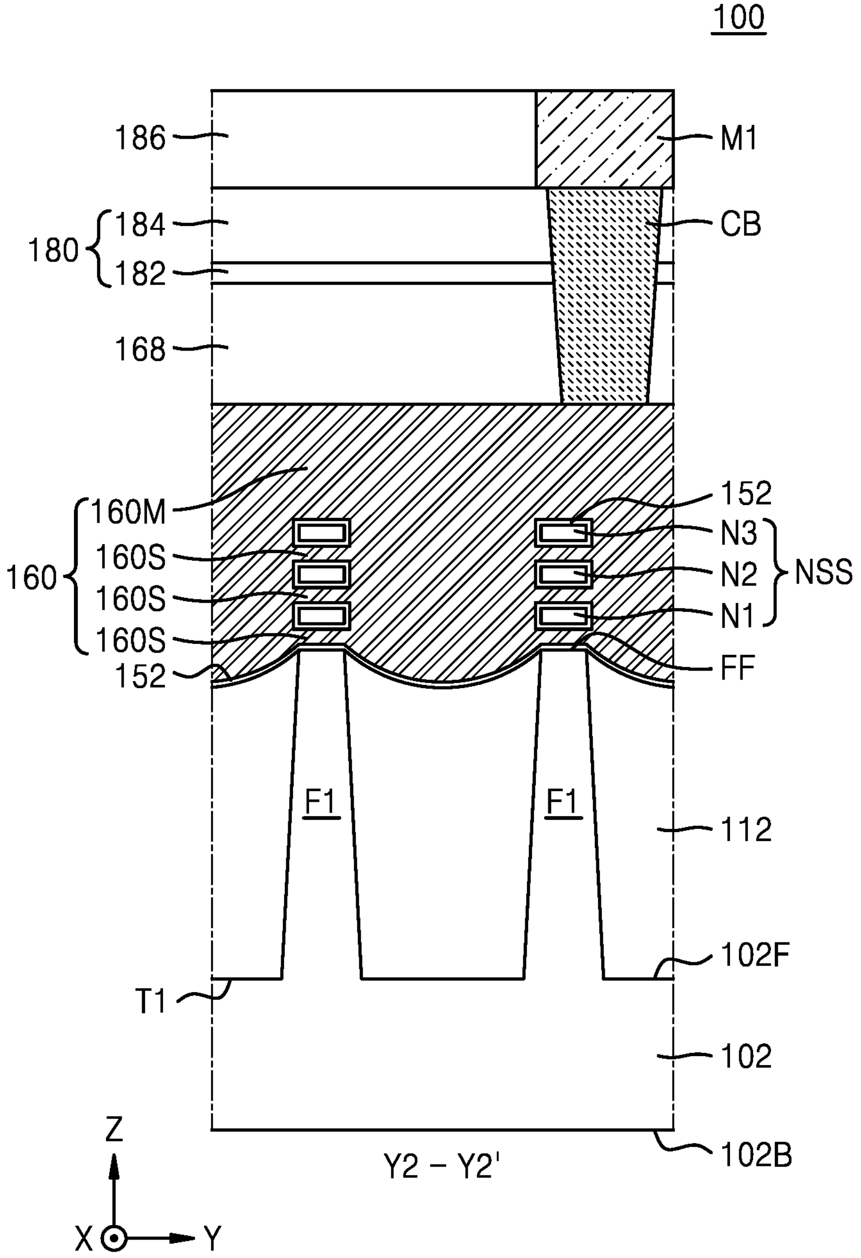
FIG. 3C is a cross-sectional view of the integrated circuit device according to some embodiments of the present inventive concept, taken along the line Y2-Y2' of FIG. 2.

FIG. 2 is a planar layout diagram illustrating an integrated circuit device 100 according to some embodiments. FIG. 3A is a cross-sectional view of the integrated circuit device 100, taken along the line X1-X1' of FIG. 2. FIG. 3B is a cross-sectional view of the integrated circuit device 100, taken along the line Y1-Y1' of FIG. 2. FIG. 3C is a cross-sectional view of the integrated circuit device 100, taken along the line Y2-Y2' of FIG. 2. The integrated circuit device 100 including a field-effect transistor, which has a gate-all-around structure including a nanowire or nanosheet-shaped active region and a gate surrounding the active region, is described with reference to FIGS. 2 and 3A to 3C. in some embodiments, the integrated circuit device 100 may include the plurality of cells LC shown in FIG. 1. Components of the integrated circuit device 100, examples embodiments of which are shown in FIGS. 2 and 3A to 3C, may constitute a portion of the plurality of cells LC shown in FIG. 1.

Referring to FIGS. 2 and 3A to 3C, the integrated circuit device 100 may include a substrate 102 having a frontside surface 102F and a backside surface 102B, which are opposite to each other. The substrate 102 and a plurality of fin-type active regions F1 may each include a semiconductor, such as Si or Ge, or a compound semiconductor, such as SiGe, SiC, GaAs, InAs, InGaAs, or InP. The substrate 102 may include a conductive region, for example, an impurity-doped well or an impurity-doped structure.

The plurality of fin-type active regions F1 may protrude in the vertical direction (e.g., Z direction) from the frontside surface 102F of the substrate 102. The plurality of fin-type active regions F1 may be arranged on the frontside surface 102F of the substrate 102 to extend longitudinally in the first horizontal direction (e.g., X direction) and to be spaced apart from each other in the second horizontal direction (e.g., Y direction) that is perpendicular to the first horizontal direction (e.g., X direction). A plurality of trench regions T1 may be defined on the frontside surface 102F of the substrate 102 by the plurality of fin-type active regions F1.

As shown in FIG. 2, the integrated circuit device 100 may include a power rail region PRR. The power rail region PRR may extend longitudinally in the first horizontal direction (e.g., X direction) to be spaced apart from the plurality of fin-type active regions F1 in the second horizontal direction (e.g., Y direction). A power rail wiring line MPR may be arranged in a portion of the power rail region PRR, which is adjacent to the backside surface 102B of the substrate 102. In some embodiments, the power rail wiring line MPR may constitute a ground line VSS shown in FIG. 1. The power rail wiring line MPR may extend through a portion of the substrate 102 in the vertical direction (e.g., Z direction) from the backside surface 102B of the substrate 102.

In some embodiments, the power rail wiring line MPR may include a metal wiring layer. In some embodiments, the power rail wiring line MPR may include a metal wiring layer and a conductive barrier film surrounding the metal wiring layer. The metal wiring layer may include Ru, Co, W, or a combination thereof. The conductive barrier film may include Ti, TiN, Ta, TaN, or a combination thereof.

As shown in FIGS. 3B and 3C, a device isolation film 112 may be arranged between the plurality of fin-type active regions F1. The device isolation film 112 may fill the plurality of trench regions T1 and cover a sidewall of each of the plurality of fin-type active regions F1. The device isolation film 112 may include, but is not limited to, a silicon oxide film.

As shown in FIGS. 3A and 3C, a plurality of gate lines 160 may be arranged over the plurality of fin-type active regions F1 and the device isolation film 112. Each of the plurality of gate lines 160 may extend longitudinally in the second horizontal direction (e.g., Y direction) to intersect with the plurality of fin-type active regions F1. In intersection areas between the plurality of fin-type active regions F1 and the plurality of gate lines 160, a plurality of nanosheet stacks NSS may be arranged over a fin top surface FF of each of the plurality of fin-type active regions F1. Each of the plurality of nanosheet stacks NSS may include at least one nanosheet arranged to be spaced apart from the fin top surface FF of a fin-type active region F1 in the vertical direction (e.g., Z direction) to face the fin top surface FF of the fin-type active region F1. As used herein, the term "nanosheet" refers to a conductive structure having a cross-section that is substantially perpendicular to a current-flowing direction. The nanosheet may also be understood as comprising a nanowire.

Each of the plurality of nanosheet stacks NSS may include a first nanosheet N1, a second nanosheet N2, and a third nanosheet N3, which can overlap each other in the vertical direction (e.g., Z direction), over the fin-type active region F1. The first nanosheet N1, the second nanosheet N2, and the third nanosheet N3 may respectively have different vertical distances (e.g., Z-direction distances) from the fin top surface FF of the fin-type active region F1. Each of the plurality of gate lines 160 may surround the first nanosheet N1, the second nanosheet N2, and the third nanosheet N3, which overlap each other in the vertical direction (e.g., Z direction). Each of the first nanosheet N1, the second nanosheet N2, and the third nanosheet N3, which are included, for example, in a nanosheet stack NSS, may function as a channel region. In some embodiments, each of the first nanosheet N1, the second nanosheet N2, and the third nanosheet N3 of the nanosheet stack NSS may include an Si layer, an SiGe layer, or a combination thereof. As used herein, "an element A overlapping an element B in a direction X" (or similar language) means that there is at least one line that extends in the direction X and intersects both the elements A and B.

As shown in FIGS. 3A and 3C, each of the plurality of gate lines 160 may include a main gate portion 160M and a plurality of sub-gate portions 160S. The main gate portion 160M may extend longitudinally in the second horizontal direction (e.g., Y direction) to cover the upper surface of the nanosheet stack NSS. The plurality of sub-gate portions 160S may be integrally connected to the main gate portion 160M and/or may be respectively arranged one-by-one between the first nanosheet N1, the second nanosheet N2, and the third nanosheet N3 and between the first nanosheet N1 and the fin top surface FF of the fin-type active region F1.

As shown in FIGS. 3A and 3B, a plurality of recesses R1 may be formed in the fin-type active region F1. A vertical level of the lowermost surface of each of the plurality of recesses R1, for example, may be lower than a vertical level of the fin top surface FF of the fin-type active region F1. As used herein, the term "vertical level" refers to a distance in the vertical direction (Z direction or −Z direction) from the frontside surface 102F of the substrate 102.

A plurality of source/drain regions 130 may be respectively arranged in the plurality of recesses R1. Each of the plurality of source/drain regions 130 may be arranged on the fin-type active region F1 and may be spaced apart from the frontside surface 102F of the substrate 102 in the vertical direction (e.g., Z direction) with the fin-type active region F1 therebetween. Each of the plurality of source/drain regions 130 may be arranged adjacent to at least one gate line 160 selected from the plurality of gate lines 160. Each of the plurality of source/drain regions 130 may have surfaces facing the first nanosheet N1, the second nanosheet N2, and the third nanosheet N3, which are included in the nanosheet stack NSS adjacent thereto.

Each of the plurality of source/drain regions 130 may include an epitaxially grown semiconductor layer. In some embodiments, each of the plurality of source/drain regions 130 may include an epitaxially grown Si layer, an epitaxially grown SiC layer, an embedded SiGe structure including a plurality of SiGe layers that are epitaxially grown, or the like. When a source/drain region 130 constitutes an NMOS transistor, the source/drain region 130 may include an SiC layer doped with an n-type dopant. The n-type dopant may be selected from phosphorus (P), arsenic (As), and antimony (Sb). When the source/drain region 130 constitutes a PMOS transistor, the source/drain region 130 may include an SiGe layer doped with a p-type dopant. The p-type dopant may be selected from boron (B) and gallium (Ga).

Each of the plurality of gate lines 160 may include a metal, a metal nitride, a metal carbide, or a combination thereof. The metal may be selected from Ti, W, Ru, Nb, Mo, Hf, Ni, Co, Pt, Yb, Tb, Dy, Er, and Pd. The metal nitride may be selected from TiN and TaN. The metal carbide may include TiAlC. However, a material constituting each of the plurality of gate lines 160 is not limited to the examples set forth above.

A gate dielectric film 152 may be arranged between the nanosheet stack NSS and the gate line 160. The gate dielectric film 152 may include a stack structure of an interface dielectric film and a high-K film. The interface dielectric film may include a low-K material film having a dielectric constant of about 9 or less, for example, a silicon oxide film, a silicon oxynitride film, or a combination thereof. In some embodiments, the interface dielectric film may be omitted. The high-K film may include a material having a dielectric constant that is greater than that of a silicon oxide film. For example, the high-K film may have a dielectric constant of about 10 to about 25. The high-K film may include, but is not limited to, hafnium oxide.

Either sidewall of each of the plurality of sub-gate portions 160S, which are included in each of the plurality of gate lines 160, may be spaced apart from the source/drain region 130 with the gate dielectric film 152 therebetween. The gate dielectric film 152 may be arranged between a sub-gate portion 160S of the gate line 160 and each of the first nanosheet N1, the second nanosheet N2, and the third nanosheet N3 and between the sub-gate portion 160S of the gate line 160 and the source/drain region 130.

The plurality of nanosheet stacks NSS may be arranged over the fin top surface FF of each of the plurality of fin-type active regions F1 in the intersection areas between the plurality of fin-type active regions F1 and the plurality of gate lines 160 and may each be spaced apart from the fin-type active region F1 to face the fin top surface FF of the fin-type active region F1. A plurality of nanosheet transistors may be respectively formed in the intersection areas between the plurality of fin-type active regions F1 and the plurality of gate lines 160. Each of the plurality of nanosheet transistors may include an NMOS transistor, a PMOS transistor, or a combination thereof.

As shown in FIG. 3A, both sidewalls of the gate line 160 may be respectively covered by a plurality of insulating spacers 118. Each of the plurality of insulating spacers 118 may be arranged on the upper surface of the nanosheet stack NSS to cover a sidewall of the main gate portion 160M. Each of the plurality of insulating spacers 118 may be spaced apart from the gate line 160 with the gate dielectric film 152 therebetween. As shown in FIG. 3B, a plurality of recess-side insulating spacers 119 may be arranged on the device isolation film 112. At least a portion of each of the plurality of recess-side insulating spacers 119 may cover a sidewall of the source/drain region 130. In some embodiments, each of the plurality of recess-side insulating spacers 119 may be integrally connected with an insulating spacer 118 adjacent thereto. The plurality of insulating spacers 118 and the plurality of recess-side insulating spacers 119 may each include, for example, silicon nitride, silicon oxide, SiCN, SiBN, SiON, SiOCN, SiBCN, SiOC, or a combination thereof. As used herein, each of the terms “SiCN”, “SiBN”, “SiON”, “SiOCN”, “SiBCN”, and “SiOC” refers to a material comprising elements contained in each term and is not to be construed as a chemical formula representing a stoichiometric relationship.

The upper surface of each of the gate line 160, the gate dielectric film 152, and the insulating spacer 118 may be covered by a capping insulating pattern 168. Each capping insulating pattern 168 may include a silicon nitride film.

The plurality of source/drain regions 130, the device isolation film 112, the plurality of insulating spacers 118, and the plurality of recess-side insulating spacers 119 may be covered by an insulating liner 142. In some embodiments, an inter-gate dielectric 144 may be arranged on the insulating liner 142. The inter-gate dielectric 144 may be arranged between a pair of source/drain regions 130, which are adjacent to each other, in an area between a pair of gate lines 160 wherein the pair of gate lines are adjacent to each other in the first horizontal direction (e.g., X direction). In some embodiments, the insulating liner 142 may include, but is not limited to, silicon nitride, SiCN, SiBN, SiON, SiOCN, SiBCN, or a combination thereof. The inter-gate dielectric 144 may include, but is not limited to, a silicon oxide film. In some embodiments, the device isolation film 112, the insulating liner 142, and the inter-gate dielectric 144 may constitute an insulating structure.

As shown in FIGS. 3A and 3B, a plurality of source/drain contacts CA may be respectively arranged on the plurality of source/drain regions 130. In some embodiments, each of the plurality of source/drain contacts CA may be spaced apart from the frontside surface 102F of the substrate 102 in the vertical direction (e.g., Z direction) with the fin-type active region F1 and the source/drain region 130 therebetween.

Each of the plurality of source/drain contacts CA may be configured to be electrically connected to at least one source/drain region 130 selected from the plurality of source/drain regions 130. For example, as shown in FIG. 3B, one source/drain contact CA may be connected to two adjacent source/drain regions 130, but the inventive concept is not limited thereto. As shown in FIG. 2, the source/drain contact CA may extend longitudinally in the second horizontal direction (e.g., Y direction) between a pair of gate lines 160 that are adjacent to each other in the first horizontal direction (e.g., X direction). As shown in FIG. 3A, the source/drain contact CA may be spaced apart from the main gate portion 160M of the gate line 160, which is adjacent thereto, in the first horizontal direction (e.g., X direction) with the insulating spacer 118 therebetween.

In some embodiments, the source/drain region 130 and the source/drain contact CA, which are connected to each other, may be in contact with each other. In some embodiments, a metal silicide film may be arranged between the source/drain region 130 and the source/drain contact CA, which are connected to each other. The metal silicide film may include a metal including Ti, W, Ru, Nb, Mo, Hf, Ni, Co, Pt, Yb, Tb, Dy, Er, or Pd. For example, the metal silicide film may include, but is not limited to, titanium silicide.

In some embodiments, the source/drain contact CA may include only a metal plug including a single metal. In some embodiments, the source/drain contact CA may include a metal plug and a conductive barrier film surrounding the metal plug. The metal plug may include, but is not limited to, molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof. The conductive barrier film may include a metal or a conductive metal nitride. For example, the conductive barrier film may include, but is not limited to, Ti, Ta, W, TiN, TaN, WN, WCN, TiSiN, TaSiN, WSiN, or a combination thereof.

As shown in FIG. 3B, the integrated circuit device 100 may include a via power rail VPR extending longitudinally in the vertical direction (e.g., Z direction) between the power rail wiring line MPR and the source/drain contact CA. The via power rail VPR may include a portion extending through the insulating structure, which includes the device isolation film 112, the insulating liner 142, and the inter-gate dielectric 144, in the vertical direction (e.g., Z direction) and a portion extending through a portion of the substrate 102 on a frontside surface 102F side of the substrate 102 in the vertical direction (e.g., Z direction). The via power rail VPR may have a first end contacting the power rail wiring line MPR, a second end contacting the lower surface of the source/drain contact CA, and a sidewall facing the fin-type active region F1 and the source/drain region 130 in the second horizontal direction (e.g., Y direction).

The portion of the via power rail VPR, which extends through the insulating structure in the vertical direction (e.g., Z direction), may include a conductive barrier film BM and a metal plug MP surrounded by the conductive barrier film BM. The conductive barrier film BM may be in contact with the insulating structure and the metal plug MP may be spaced apart from the insulating structure in a horizontal direction (for example, the X direction and the Y direction) with the conductive barrier film BM therebetween. In some embodiments, the conductive barrier film BM may be omitted. In this case, the metal plug MP may be in direct contact with the insulating structure.

The metal plug MP may include, but is not limited to, molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof. The conductive barrier film BM may include, but is not limited to, Ti, Ta, W, TiN, TaN, WN, WCN, TiSiN, TaSiN, WSiN, or a combination thereof.

The power rail wiring line MPR and the via power rail VPR may constitute a contact structure. The contact structure, which includes the power rail wiring line MPR and the via power rail VPR, may include a first plug portion PG1, which extends through the substrate 102 in the vertical direction (e.g., Z direction), and a second plug portion PG2, which extends through the insulating structure in the vertical direction (e.g., Z direction).

The first plug portion PG1 may include a frontside plug PG1A and a backside plug PG1B, which are connected to each other. The frontside plug PG1A may include a portion of the via power rail VPR and the backside plug PG1B may include the power rail wiring line MPR. In the second horizontal direction (e.g., Y direction), the width of the backside plug PG1B may be greater than the width of the frontside plug PG1A.

The second plug portion PG2 may extend longitudinally in the vertical direction (e.g., Z direction) between a pair of fin-type active regions F1, which are selected from the plurality of fin-type active regions F1 and adjacent to each other, and between a pair of source/drain regions 130 respectively arranged on the pair of fin-type active regions F1 and may be in contact with the source/drain contact CA. The second plug portion PG2 may be in contact with the device isolation film 112, the insulating liner 142, and the inter-gate dielectric 144, which are included in the insulating structure. An insulating spacer including an inorganic material, such as a silicon oxide film or a silicon nitride film, may not be arranged between the second plug portion PG2 and the insulating structure.

As shown in FIG. 3B, a first self-assembled organic material insulating liner SLA and a second self-assembled organic material insulating liner SLB may be arranged between the first plug portion PG1 and the substrate 102. The first self-assembled organic material insulating liner SLA may be arranged between the frontside plug PG1A and the substrate 102 and the second self-assembled organic material insulating liner SLB may be arranged between the backside plug PG1B and the substrate 102. In some embodiments, the first self-assembled organic material insulating liner SLA and the second self-assembled organic material insulating liner SLB may include the same material. In some embodiments, the first self-assembled organic material insulating liner SLA and the second self-assembled organic material insulating liner SLB may include different materials from each other The first self-assembled organic material insulating liner SLA may be in contact with the frontside plug PG1A. For example, the first self-assembled organic material insulating liner SLA may be in contact with the metal plug MP of the via power rail VPR. The second self-assembled organic material insulating liner SLB may be in contact with the backside plug PG1B. For example, the second self-assembled organic material insulating liner SLB may be in contact with the power rail wiring line MPR.

In some embodiments, the first and second self-assembled organic material insulating liners SLA and SLB may include monolayers respectively comprising a plurality of organic carbon chains OCA and OCB, which each include a silicon atom and a C1 to C30 alkyl group, respectively. As used herein, a self-assembled organic material comprises a material formed by organization of one or more organic molecules into a structure, e.g., a liner. The formation of the self-assembled organic material may result from local interactions including, but not limited to chemical bonding or physical associations, between the one or more organic molecules, or between the one or more organic molecules and a material or other surface, e.g., active sites on a surface. An example self-assembled organic material may comprise one molecule thick layer of organic material (e.g., monolayer) comprising a plurality of organic carbon chains. In some embodiments, each of the plurality of organic carbon chains OCA and OCB, which are respectively included in the first and second self-assembled organic material insulating liners SLA and SLB, may include an unsubstituted C1 to C30 alkyl group, a substituted C1 to C30 alkyl group, an unsubstituted C1 to C30 aminoalkyl group, or a substituted C1 to C30 aminoalkyl group. A substituent, which may be included in the substituted C1 to C30 alkyl group and the substituted C1 to C30 aminoalkyl group, may include, but is not limited to, a C6 to C10 aryl group, a C6 to C10 aryloxy group, or a fluorine atom.

As used herein, the term "alkyl group" may refer to a linear alkyl group or a branched alkyl group. As used herein, the term "aryl group" refers to an aromatic group containing 6 to 10 ring atoms. For example, an aryl group may include, but is not limited to, a phenyl group, a tolyl group, or a xylyl group.

In some embodiments, an alkyl group constituting each of the plurality of organic carbon chains OCA and OCB may comprise at least one hetero-element. The at least one hetero-element may comprise a nitrogen atom, an oxygen atom, or a combination thereof.

Each of the first and second self-assembled organic material insulating liners SLA and SLB may have a thickness of about 1 Å to about 40 Å at the smallest dimension between the substrate 102 and the first plug portion PG1. For example, each of the first and second self-assembled organic material insulating liners SLA and SLB may comprise, but is not limited to, a thickness of about 2 Å to about 30 Å or about 5 Å to about 20 Å at the smallest dimension between the substrate 102 and the first plug portion PG1.

As shown in FIG. 3B, oxide films 105 and 106 may be respectively arranged between the substrate 102 and the first and second self-assembled organic material insulating liners SLA and SLB. The oxide films 105 and 106 may each include a silicon oxide film. The first self-assembled organic material insulating liner SLA may be bonded to a surface of the oxide film 105 and the second self-assembled organic material insulating liner SLB may be bonded to a surface of the oxide film 106. Each of the oxide films 105 and 106 may have a thickness of 10 Å or less. For example, each of the oxide films 105 and 106 may have, but is not limited to, a thickness of about 1 Å to about 8 Å. In some embodiments, at least one of the oxide films 105 and 106 may be omitted.

In some embodiments, the first and second self-assembled organic material insulating liners SLA and SLB may respectively comprise resultant products, in which an organosilane compound is chemisorbed on the oxide films 105 and 106. In some embodiments, the organosilane compound may comprise dimethylsilane dimethylamine (DMSDMA), trimethylsilane dimethylamine (TMSDMA), bis(dimethylamino)dimethylsilane (DMADMS), (dimethylamino)trimethylsilane (DMATMS), octyltrichlorosilane (OTS), hexamethyldisilazane (HMDS), octadecyltrichlorosilane (ODTS), (18-phenoxyoctadecyl)trichlorosilane (PhO-OTS), 22 docosyltrichlorosilane (DCTS), N-(6 aminohexyl)-aminopropyltrimethoxysilane (AHAPS), fluotoalkylsilane (FAS), (3-aminopropyl)trimethoxysilane (APS), perfluorodecyltrichlorosilane (PFS), mercaptopropyltrimethoxysilane (MPTMS), octadecyltrimethoxysilane (OTMS), (heptadecafluoro-1,1,2,2-tetrahydrodecyl)trichlorosilane (FDTS), dichlorodimethylsilane (DDMS), triethoxysilane, dodecyltriethoxysilane, (4-chlorophenyl)triethoxysilane, (3-glycidyloxypropyl)triethoxysilane, or a combination thereof. The FAS may be selected from, but is not limited to, $CF_3(CF_2)_n(CH_2)_2Si(OCH_3)_3$ (where n is 0, 5, or 7), fluorooctyl-trichloro-silane (FOTS), trichloro(3,3,3-trifluoropropyl)silane (FPTS), and perfluorodecyl-trichlorosilane (FDTS).

In some embodiments, the first and second self-assembled organic material insulating liners SLA and SLB may respectively include the plurality of organic carbon chains OCA and OCB, which each include a silicon atom and a C1 to C30 alkyl group, and here, the alkyl group may include a linear, branched, or cyclic alkyl group. For example, the alkyl group may include, but is not limited to, a C1 to C30 linear alkyl group, a C1 to C30 linear aminoalkyl group, a C6 to C30 aryloxyalkyl group, a C1 to C30 fluoroalkyl group, or a combination thereof.

Figure 4A:
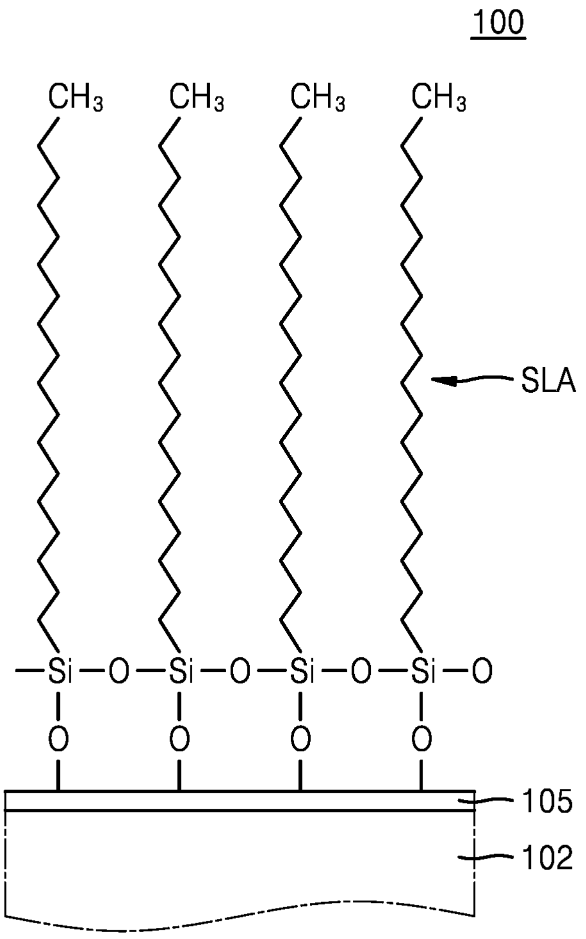
FIG. 4A is a diagram illustrating an example of a structure of a first self-assembled organic material insulating liner of the integrated circuit device shown in FIG. 2 according to some embodiments of the present inventive concept.
Figure 4B:
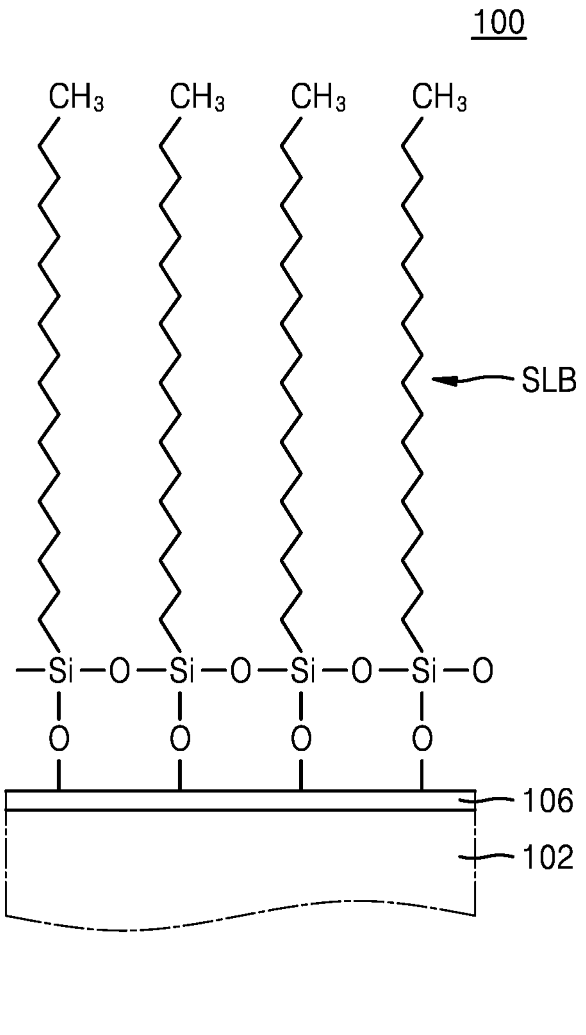
FIG. 4B is a diagram illustrating an example of a structure of a second self-assembled organic material insulating liner of the integrated circuit device shown in FIG. 2 according to some embodiments of the present inventive concept.

FIG. 4A is a diagram illustrating an example of a structure of the first self-assembled organic material insulating liner SLA, and FIG. 4B is a diagram illustrating an example of a structure of the second self-assembled organic material insulating liner SLB.

FIGS. 4A and 4B illustrate resultant products from an organosilane compound reacted on oxide films 105 and 106 on the substrate 102. FIGS. 4A and 4B provide example resultant products in which the first and second self-assembled organic material insulating liners SLA and SLB, respectively, comprising the plurality of organic carbon chains OCA and OCB are formed on the oxide films 105 and 106 by using octadecyltrichlorosilane (ODTS) as the organosilane compound, respectively. As shown in FIGS. 4A and 4B, each of the plurality of organic carbon chains OCA and OCB, which are respectively included in the first and second self-assembled organic material insulating liners SLA and SLB, comprises a silicon atom and an alkyl group bonded to the silicon atom. The first and second self-assembled organic material insulating liners SLA and SLB may comprise self-assembled monolayers obtained by the reaction of ODTS with –OH groups that are present at the surfaces of the oxide films 105 and 106, respectively.

Referring again to FIGS. 3A and 3C, respective upper surfaces of the source/drain contact CA, a plurality of capping insulating patterns 168, and the inter-gate dielectric 144 may be covered by an upper insulating structure 180. The upper insulating structure 180 may comprise an etch stop film 182 and an upper insulating film 184, which are stacked in the stated order on each of the source/drain contact CA, the plurality of capping insulating patterns 168, and the inter-gate dielectric 144. The etch stop film 182 may comprise silicon carbide (SiC), SiN, nitrogen-doped silicon carbide (SiC:N), SiOC, AlN, AlON, AlO, AlOC, or a combination thereof. The upper insulating film 184 may include an oxide film, a nitride film, an ultra-low-K (ULK) film having an ultra-low dielectric constant (that is, K) of about 2.2 to about 2.4, or a combination thereof. For example, the upper insulating film 184 may comprise, but is not limited to, a tetraethylorthosilicate (TEOS) film, a high density plasma (HDP) oxide film, a boro-phospho-silicate glass (BPSG) film, a flowable chemical vapor deposition (FCVD) oxide film, an SiON film, an SiN film, an SiOC film, an SiCOH film, or a combination thereof.

As shown in FIGS. 3A and 3B, a source/drain via contact VA may be arranged on the source/drain contact CA. The source/drain via contact VA may extend through the upper insulating structure 180 to contact the source/drain contact CA. Each of the plurality of source/drain regions 130 may be configured to be electrically connected to the source/drain via contact VA through the source/drain contact CA. The lower surface of each source/drain via contact VA may be in contact with the upper surface of the source/drain contact CA.

As shown in FIG. 3C, a gate contact CB may be arranged on the gate line 160. The gate contact CB may be configured to extend through the upper insulating structure 180 and the capping insulating pattern 168 in the vertical direction (e.g., Z direction) to be connected to the gate line 160. A lower surface of the gate contact CB may be in contact with an upper surface of the gate line 160.

Each of the source/drain via contact VA and the gate contact CB may include a contact plug including molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof, but a constituent material of the contact plug is not limited to the examples set forth above. In some embodiments, each of the source/drain via contact VA and the gate contact CB may further include a conductive barrier pattern surrounding a portion of the contact plug. The conductive barrier pattern, which is included in each of the source/drain via contact VA and the gate contact CB, may include a metal or a metal nitride. For example, the conductive barrier pattern may include, but is not limited to, Ti, Ta, W, TiN, TaN, WN, WCN, TiSiN, TaSiN, WSiN, or a combination thereof.

Respective upper surfaces of the upper insulating structure 180, the source/drain via contact VA, and the gate contact CB may be covered by an interlayer dielectric 186. A constituent material of the interlayer dielectric 186 is substantially the same as that of the upper insulating film 184 described above. A plurality of upper wiring layers M1 may extend through the interlayer dielectric 186. Each of the plurality of upper wiring layers M1 may be connected to the source/drain via contact VA or the gate contact CB, which is thereunder. Each of the plurality of upper wiring layers M1 may include, but is not limited to, molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof.

A frontside wiring structure may be arranged on the plurality of upper wiring layers M1 and the interlayer dielectric 186. The frontside wiring structure may include a plurality of wiring layers, a plurality of via contacts, and an interlayer dielectric covering the plurality of wiring layers and the plurality of via contacts. The power rail wiring line MPR may be covered by a backside wiring structure including a backside power rail. The backside wiring structure may have substantially the same configuration as the frontside wiring structure described above.

The integrated circuit device 100 described with reference to FIGS. 2 and 3A to 3C may include the first and second self-assembled organic material insulating liners SLA and SLB between the substrate 102 and the first plug portion PG1 of the contact plug including the power rail wiring line MPR and the via power rail VPR, the first plug portion PG1 extending through the substrate 102. According to the integrated circuit device 100, the first plug portion PG1 extending through the substrate 102 and corresponding to a portion of the contact structure, which is prone to generating leakage current, may be selectively surrounded by the first and second self-assembled organic material insulating liners SLA and SLB, thereby selectively cutting off leakage current flowing through the substrate 102. In addition, the second plug portion PG2 of the contact structure, which extends through the insulating structure including the device isolation film 112, the insulating liner 142, and the inter-gate dielectric 144, does not need to be surrounded by an inorganic material insulating spacer, such as silicon oxide or silicon nitride. Therefore, the second plug portion PG2 may occupy even a space that would otherwise be occupied by the inorganic material insulating spacer. Therefore, a limit in the size of the contact structure may be overcome, and because the volume of the contact structure may be increased, the resistance in the contact structure may be reduced. In addition, because the first and second self-assembled organic material insulating liners SLA and SLB having relatively excellent thermal conductivity are arranged between the substrate 102 and the first plug portion PG1 of the contact structure, which extends through the substrate 102, an effect of heat dissipation through the substrate 102 may improve, unlike in a general structure in which, instead of the first and second self-assembled organic material insulating liners SLA and SLB, an inorganic material insulating spacer is arranged between the substrate 102 and the first plug portion PG1. Therefore, even when the integrated circuit device 100 has a device region having a reduced area due to down-scaling, the reliability of the integrated circuit device 100 may improve.

Figure 5:
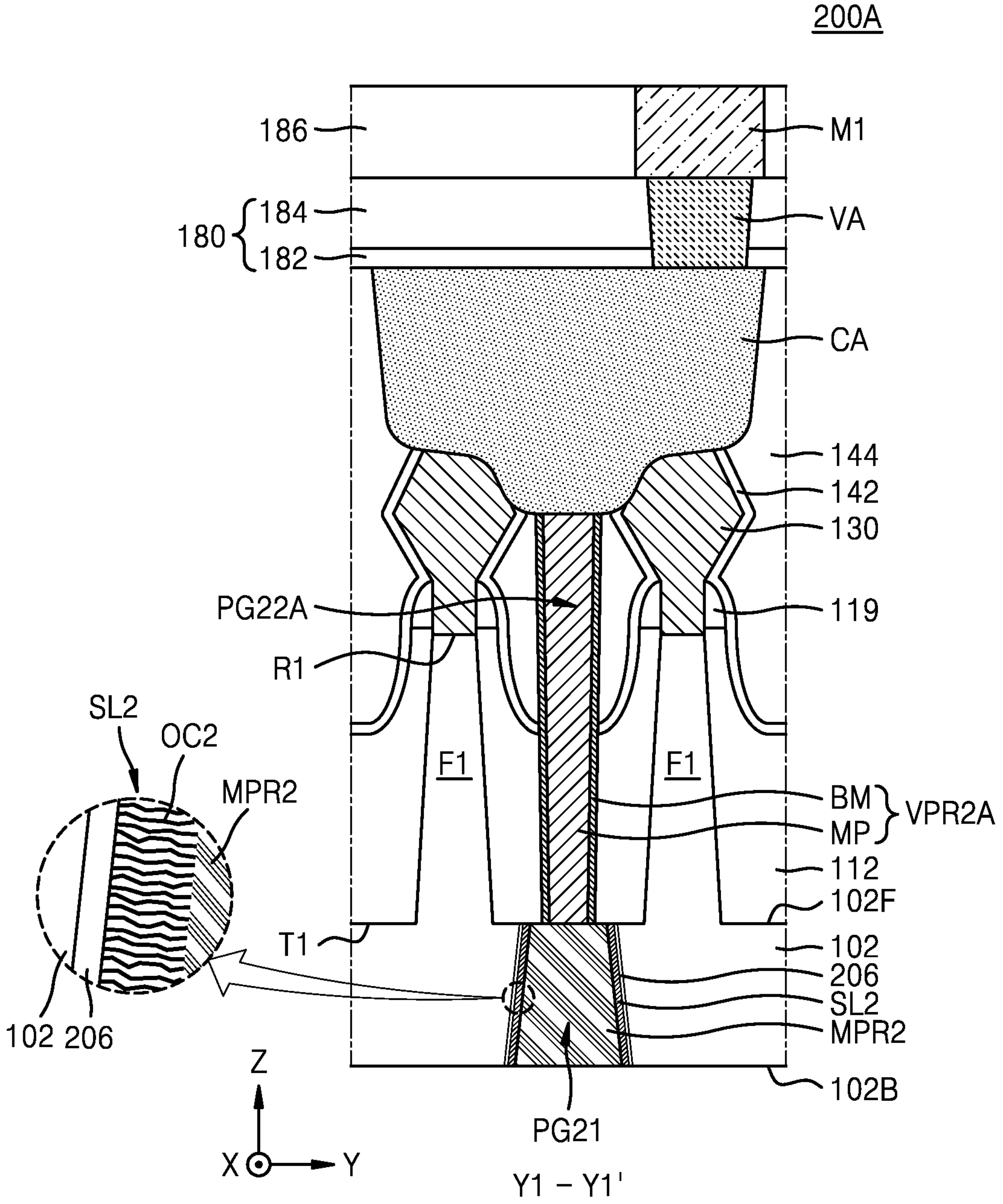
FIG. 5 is a cross-sectional view illustrating an integrated circuit device according to some embodiments of the present inventive concept.

FIG. 5 is a cross-sectional view illustrating an integrated circuit device 200A according to some embodiments. FIG. 5 illustrates an enlarged cross-sectional configuration of a portion of the integrated circuit device 200A, which corresponds to the cross-section taken along the line Y1-Y1' of FIG. 2. In FIG. 5, the same reference numerals as in FIGS. 2 and 3A to 3C respectively denote the same members, and here, repeated descriptions thereof are omitted.

Referring to FIG. 5, the integrated circuit device 200A may constitute a portion of the plurality of cells LC shown in FIG. 1. The integrated circuit device 200A has substantially the same configuration as the integrated circuit device 100 described with reference to FIGS. 2 and 3A to 3C. However, the integrated circuit device 200A includes a contact structure including a power rail wiring line MPR2 and a via power rail VPR2A.

The power rail wiring line MPR2 may have substantially the same configuration as the power rail wiring line MPR of the integrated circuit device 100, which is described with reference to FIGS. 2 and 3B. However, the power rail wiring line MPR2 of the integrated circuit device 200A may extend through the substrate 102 in the vertical direction (e.g., Z direction) from the backside surface 102B to the frontside surface 102F of the substrate 102.

The via power rail VPR2A may extend longitudinally in the vertical direction (e.g., Z direction) between the power rail wiring line MPR2 and the source/drain contact CA. The via power rail VPR2A may extend through the insulating structure, which includes the device isolation film 112, the insulating liner 142, and the inter-gate dielectric 144, in the vertical direction (e.g., Z direction). The via power rail VPR2A may have a first end contacting the power rail wiring line MPR2, a second end contacting the lower surface of the source/drain contact CA, and a sidewall facing the fin-type active region F1 and the source/drain region 130 in the second horizontal direction (e.g., Y direction).

The via power rail VPR2 may include a conductive barrier film BM and a metal plug MP surrounded by the conductive barrier film BM. The conductive barrier film BM may be in contact with the insulating structure, and the metal plug MP may be spaced apart from the insulating structure in the horizontal direction (for example, the X direction and the Y direction) with the conductive barrier film BM therebetween.

The power rail wiring line MPR2 and the via power rail VPR2A may constitute a contact structure. The contact structure, which includes the power rail wiring line MPR2 and the via power rail VPR2A, may include a first plug portion PG21, which extends through the substrate 102 in the vertical direction (e.g., Z direction), and a second plug portion PG22A, which extends through the insulating structure in the vertical direction (e.g., Z direction).

A self-assembled organic material insulating liner SL2 may be arranged between the first plug portion PG21 and the substrate 102. The self-assembled organic material insulating liner SL2 may be in contact with the power rail wiring line MPR2. The self-assembled organic material insulating liner SL2 may be spaced apart from the via power rail VPR2A constituting the second plug portion PG22A.

An oxide film 206 may be arranged between the substrate 102 and the self-assembled organic material insulating liner SL2. The oxide film 206 may include a silicon oxide film. The self-assembled organic material insulating liner SL2 may be bonded to a surface of the oxide film 206. The oxide film 206 may have a thickness of 10 Å or less. For example, the oxide film 206 may have, but is not limited to, a thickness of about 1 Å to about 8 Å. In some embodiments, the oxide film 206 may be omitted.

In some embodiments, the self-assembled organic material insulating liner SL2 may include a result product, in which an organosilane compound is chemisorbed on the oxide film 206. In some embodiments, the self-assembled organic material insulating liner SL2 may comprise a monolayer comprising a plurality of organic carbon chains OC2, which each include a silicon atom and a C1 to C30 alkyl group. A more detailed configuration of the self-assembled organic material insulating liner SL2 is substantially the same as those of the first and second self-assembled organic material insulating liners SLA and SLB described with reference to FIG. 3B.

Figure 6:
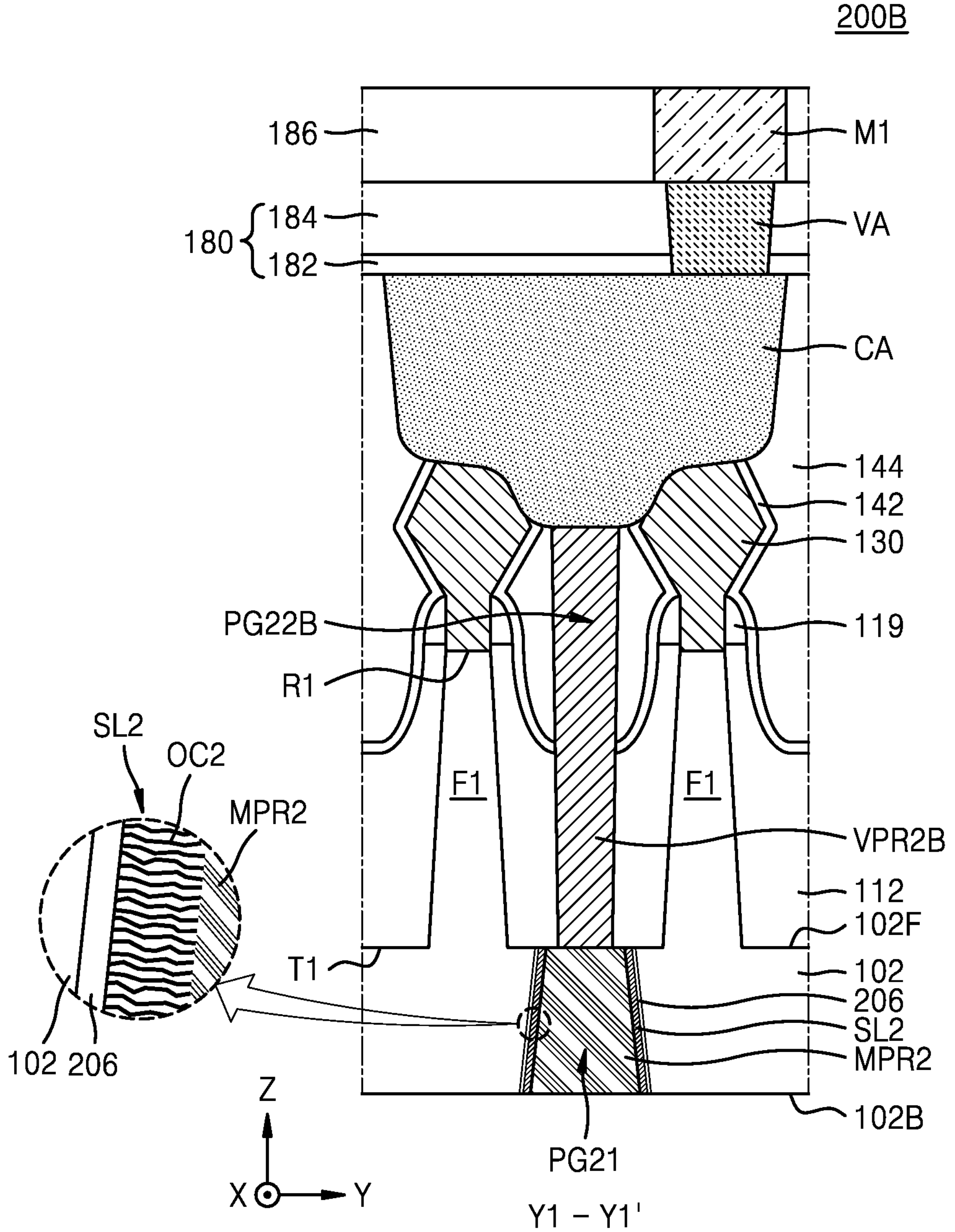
FIG. 6 is a cross-sectional view illustrating an integrated circuit device according to some embodiments of the present inventive concept.

FIG. 6 is a cross-sectional view illustrating an integrated circuit device 200B according to some embodiments. FIG. 6 illustrates an enlarged cross-sectional configuration of a portion of the integrated circuit device 200B, which corresponds to the cross-section taken along the line Y1-Y1' of FIG. 2. In FIG. 6, the same reference numerals as in FIGS. 2, 3A to 3C, and 5 respectively denote the same members, and here, repeated descriptions thereof are omitted.

Referring to FIG. 6, the integrated circuit device 200B may constitute a portion of the plurality of cells LC shown in FIG. 1. The integrated circuit device 200B has substantially the same configuration as the integrated circuit device 200A described with reference to FIG. 5. However, the integrated circuit device 200B includes a contact structure including the power rail wiring line MPR2 and a via power rail VPR2B. A detailed configuration of the power rail wiring line MPR2 is the same as described with reference to FIG. 5.

The via power rail VPR2B may extend longitudinally in the vertical direction (e.g., Z direction) between the power rail wiring line MPR2 and the source/drain contact CA. The via power rail VPR2B may extend through the insulating structure, which includes the device isolation film 112, the insulating liner 142, and the inter-gate dielectric 144, in the vertical direction (e.g., Z direction). The via power rail VPR2B may have a first end contacting the power rail wiring line MPR2, a second end contacting the lower surface of the source/drain contact CA, and a sidewall facing the fin-type active region F1 and the source/drain region 130 in the second horizontal direction (e.g., Y direction).

The via power rail VPR2B may include a metal plug including only a metal and may not include a conductive barrier film surrounding the metal plug. In some embodiments, the via power rail VPR2B may include a metal plug, which includes molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof. The metal plug constituting the via power rail VPR2B may be in contact with each of the device isolation film 112, the insulating liner 142, and the inter-gate dielectric 144, which are included in the insulating structure.

The power rail wiring line MPR2 and the via power rail VPR2B may constitute a contact structure. The contact structure, which includes the power rail wiring line MPR2 and the via power rail VPR2B, may include the first plug portion PG21, which extends through the substrate 102 in the vertical direction (e.g., Z direction), and a second plug portion PG22B, which extends through the insulating structure in the vertical direction (e.g., Z direction). The self-assembled organic material insulating liner SL2, which is arranged between the first plug portion PG21 and the substrate 102, may be spaced apart from the via power rail VPR2B constituting the second plug portion PG22B.

Similar to the integrated circuit device 100 described with reference to FIGS. 2 and 3A to 3C, each of the integrated circuit devices 200A and 200B described with reference to FIGS. 5 and 6 includes the self-assembled organic material insulating liner SL2 between the substrate 102 and the first plug portion PG21 of the contact structure that includes the power rail wiring line MPR2 and the via power rail VPR2A or VPR2B, the first plug portion PG21 extending through the substrate 102. According to each of the integrated circuit devices 200A and 200B, the first plug portion PG21 extending through the substrate 102 and corresponding to a portion of the contact structure, which is prone to generating leakage current, may be selectively surrounded by the self-assembled organic material insulating liner SL2, thereby selectively cutting off leakage current flowing through the substrate 102. In addition, because the second plug portion PG22A or PG22B of the contact structure, which extends through the insulating structure including the device isolation film 112, the insulating liner 142, and the inter-gate dielectric 144, does not need to be surrounded by an inorganic material insulating spacer, a space occupied by the second plug portion PG22A or PG22B may be increased, and thus, the resistance in the contact structure may be reduced. In particular, because the second plug portion PG22B of the contact structure shown in FIG. 6 may include a metal plug, which includes only a metal without including a conductive barrier film as well as an inorganic material insulating spacer, the resistance in the second plug portion PG22B may be further reduced. Therefore, even when each of the integrated circuit devices 200A and 200B has a device region having a reduced area due to down-scaling, the reliability of each of the integrated circuit devices 200A and 200B may improve.

Figure 7:
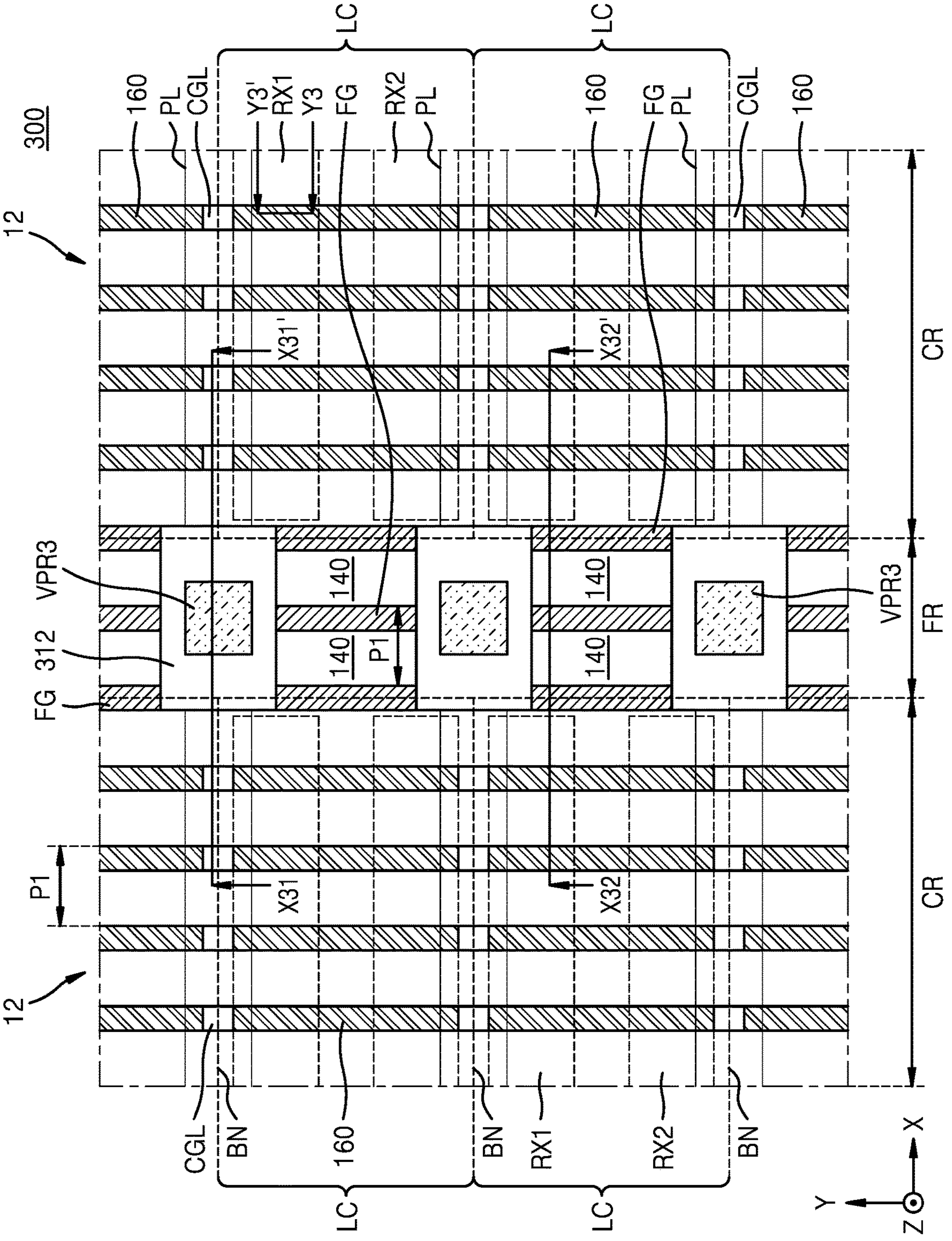
FIG. 7 is a planar layout diagram of a portion of an integrated circuit device according to some embodiments of the present inventive concept.

FIG. 7 is a planar layout diagram of a portion of an integrated circuit device 300 according to some embodiments.

Referring to FIG. 7, the integrated circuit device 300 may include a plurality of cell regions CR, which are spaced apart from each other in the first horizontal direction (e.g., X direction). Each of the plurality of cell regions CR may include a plurality of cells LC arranged in a line in the second horizontal direction (e.g., Y direction) that intersects with the first horizontal direction (e.g., X direction). The plurality of cells LC shown in FIG. 7 may correspond to a portion of the plurality of cells LC shown in FIG. 1. An inter-cell isolation region FR may be arranged between two cell regions CR, which are adjacent to each other in the first horizontal direction (e.g., X direction), from among the plurality of cell regions CR to extend longitudinally in the second horizontal direction (e.g., Y direction).

In each of the plurality of cells LC in the plurality of cell regions CR, the plurality of gate lines 160 may extend longitudinally in the second horizontal direction (e.g., Y direction). In the inter-cell isolation region FR, a plurality of dummy gate insulating lines FG may extend longitudinally in the second horizontal direction (e.g., Y direction). The plurality of dummy gate insulating lines FG, together with the plurality of gate lines 160 in each of the plurality of cells LC, may be arranged with a regular pitch P1 in the first horizontal direction (e.g., X direction).

A cell region CR may include the cell block 12 including the plurality of cells LC. The cell block 12 may include the plurality of cells LC including circuit patterns for constituting various circuits. The plurality of cells LC may be arranged in a matrix form in the first horizontal direction (e.g., X direction) and the second horizontal direction (e.g., Y direction) in the cell block 12.

The integrated circuit device 300 may include a plurality of power lines PL. Each of the plurality of power lines PL may cross the plurality of cell regions CR and the inter-cell isolation region FR in the first horizontal direction (e.g., X direction) and extend longitudinally in the first horizontal direction (e.g., X direction). Each of the plurality of power lines PL may be configured to supply power to the plurality of cells LC arranged in one row extending in the first horizontal direction (e.g., X direction) in the plurality of cell regions CR.

Figure 8A:
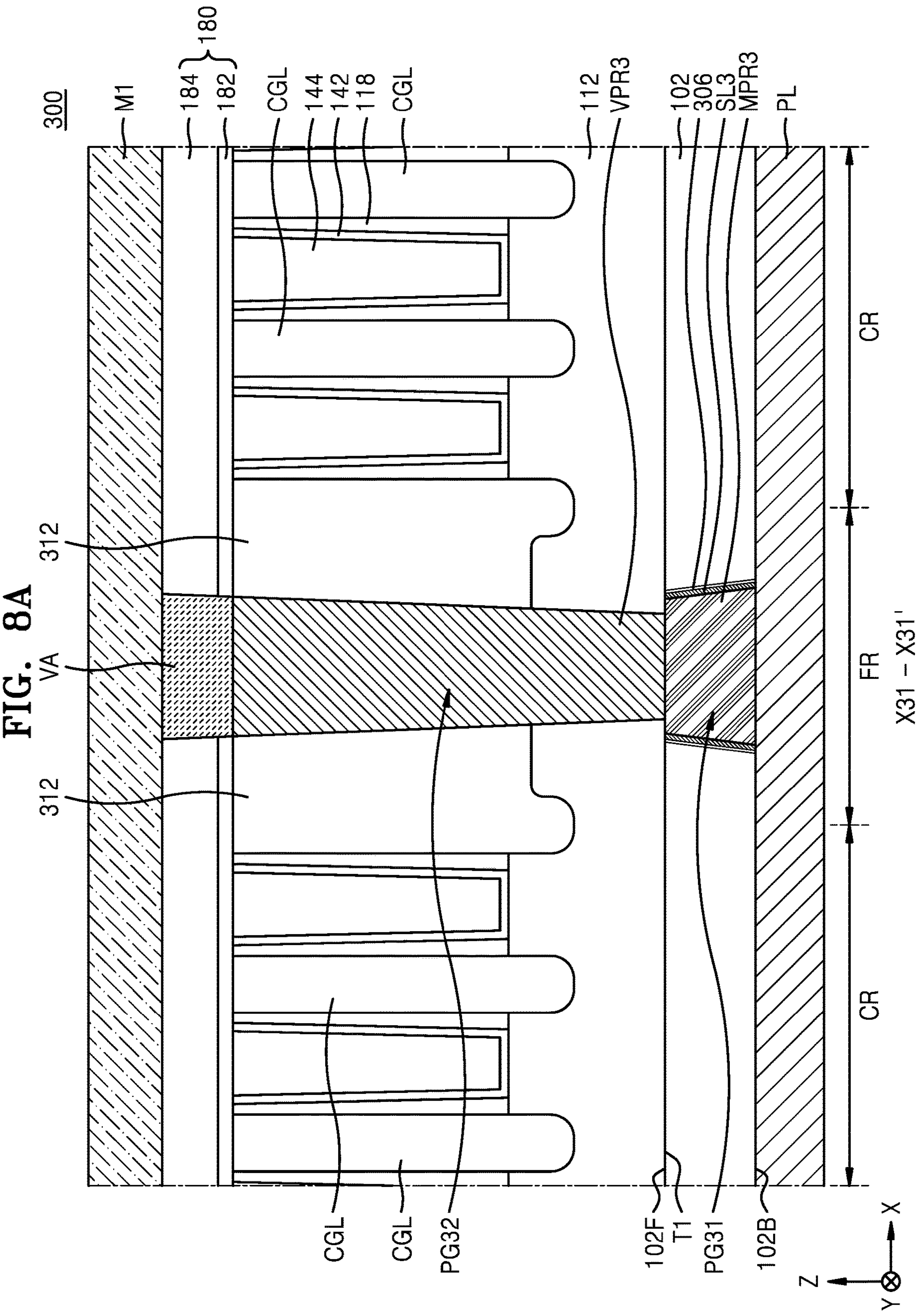
FIG. 8A is an enlarged cross-sectional view of some components, taken along the line X31-X31' of FIG. 7 according to some embodiments of the present inventive concept.
Figure 8B:
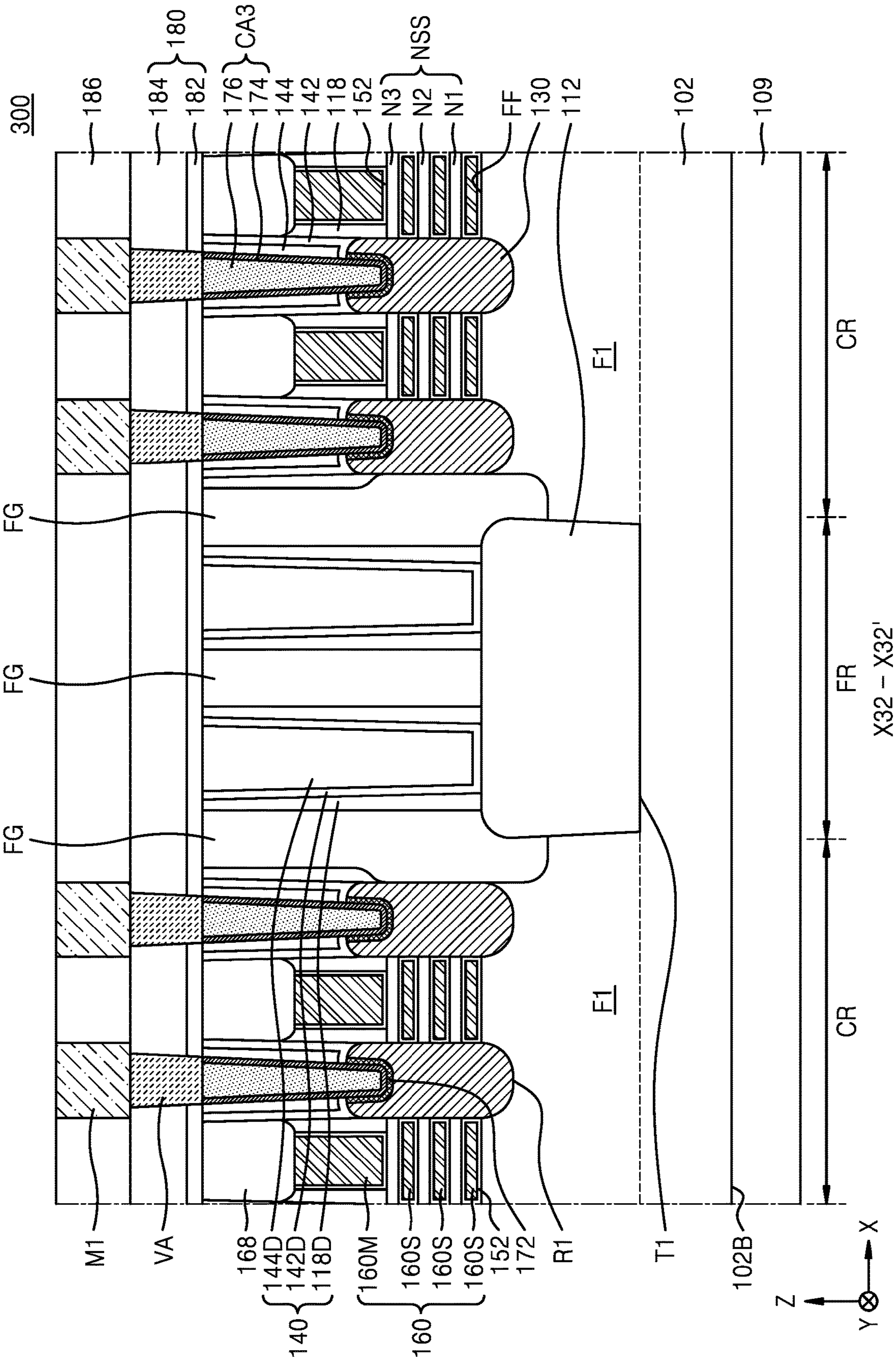
FIG. 8B is an enlarged cross-sectional view of some components, taken along the line X32-X32' of FIG. 7 according to some embodiments of the present inventive concept.
Figure 8C:
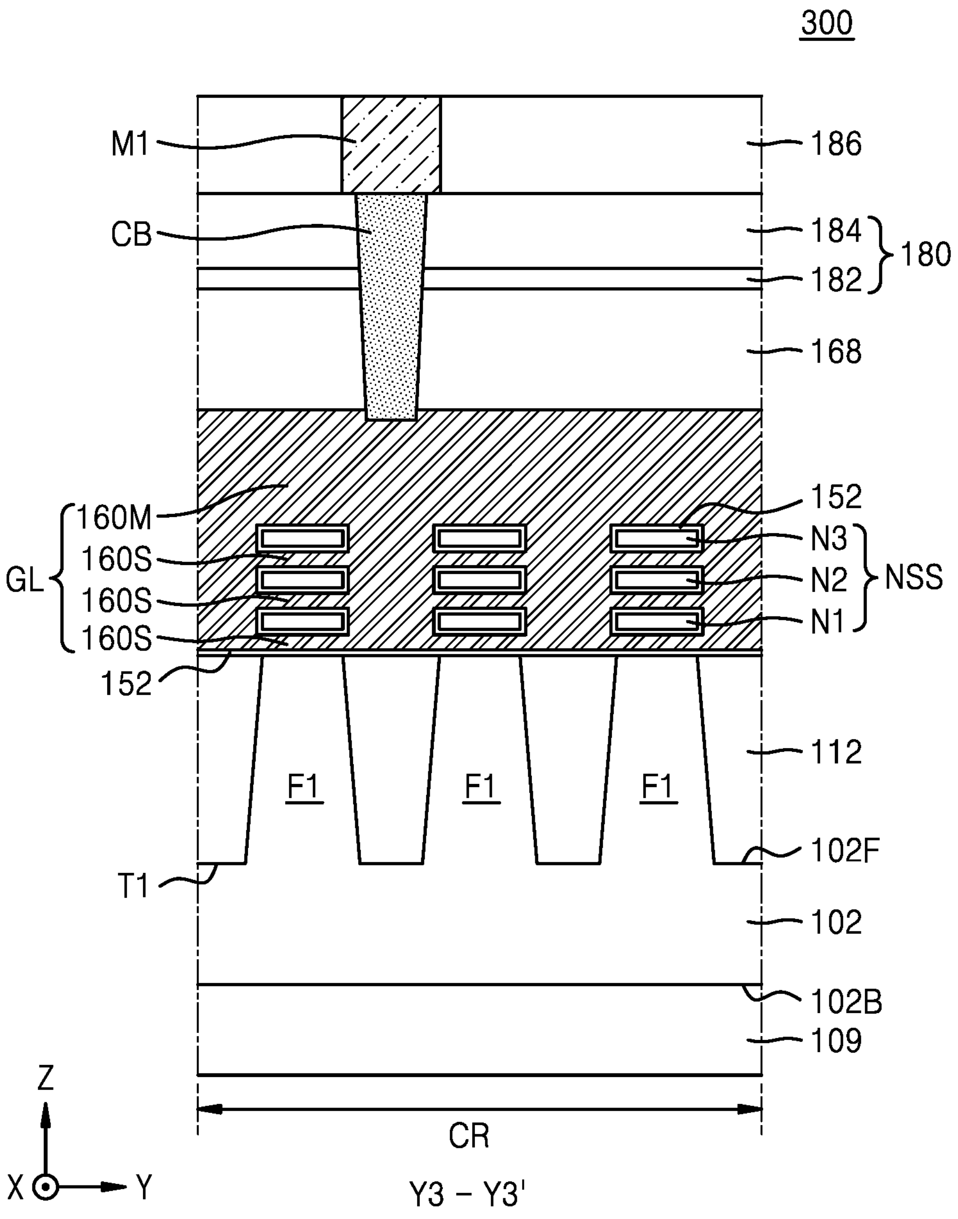
FIG. 8C is an enlarged cross-sectional view of some components, taken along the line Y3-Y3' of FIG. 7 according to some embodiments of the present inventive concept.

FIGS. 8A to 8C are diagrams illustrating an example of a configuration of the inter-cell isolation region FR and a portion of the plurality of cells LC, which are shown in FIG. 7, and in particular, FIG. 8A is an enlarged cross-sectional view of some components, taken along the line X31-X31' of FIG. 7, FIG. 8B is an enlarged cross-sectional view of some components, taken along the line X32-X32' of FIG. 7, and FIG. 8C is an enlarged cross-sectional view of some components, taken along the line Y3-Y3' of FIG. 7. In FIGS. 7 and 8A to 8C, the same reference numerals as in FIGS. 2 and 3A to 3C respectively denote the same members, and here, repeated descriptions thereof are omitted.

Referring to FIGS. 7 and 8A to 8C, the integrated circuit device 300 may include the plurality of cells LC each having a planar area defined by a cell boundary BN in the substrate 102. In the integrated circuit device 300, the plurality of power lines PL may be arranged on the backside surface 102B of the substrate 102. The plurality of power lines PL may each include a portion overlapping the cell boundary BN of each of the plurality of cells LC in the vertical direction (e.g., Z direction), but the inventive concept is not limited thereto.

Each of the plurality of cells LC may include a first device region RX1 and a second device region RX2. In each of the first device region RX1 and the second device region RX2, the plurality of fin-type active regions F1 may be arranged to protrude in the vertical direction (e.g., Z direction) from the frontside surface 102F of the substrate 102.

In the first device region RX1 and the second device region RX2, a trench region T1 may be defined between the plurality of fin-type active regions F1 and may be filled with the device isolation film 112. In some embodiments, one of the first device region RX1 and the second device region RX2 may include an NMOS transistor region and the other may include a PMOS transistor region.

As shown in FIGS. 8A and 8B, the device isolation film 112 may cover the frontside surface 102F of the substrate 102 in the cell region CR and the inter-cell isolation region FR. As shown in FIG. 8B, a portion of the device isolation film 112, which is located in the inter-cell isolation region FR, may cover both sidewalls of each of the plurality of fin-type active regions F1 in the first horizontal direction (e.g., X direction). In the first device region RX1 and the second device region RX2, the plurality of gate lines 160 may extend longitudinally in the second horizontal direction (e.g., Y direction) over the plurality of fin-type active regions F1 and the device isolation film 112.

As shown in FIGS. 8B and 8C, in the intersection areas between the plurality of fin-type active regions F1 and the plurality of gate lines 160, the plurality of nanosheet stacks NSS may be arranged over the fin top surface FF of each of the plurality of fin-type active regions F1. Each of the plurality of nanosheet stacks NSS may include a first nanosheet N1, a second nanosheet N2, and a third nanosheet N3, which overlap each other in the vertical direction (e.g., Z direction), over the fin-type active region F1. More detailed configurations of the plurality of fin-type active regions F1, the plurality of gate lines 160, and the plurality of nanosheet stacks NSS are substantially the same as described with reference to FIGS. 3A and 3C.

In some embodiments, the plurality of source/drain regions 130 in the first device region RX1 and the plurality of source/drain regions 130 in the second device region RX2 may have different shapes and sizes from each other. The shape of each of the plurality of source/drain regions 130 is not limited to the example shown in FIG. 8B, and the plurality of source/drain regions 130 having various shapes and sizes may be formed in the first device region RX1 and the second device region RX2.

A metal silicide film 172 may be formed on an upper surface of each of the plurality of source/drain regions 130. The metal silicide film 172 may include a metal including Ti, W, Ru, Nb, Mo, Hf, Ni, Co, Pt, Yb, Tb, Dy, Er, or Pd. For example, the metal silicide film 172 may include, but is not limited to, titanium silicide.

The plurality of source/drain regions 130, a plurality of metal silicide films 172, and the plurality of insulating spacers 118, on or over the substrate 102, may be covered by the insulating liner 142. The inter-gate dielectric 144 may be arranged on the insulating liner 142. In the plurality of cells LC, the device isolation film 112, the insulating liner 142, and the inter-gate dielectric 144 may constitute a portion of an insulating structure.

In some embodiments, as shown in FIGS. 7 and 8A, a plurality of gate cut insulating patterns CGL may be arranged in the cell boundary BN of each of the plurality of cells LC, the cell boundary BN extending in the first horizontal direction (e.g., X direction). The plurality of gate cut insulating patterns CGL may be arranged on extension lines of the plurality of gate lines 160, respectively. In some embodiments, each of the plurality of gate cut insulating patterns CGL may include, but is not limited to, a silicon nitride film. Although FIGS. 7 and 8A illustrate a configuration in which the plurality of gate cut insulating patterns CGL extend in the second horizontal direction (e.g., Y direction) throughout the respective cell boundaries BN of a pair of cells LC, which are adjacent to each other in the second horizontal direction (e.g., Y direction) in the cell block 12, the position and planar shape of each of the plurality of gate cut insulating patterns CGL are not limited to the example shown in FIGS. 7 and 8A.

In the inter-cell isolation region FR, the plurality of dummy gate insulating lines FG may extend longitudinally in the second horizontal direction (e.g., Y direction) over the frontside surface 102F of the substrate 102. The plurality of dummy gate insulating lines FG, together with the plurality of gate lines 160 in each of the plurality of cells LC, may be arranged with a regular pitch P1 in the first horizontal direction (e.g., X direction). A plurality of dummy gate insulating lines FG arranged along a straight line extending in the second horizontal direction (e.g., Y direction), from among the plurality of dummy gate insulating lines FG, may intermittently extend in the second horizontal direction (e.g., Y direction). FIGS. 7 and 8B illustrate a configuration in which three dummy gate insulating lines FG are arranged parallel to each other in the inter-cell isolation region FR between a pair of cells LC that are spaced apart from each other in the first horizontal direction (e.g., X direction). However, the number and shapes of dummy gate insulating lines FG arranged in the inter-cell isolation region FR may be variously selected as needed.

As shown in FIG. 8B, in the inter-cell isolation region FR, each dummy insulating structure 140 may be arranged between the plurality of dummy gate insulating lines FG. The dummy insulating structure 140 may include a dummy insulating spacer 118D, a dummy insulating liner 142D, and an inter-dummy-gate dielectric 144D. Constituent materials of the dummy insulating spacer 118D, the dummy insulating liner 142D, and the inter-dummy-gate dielectric 144D, which are arranged in the inter-cell isolation region FR, are respectively the same as described regarding those of the insulating spacer 118, the insulating liner 142, and the inter-gate dielectric 144, which are arranged in the cell region CR.

As shown in FIG. 8B, in the inter-cell isolation region FR, the device isolation film 112 may include a portion arranged between a plurality of dummy insulating structures 140 and the substrate 102 and between the plurality of dummy gate insulating lines FG and the substrate 102.

As shown in FIGS. 7 and 8A, a plurality of through-insulating patterns 312 may be arranged in the inter-cell isolation region FR. The plurality of through-insulating patterns 312 may be spaced apart from each other in the second horizontal direction (e.g., Y direction) and may be arranged in a line along a straight line extending in the second horizontal direction (e.g., Y direction). In the first horizontal direction (e.g., X direction), the width of a through-insulating pattern 312 may be greater than the width of each of the plurality of dummy gate insulating lines FG.

As shown in FIGS. 7 and 8A, each of the plurality of through-insulating patterns 312 may be arranged to vertically overlap one power line PL. As shown in FIG. 7, each of the power line PL and the plurality of through-insulating patterns 312 may be arranged on an extension line of the cell boundary BN of each of the plurality of cells LC, the cell boundary BN extending in the first horizontal direction (e.g., X direction). However, the positions, at which the power line PL and the plurality of through-insulating patterns 312 are arranged, may be variously changed as needed.

As shown in FIG. 8A, a lower surface of the through-insulating pattern 312, which faces the substrate 102, may be in contact with the device isolation film 112. In the inter-cell isolation region FR, the device isolation film 112 may include a portion arranged between the substrate 102 and the plurality of through-insulating patterns 312. In some embodiments, each of the plurality of dummy gate insulating lines FG and the plurality of through-insulating patterns 312 may include, but is not limited to, a silicon nitride film. FIG. 7 illustrates an example in which the planar shape of the through-insulating pattern 312 is approximately quadrangular, but the inventive concept is not limited thereto. For example, the planar shape of the through-insulating pattern 312 may have various shapes, such as an ellipse, a rhombus, and an irregular polygon. The device isolation film 112, the dummy insulating structure 140, the plurality of dummy gate insulating lines FG, and the through-insulating pattern 312, which are arranged in the inter-cell isolation region FR, may constitute another portion of the insulating structure.

As shown in FIGS. 7 and 8A, a plurality of via power rails VPR3 may be arranged in the inter-cell isolation region FR. As shown in FIG. 7, the plurality of via power rails VPR3 may be spaced apart from each other in the second horizontal direction (e.g., Y direction) and may be arranged in a line along a straight line extending in the second horizontal direction (e.g., Y direction). However, the inventive concept is not limited thereto. For example, the plurality of via power rails VPR3 may be arranged in a zigzag manner such that some of the plurality of via power rails VPR3 are arranged along a first straight line extending in the second horizontal direction (e.g., Y direction) and some other via power rails VPR3 are arranged along a second straight line which extends in the second horizontal direction (e.g., Y direction) to be spaced apart from the first straight line in the first horizontal direction (e.g., X direction).

As shown in FIG. 8A, each of the plurality of via power rails VPR3 may be configured in the inter-cell isolation region FR to extend through both one through-insulating pattern 312, which is selected from the plurality of through-insulating patterns 312, and the device isolation film 112 in the vertical direction (e.g., Z direction) and to be connected to one power line PL selected from the plurality of power lines PL. Each of the plurality of via power rails VPR3 may include a metal plug. The metal plug may include, but is not limited to, molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof. Each of the plurality of via power rails VPR3 may further include a conductive barrier film surrounding the metal plug. The conductive barrier film may include, but is not limited to, Ti, Ta, W, TiN, TaN, WN, WCN, TiSiN, TaSiN, WSiN, or a combination thereof.

A sidewall of each of the plurality of via power rails VPR3 may be in contact with the device isolation film 112 and the through-insulating pattern 312, which are included in the insulating structure. In some embodiment, an inorganic material insulating spacer is not arranged or disposed between the plurality of via power rails VPR3 and the insulating structure. Therefore, the via power rail VPR3 may completely occupy a space, or substantially occupy a space, which otherwise would be occupied by the inorganic material insulating spacer. Therefore, a limit in the size of the via power rail VPR3 may be overcome, and because the volume of the via power rail VPR3 may be increased, the resistance in a contact structure including the via power rail VPR3 may be reduced.

As shown in FIG. 8B, a plurality of source/drain contacts CA3 may be respectively arranged on the plurality of source/drain regions 130. Each of the plurality of source/drain contacts CA3 may extend through the inter-gate dielectric 144 and the insulating liner 142 in the vertical direction (e.g., Z direction) to contact the metal silicide film 172. Each of the plurality of source/drain contacts CA3 may be configured to be electrically connectable to the source/drain region 130 through the metal silicide film 172.

Each of the plurality of source/drain contacts CA3 may include a conductive barrier film 174 and a contact plug 176, which are stacked in the stated order on the source/drain region 130. The conductive barrier film 174 may surround and contact a lower surface and a sidewall of the contact plug 176. Each of the plurality of source/drain contacts CA3 may include a portion surrounded by the inter-gate dielectric 144 and extending longitudinally in the vertical direction (e.g., Z direction). The conductive barrier film 174 may be arranged between the metal silicide film 172 and the contact plug 176. The conductive barrier film 174 may have a surface contacting the metal silicide film 172 and a surface contacting the contact plug 176. In some embodiments, the conductive barrier film 174 may include a metal or a metal nitride. For example, the conductive barrier film 174 may include, but is not limited to, Ti, Ta, W, TiN, TaN, WN, WCN, TiSiN, TaSiN, WSiN, or a combination thereof. The contact plug 176 may include, but is not limited to, molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof.

The upper insulating structure 180 may be arranged in the cell region CR and the inter-cell isolation region FR. As shown in FIGS. 8B and 8C, respective upper surfaces of the plurality of source/drain contact CA3, a plurality of capping insulating patterns 168, and the inter-gate dielectric 144 may be covered by the upper insulating structure 180. The upper insulating structure 180 may include the etch stop film 182 and the upper insulating film 184. A plurality of source/drain via contacts VA may be respectively arranged on the plurality of source/drain contacts CA3. Some of the plurality of source/drain via contacts VA may extend through the upper insulating structure 180 to be respectively in contact with source/drain contacts CA3. Some other source/drain via contacts VA may extend through the upper insulating structure 180 to be respectively in contact with via power rails VPR3. As shown in FIG. 8C, the gate contact CB may be arranged on the gate line 160.

As shown in FIGS. 8A, 8B, and 8C, the interlayer dielectric 186 may be arranged on each of the upper insulating structure 180, the plurality of source/drain via contacts VA, and the gate contact CB. The plurality of upper wiring layers M1 may be arranged through the interlayer dielectric 186. Each of the plurality of upper wiring layers M1 may be configured to be connected to one selected from the plurality of source/drain via contacts VA, a plurality of gate contacts CB, and the plurality of via power rails VPR3, which are thereunder.

As shown in FIG. 8A, a power rail wiring line MPR3 may be arranged to extend through the substrate 102 in the vertical direction (e.g., Z direction) from the backside surface 102B of the substrate 102. The power rail wiring line MPR3 may be arranged between the via power rail VPR3 and the power line PL. The power rail wiring line MPR3 may include a portion contacting the via power rail VPR3 and a portion contacting the power line PL. The power rail wiring line MPR3 may have substantially the same configuration as the power rail wiring line MPR2 of the integrated circuit device 200A described with reference to FIG. 5.

The power rail wiring line MPR3 and the via power rail VPR3 may constitute a contact structure. The contact structure, which includes the power rail wiring line MPR3 and the via power rail VPR3, may include a first plug portion PG31, which extends through the substrate 102 in the vertical direction (e.g., Z direction), and a second plug portion PG32, which extends through the insulating structure in the vertical direction (e.g., Z direction).

A self-assembled organic material insulating liner SL3 may be arranged between the first plug portion PG31 and the substrate 102. The self-assembled organic material insulating liner SL3 may be in contact with the power rail wiring line MPR3. The self-assembled organic material insulating liner SL3 may be spaced apart from the via power rail VPR3 constituting the second plug portion PG32.

An oxide film 306 may be arranged between the substrate 102 and the self-assembled organic material insulating liner SL3. The oxide film 306 may include a silicon oxide film. The self-assembled organic material insulating liner SL3 may be bonded to a surface of the oxide film 306. The oxide film 306 may have a thickness of 10 Å or less. For example, the oxide film 306 may have, but is not limited to, a thickness of about 1 Å about 8 Å.

In some embodiments, the self-assembled organic material insulating liner SL3 may include a result product, in which an organosilane compound is chemisorbed on the oxide film 306. A more detailed configuration of the self-assembled organic material insulating liner SL3 is substantially the same as those of the first and second self-assembled organic material insulating liners SLA and SLB described with reference to FIG. 3B.

As shown in FIGS. 8B and 8C, the backside surface 102B of the substrate 102 may be covered by a backside insulating film 109. The backside insulating film 109 may include a silicon oxide film, a silicon nitride film, a silicon carbide film, a low-K film, or a combination thereof. The low-K film may include, but is not limited to, fluorine-doped silicon oxide, organosilicate glass, carbon-doped oxide, porous silicon oxide, porous organosilicate glass, a spin-on organic polymeric dielectric, a spin-on silicon-based polymeric dielectric, or a combination thereof.

Each of the plurality of power lines PL may extend through the backside insulating film 109 in the vertical direction (e.g., Z direction) and be in contact with an end of the power rail wiring line MPR3. Each of the plurality of via power rails VPR3 may be connected to the power line PL through the power rail wiring line MPR3.

Similar to the integrated circuit device 100 described with reference to FIGS. 2 and 3A to 3C, the integrated circuit device 300 described with reference to FIGS. 7 and 8A to 8C may include the self-assembled organic material insulating liner SL3 arranged between the substrate 102 and the first plug portion PG31 of the contact structure including the power rail wiring line MPR3 and the via power rail VPR3, the first plug portion PG31 extending through the substrate 102. According to the integrated circuit device 300, the first plug portion PG31 extending through the substrate 102 and corresponding to a portion of the contact structure, which is prone to generating leakage current, may be selectively surrounded by the self-assembled organic material insulating liner SL3, thereby selectively cutting off leakage current flowing through the substrate 102. In addition, because the second plug portion PG32 of the contact structure, which extends through the insulating structure including the device isolation film 112 and the through-insulating pattern 312, does not need to be surrounded by an inorganic material insulating spacer, a space occupied by the second plug portion PG32 may be increased, and thus, the resistance in the contact structure may be reduced. Therefore, even when the integrated circuit device 300 has a device region having a reduced area due to down-scaling, the reliability of the integrated circuit device 300 may improve.

Figure 9:
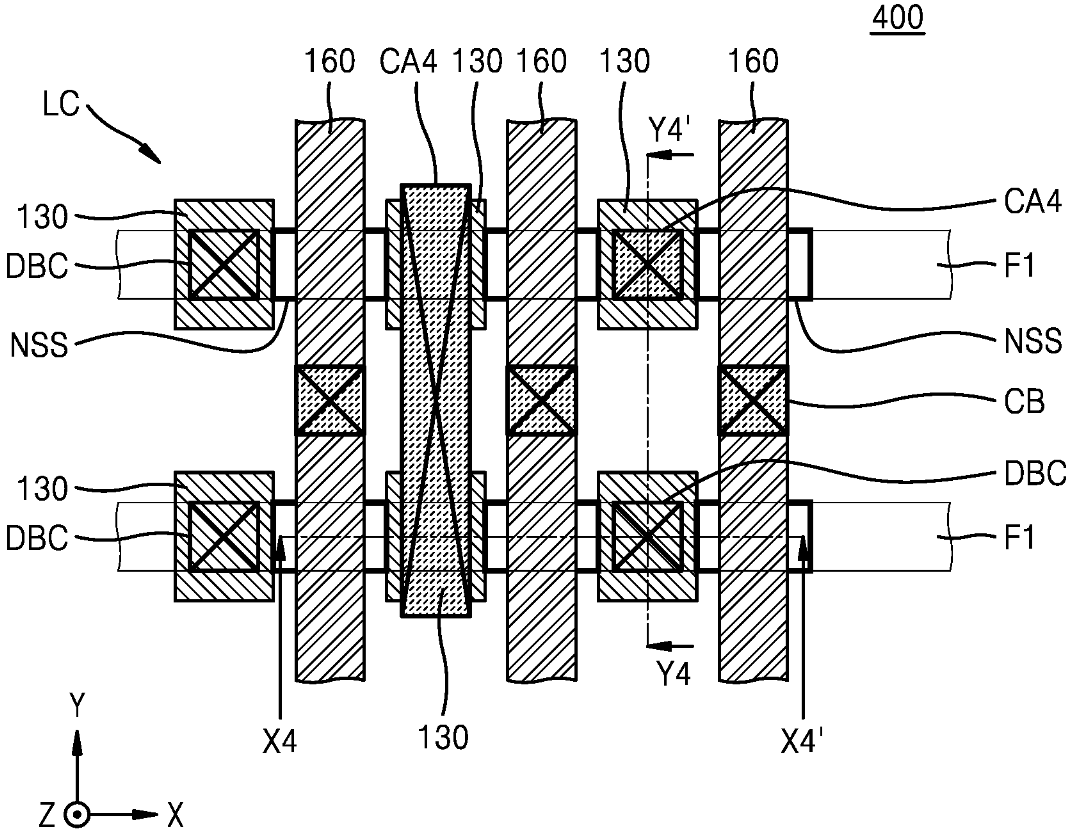
FIG. 9 is a planar layout diagram illustrating an integrated circuit device according to some embodiments of the present inventive concept.
Figure 10A:
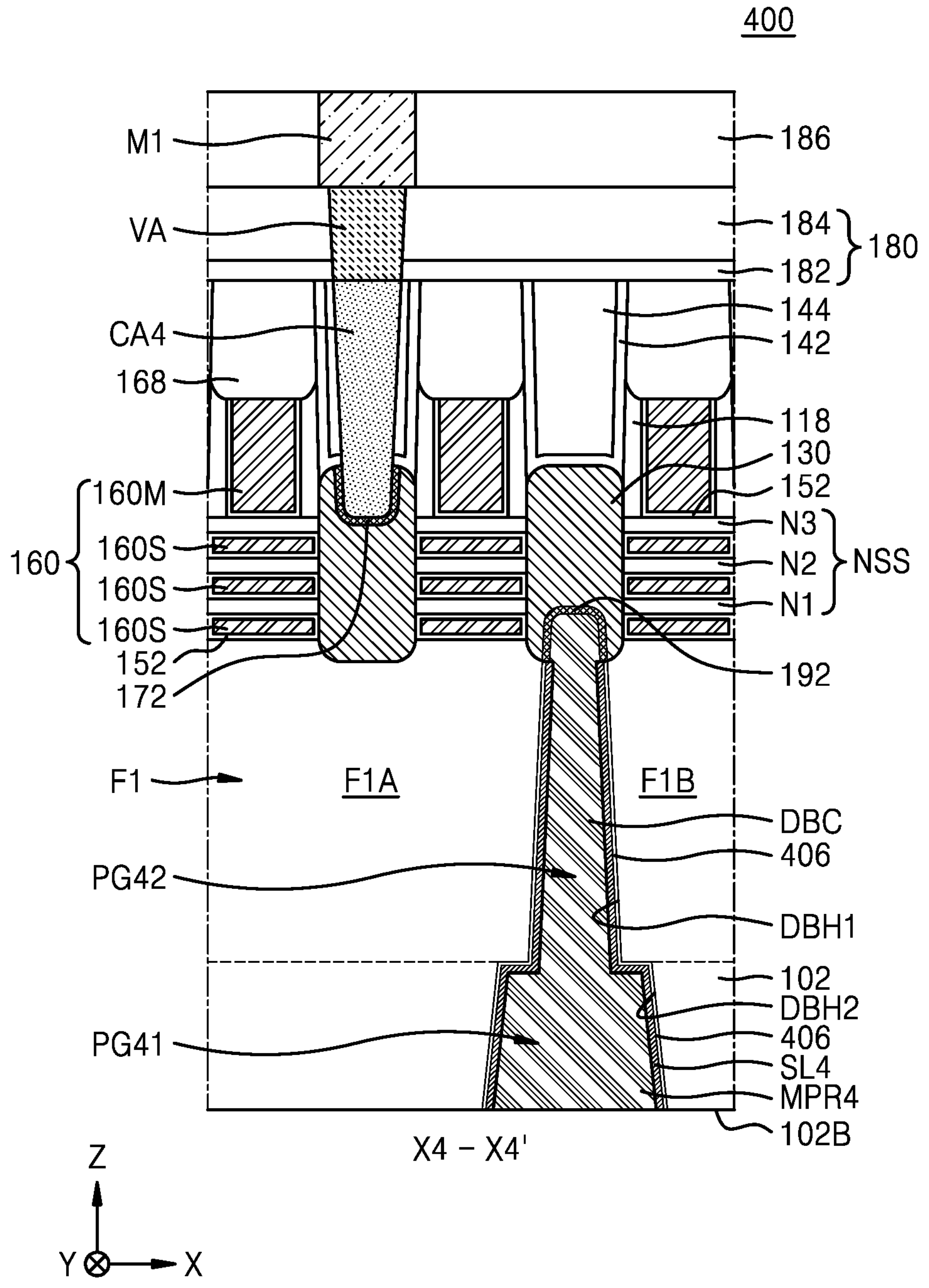
FIG. 10A is a cross-sectional view of the integrated circuit device, taken along the line X4-X4' of FIG. 9.
Figure 10B:
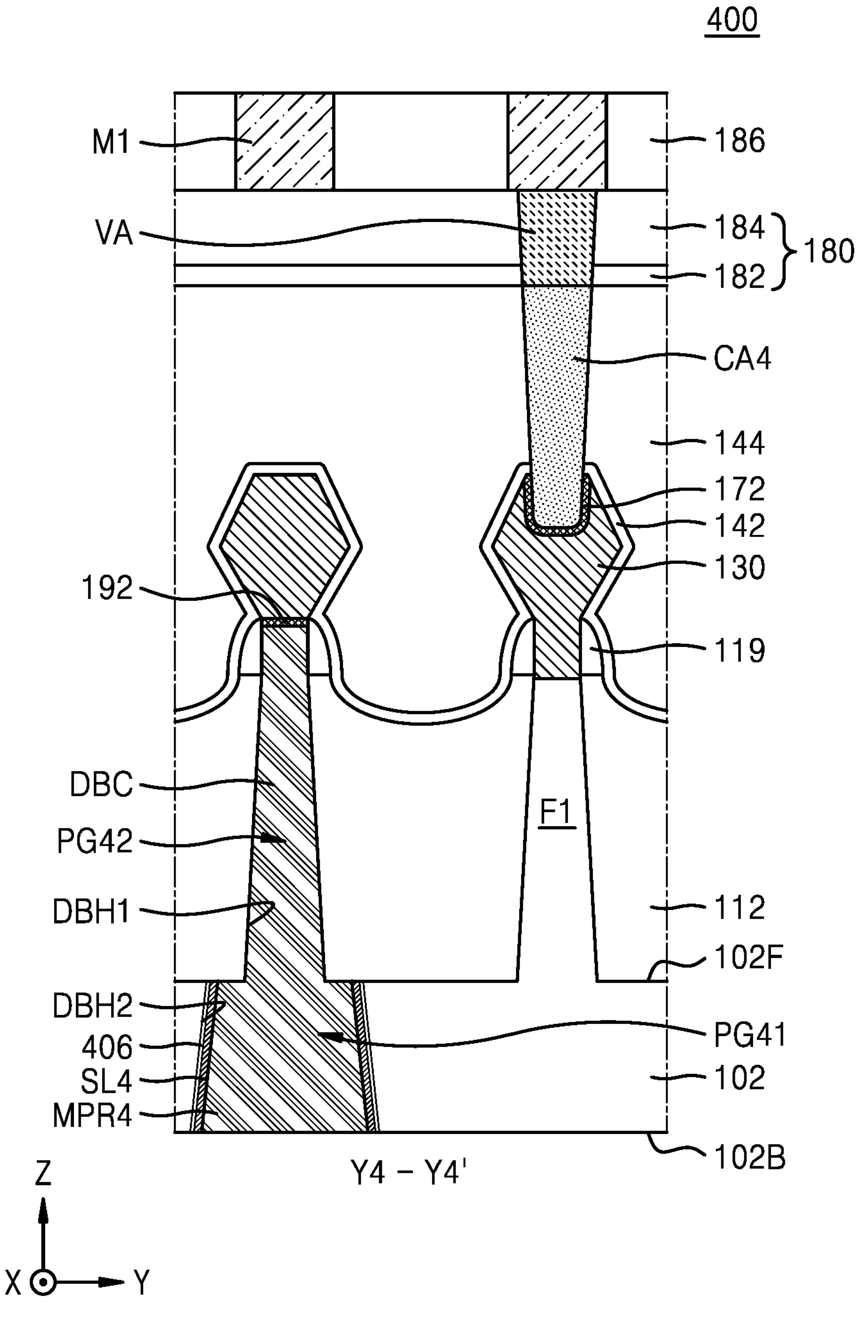
FIG. 10B is a cross-sectional view of the integrated circuit device, taken along the line Y4-Y4' of FIG. 9 according to some embodiments of the present inventive concept.

FIG. 9 is a planar layout diagram illustrating an integrated circuit device 400 according to some embodiments. FIG. 10A is a cross-sectional view of the integrated circuit device 400, taken along the line X4-X4' of FIG. 9. FIG. 10B is a cross-sectional view of the integrated circuit device 400, taken along the line Y4-Y4' of FIG. 9. In FIGS. 9, 10A, and 10B, the same reference numerals as in FIGS. 2 and 3A to 3C respectively denote the same members, and here, repeated descriptions thereof are omitted.

Referring to FIGS. 9, 10A, and 10B, the integrated circuit device 400 may constitute a portion of the plurality of cells LC shown in FIG. 1. The integrated circuit device 400 has substantially the same configuration as the integrated circuit device 100 described with reference to FIGS. 2 and 3A to 3C. However, the integrated circuit device 400 includes a contact structure, which includes a power rail wiring line MPR4 and a backside source/drain contact DBC.

One fin-type active region F1 selected from the plurality of fin-type active regions F1 may include a first fin portion F1A and a second fin portion F1B, which are arranged to be spaced apart from each other in the first horizontal direction (e.g., X direction) with the backside source/drain contact DBC of the contact structure therebetween, and which extend longitudinally along a straight line extending in the first horizontal direction (e.g., X direction). Each of the first fin portion F1A and the second fin portion F1B may have a sidewall covered by the device isolation film. The device isolation film 112 may constitute an insulating structure.

The plurality of gate lines 160 may be arranged over the plurality of fin-type active regions F1. Each of the plurality of gate lines 160 may extend longitudinally in the second horizontal direction (e.g., Y direction) that intersects with the first horizontal direction (e.g., X direction). In the intersection areas between the plurality of fin-type active regions F1 and the plurality of gate lines 160, the plurality of nanosheet stacks NSS may be arranged over each of the plurality of fin-type active regions F1.

The plurality of source/drain regions 130 may be arranged on each of the plurality of fin-type active regions F1. Each of the plurality of source/drain regions 130 may be arranged adjacent to at least one gate line 160 selected from the plurality of gate lines 160. Each of the plurality of source/drain regions 130 may be in contact with the first nanosheet N1, the second nanosheet N2, and the third nanosheet N3, which are included in the nanosheet stack NSS adjacent thereto.

As shown in FIG. 10B, the plurality of recess-side insulating spacers 119 may be arranged on the upper surface of the device isolation film 112. At least a portion of each of the plurality of recess-side insulating spacers 119 may cover a sidewall of the source/drain region 130. In some embodiments, each of the plurality of recess-side insulating spacers 119 may be integrally connected with the insulating spacer 118 adjacent thereto.

Metal silicide films 172 may be respectively formed on upper surfaces of some source/drain regions 130 selected from the plurality of source/drain regions 130, the upper surfaces facing the upper insulating structure 180, and metal silicide films 172 may be respectively formed on lower surfaces of some other source/drain regions 130 selected from the plurality of source/drain regions 130, the lower surfaces facing the substrate 102. The plurality of source/drain regions 130 and the device isolation film 112 may be covered by the insulating liner 142. The inter-gate dielectric 144 may be arranged on the insulating liner 142.

As shown in FIG. 10B, a plurality of frontside source/drain contacts CA4 may be arranged over the fin-type active region F1. The plurality of frontside source/drain contacts CA4 may be configured to be respectively and electrically connected to some source/drain regions 130 selected from the plurality of source/drain regions 130. Each of the plurality of frontside source/drain contacts CA4 may be arranged to be spaced apart from the fin-type active region F1 in the vertical direction (e.g., Z direction) with the source/drain region 130 therebetween.

Each of the plurality of frontside source/drain contacts CA4 may extend through the inter-gate dielectric 144 and the insulating liner 142 in the vertical direction (e.g., Z direction) to contact the metal silicide film 172. As shown in FIG. 10A, the frontside source/drain contact CA4 may be spaced apart from the main gate portion 160M of the gate line 160 in the first horizontal direction (e.g., X direction) with the insulating spacer 118 therebetween. A more detailed configuration of the frontside source/drain contact CA4 is substantially the same as that of the source/drain contact CA described with reference to FIGS. 2, 3A, and 3B.

A plurality of backside source/drain contacts DBC may be arranged in a backside region that is opposite to a frontside region in which the frontside source/drain contacts CA4 are arranged, with the plurality of source/drain regions 130 being between the backside region and the frontside region. The plurality of backside source/drain contacts DBC may be configured to be respectively and electrically connected to some other source/drain regions 130, which are selected from the plurality of source/drain regions 130 and not connected with the frontside source/drain contacts CA4.

Each of the plurality of backside source/drain contacts DBC may extend through one fin-type active region F1, which is selected from the plurality of fin-type active regions F1, in the vertical direction (e.g., Z direction). As described above, the selected one fin-type active region F1 may include the first fin portion F1A and the second fin portion F1B, which are arranged to be spaced apart from each other in the first horizontal direction (e.g., X direction) with the backside source/drain contact DBC therebetween, and which extend longitudinally along a straight line extending in the first horizontal direction (e.g., X direction).

Among the plurality of source/drain regions 130, the source/drain region 130 connected with the frontside source/drain contact CA4 may be spaced apart from the source/drain region 130 connected with the backside source/drain contact DBC, in the horizontal direction, for example, the first horizontal direction (e.g., X direction) or the second horizontal direction (e.g., Y direction).

Each of the plurality of backside source/drain contacts DBC may have sidewalls respectively facing the fin-type active region F1, through which the backside source/drain contact DBC extends in the vertical direction (e.g., Z direction), and the device isolation film 112 adjacent thereto.

As shown in FIG. 10A, the plurality of gate lines 160 may include gate lines 160 arranged over the first fin portion F1A and gate lines 160 arranged over the second fin portion F1B. Each of the plurality of frontside source/drain contacts CA4 may be configured to be electrically connected to the source/drain region 130 arranged on the first fin portion F1A or the second fin portion F1B.

As shown in FIG. 10B, the device isolation film 112 may cover both sidewalls of each of the first fin portion F1A and the second fin portion F1B in the second horizontal direction (e.g., Y direction) and may define the width of a contact space DHB1 in the second horizontal direction (e.g., Y direction). The backside source/drain contact DBC may be arranged in the contact space DHB1 to overlap the source/drain region 130 in the vertical direction (e.g., Z direction) and may extend longitudinally in the vertical direction (e.g., Z direction) in the contact space DHB1.

The backside source/drain contact DBC may have increasing widths in the first horizontal direction (e.g., X direction) and the second horizontal direction (e.g., Y direction) with the decreasing distance from the substrate 102 in the vertical direction (e.g., Z direction). As shown in FIGS. 10A and 10B, the frontside source/drain contact CA4 may have increasing widths in the first horizontal direction (e.g., X direction) and the second horizontal direction (e.g., Y direction) with the decreasing distance from the substrate 102 in the vertical direction (e.g., Z direction).

A metal silicide film 192 may be arranged between the backside source/drain contact DBC and the source/drain region 130. A more detailed configuration of the metal silicide film 192 is substantially the same as that of the metal silicide film 172 described above.

As shown in FIG. 10B, in the contact space DBH1, sidewalls of the backside source/drain contact DBC, which face the device isolation film 112, may be in contact with the device isolation film 112. As shown in FIG. 10A, in the contact space DBH1, a self-assembled organic material insulating liner SL4 may be arranged between the backside source/drain contact DBC and the first fin portion F1A and between the backside source/drain contact DBC and the second fin portion F1B. The self-assembled organic material insulating liner SL4 may be in contact with the backside source/drain contact DBC.

As shown in FIG. 10A, in the contact space DBH1, an oxide film 406 may be arranged between the first fin portion F1A and the self-assembled organic material insulating liner SL4 and between the second fin portion F1B and the self-assembled organic material insulating liner SL4. The oxide film 406 may include a silicon oxide film. The self-assembled organic material insulating liner SL4 may be bonded to a surface of the oxide film 406. The oxide film 406 may have a thickness of 10 Å or less. For example, the oxide film 406 may have, but is not limited to, a thickness of about 1 Å to about 8 Å.

In some embodiments, the self-assembled organic material insulating liner SL4 may include a result product, in which an organosilane compound is chemisorbed on the oxide film 406. In some embodiments, the self-assembled organic material insulating liner SL4 may include a monolayer including a plurality of organic carbon chains, which each include a silicon atom and a C1 to C30 alkyl group. A more detailed configuration of the self-assembled organic material insulating liner SL4 is substantially the same as those of the first and second self-assembled organic material insulating liners SLA and SLB described with reference to FIG. 3B.

In the integrated circuit device 400, the power rail wiring line MPR4 may extend through the substrate 102 in the vertical direction (e.g., Z direction) from the backside surface 102B to the frontside surface 102F of the substrate 102 and be connected to the backside source/drain contact DBC. The backside source/drain contact DBC may include a first end, which is connected to the power rail wiring line MPR4, and a second end, which is connected to the source/drain region 130 through the metal silicide film 192. In some embodiments, the power rail wiring line MPR4 may be integrally connected with the backside source/drain contact DBC. In some embodiments, the power rail wiring line MPR4 and the backside source/drain contact DBC may include the same metal. In some embodiments, each of the power rail wiring line MPR4 and the backside source/drain contact DBC may include a metal plug including molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof.

A contact structure, which includes the power rail wiring line MPR4 and the backside source/drain contact DBC, may include a first plug portion PG41, which includes the power rail wiring line MPR4 extending through the substrate 102 in the vertical direction (e.g., Z direction), and a second plug portion PG42, which includes the backside source/drain contact DBC extending through an insulating structure in the vertical direction (e.g., Z direction), the insulating structure including the device isolation film 112.

The self-assembled organic material insulating liner SL4 may extend up to a space between the first plug portion PG41 and the substrate 102 to cover a sidewall of the first plug portion PG41 that includes the power rail wiring line MPR4. The self-assembled organic material insulating liner SL4 may be in contact with the power rail wiring line MPR4.

The oxide film 406 may be arranged between the substrate 102 and the self-assembled organic material insulating liner SL4. A portion of the self-assembled organic material insulating liner SL4, which is arranged between the substrate 102 and the power rail wiring line MPR4, may be bonded to the surface of the oxide film 406, which is in a contact space DBH2 formed in the substrate 102.

As shown in FIGS. 10A and 10B, respective upper surfaces of the plurality of frontside source/drain contacts CA4, the plurality of capping insulating patterns 168, and the inter-gate dielectric 144 may be covered by the upper insulating structure 180. The upper insulating structure 180 may include the etch stop film 182 and the upper insulating film 184. The plurality of source/drain via contacts VA may be respectively arranged on the plurality of frontside source/drain contacts CA4. Each of the plurality of source/drain via contacts VA may extend through the upper insulating structure 180 to contact the frontside source/drain contact CA4. Among the plurality of source/drain regions 130, the source/drain region 130 connected to the frontside source/drain contact CA4 may be configured to be electrically connected to the source/drain via contact VA through the metal silicide film 172 and the frontside source/drain contact CA4. The upper surface of the upper insulating structure 180 may be covered by the interlayer dielectric 186. The plurality of upper wiring layers M1 may extend through the interlayer dielectric 186. Each of the plurality of upper wiring layers M1 may be connected to one source/drain via contact VA, which is selected from the plurality of source/drain via contacts VA thereunder, or one gate contact CB, which is selected from the plurality of gate contacts CB (see FIG. 9) thereunder.

Similar to the integrated circuit device 100 described with reference to FIGS. 2 and 3A to 3C, the integrated circuit device 400 described with reference to FIGS. 9, 10A, and 10B includes the self-assembled organic material insulating liner SL4 arranged between the substrate 102 and the first plug portion PG41, which extends through the substrate 102 in the vertical direction (e.g., Z direction), between the second plug portion PG42 and the first fin portion FlA, and between the second plug portion PG42 and the second fin portion F1B. According to the integrated circuit device 400, the first plug portion PG41 extending through the substrate 102 and corresponding to a portion of the contact structure, which is prone to generating leakage current, and the second plug portion PG42 extending through the fin-type active region F1 in the vertical direction (e.g., Z direction) may be selectively surrounded by the self-assembled organic material insulating liner SL4, thereby selectively cutting off leakage current flowing through the substrate 102 and the fin-type active region F1. In addition, because a portion of the second plug portion PG42, which faces the device isolation film 112, in the contact structure, does not need to be surrounded by an inorganic material insulating spacer, a space occupied by the second plug portion PG42 may be increased, and thus, the resistance in the contact structure may be reduced. Therefore, even when the integrated circuit device 400 has a device region having a reduced area due to down-scaling, the reliability of the integrated circuit device 400 may improve.

Hereinafter, a method of fabricating an integrated circuit device, according to some embodiments, is described in detail.

FIGS. 11A to 27 are diagrams respectively illustrating a sequence of processes of a method of fabricating an integrated circuit device, according to some embodiments. More specifically, FIGS. 11A, 12A, 14A, 15A, 16A, 17A, 22A, and 23A are cross-sectional views each illustrating an example of a cross-sectional structure of a portion of the integrated circuit device, which corresponds to the cross-section taken along the line X1-X1' of FIG. 2, according to the sequence of processes. FIGS. 11B, 12B, 13, 14B, 15B, 17B, 18, 19A, 20, 21, 22B, 23B, 24, 25, 26, and 27 are cross-sectional views each illustrating an example of a cross-sectional structure of a portion of the integrated circuit device, which corresponds to the cross-section taken along the line Y1-Y1' of FIG. 2, according to the sequence of processes. FIGS. 14C, 16B, 17C, and 23C are cross-sectional views each illustrating an example of a cross-sectional structure of a portion of the integrated circuit device, which corresponds to the cross-section taken along the line Y2-Y2' of FIG. 2, according to the sequence of processes. FIG. 19B is a diagram illustrating a process of forming a first self-assembled organic material insulating liner shown in FIG. 19A. An example of a method of fabricating the integrated circuit device 100 described with reference to FIGS. 2 and 3A to 3C is described with reference to FIGS. 11A to 27. In FIGS. 11A to 27, the same reference numerals as in FIGS. 2 and 3A to 3C respectively denote the same members, and here, repeated descriptions thereof are omitted.

Figure 11A:
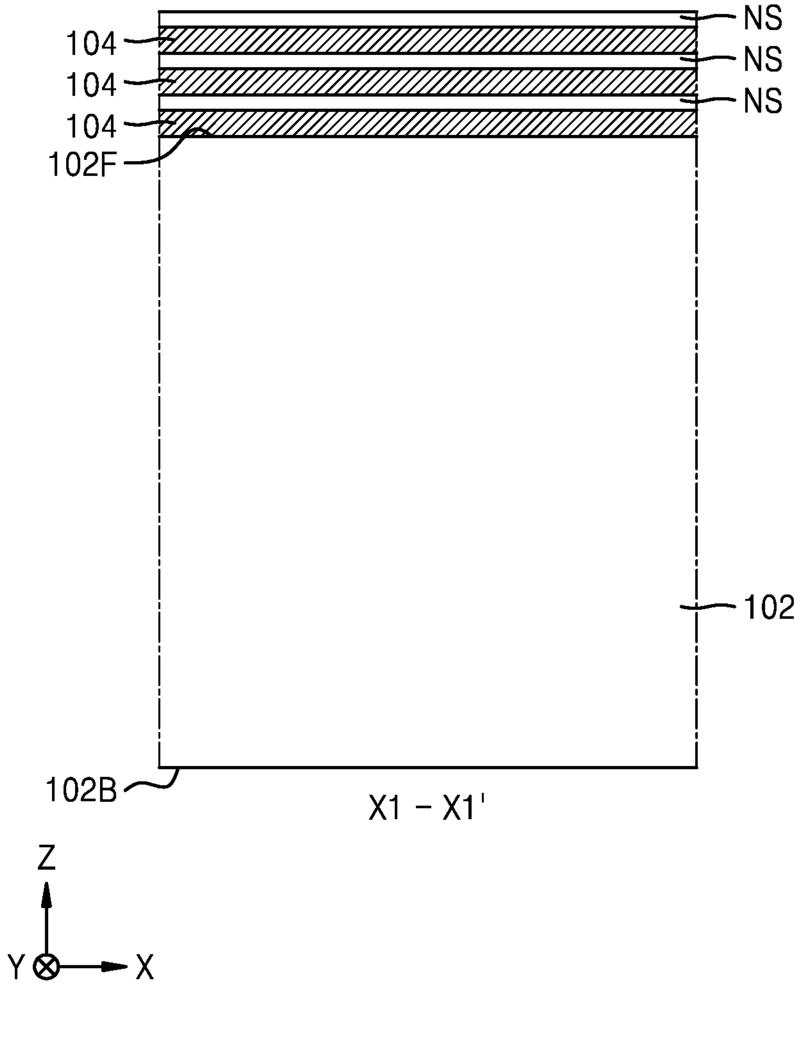
Figure 11B:
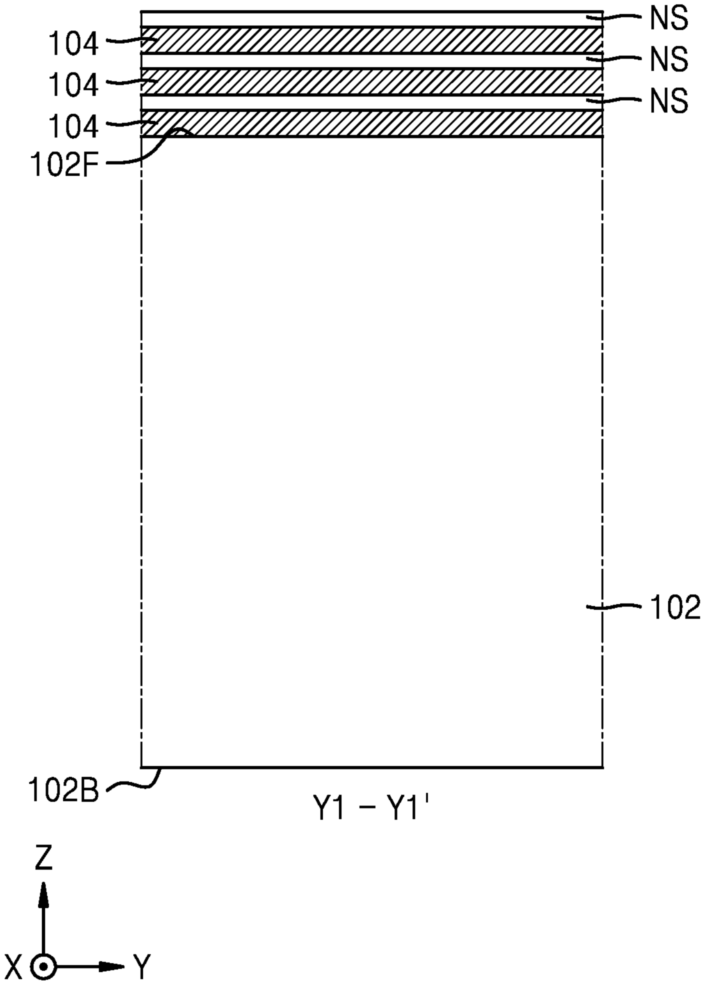

Referring to FIGS. 11A and 11B, the substrate 102 having the frontside surface 102F and the backside surface 102B, which are opposite to each other, may be prepared, and a plurality of sacrificial semiconductor layers 104 and a plurality of nanosheet semiconductor layers NS may be alternately stacked one-by-one on the frontside surface 102F of the substrate 102.

Each of the plurality of sacrificial semiconductor layers 104 and each of the plurality of nanosheet semiconductor layers NS may respectively include, for example, semiconductor materials having different etch selectivities from each other. In some embodiments, each of the plurality of nanosheet semiconductor layers NS may include, for example, an Si layer and each of the plurality of sacrificial semiconductor layers 104 may include, for example, an SiGe layer. The SiGe layer constituting the sacrificial semiconductor layer 104 may have constant Ge content selected from a range, for example, of about 5 at % to about 50 at %, for example, about 10 at % to about 40 at %. The Ge content in the SiGe layer constituting each of the plurality of sacrificial semiconductor layers 104 may be variously selected, as needed.

Figure 12A:
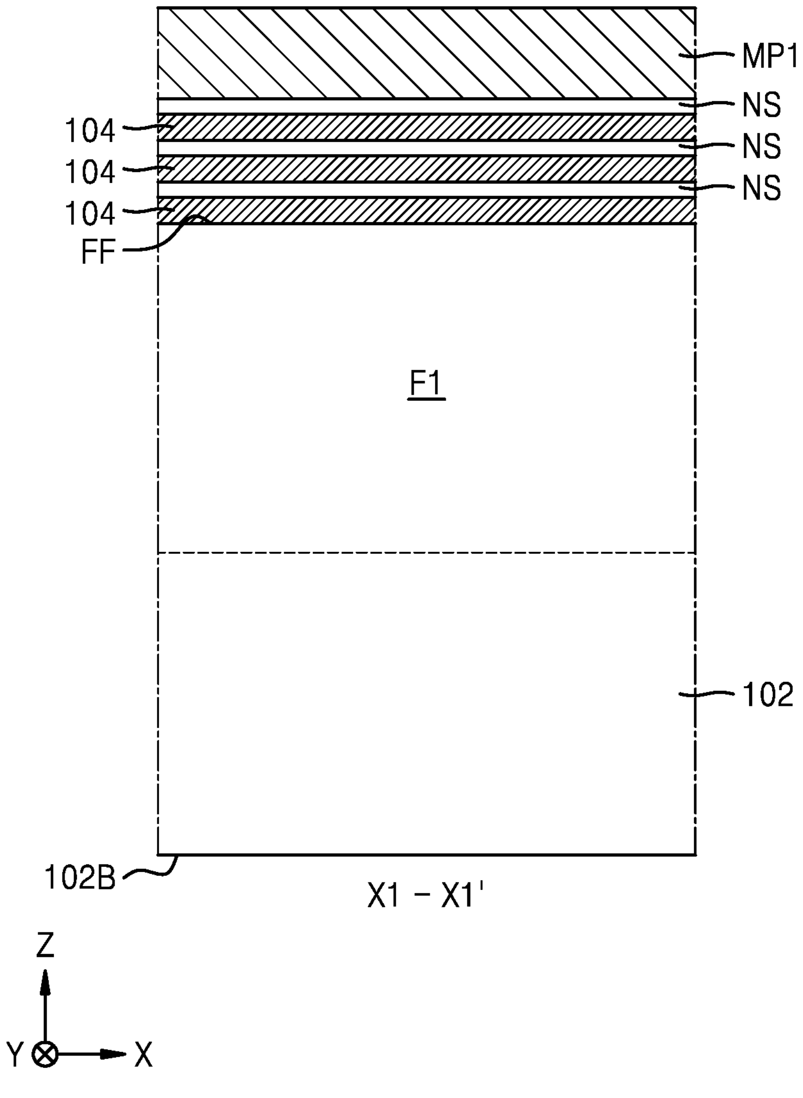
Figure 12B:
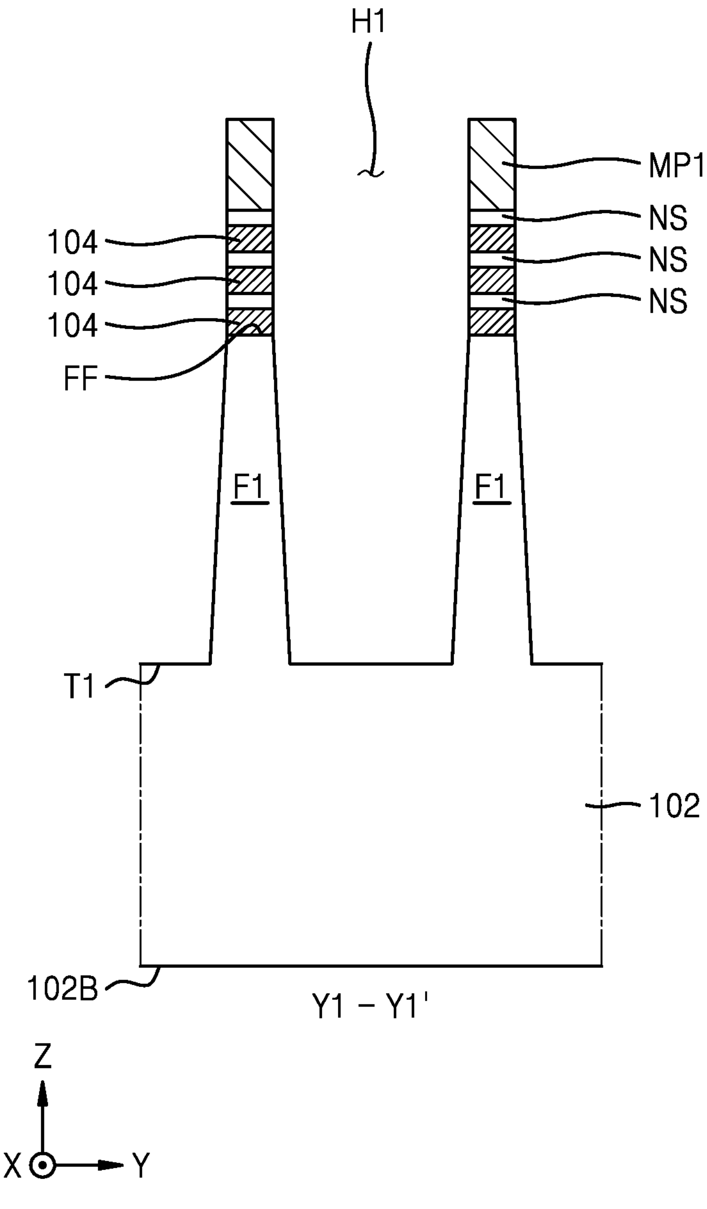

Referring to FIGS. 12A and 12B, a first mask pattern MP1 having a plurality of openings H1 may be formed, for example, on the resultant product of FIGS. 11A and 11B. Next, each of the plurality of sacrificial semiconductor layers 104, the plurality of nanosheet semiconductor layers NS, and the substrate 102 may be partially etched through the plurality of openings H1 by using the first mask pattern MP1 as an etch mask, thereby forming the plurality of fin-type active regions F1 in the substrate 102. The plurality of trench regions T1 may be defined on the substrate 102 by the plurality of fin-type active regions F1. The first mask pattern MP1 may include, for example, a stack structure of a silicon oxide film pattern and a silicon nitride film pattern. The first mask pattern MP1 may include portions extending parallel to each other in the first horizontal direction (e.g., X direction) over the substrate 102. A stack structure of the plurality of sacrificial semiconductor layers 104 and the plurality of nanosheet semiconductor layers NS may remain on the fin top surface FF of each of the plurality of fin-type active regions F1.

Figure 13:
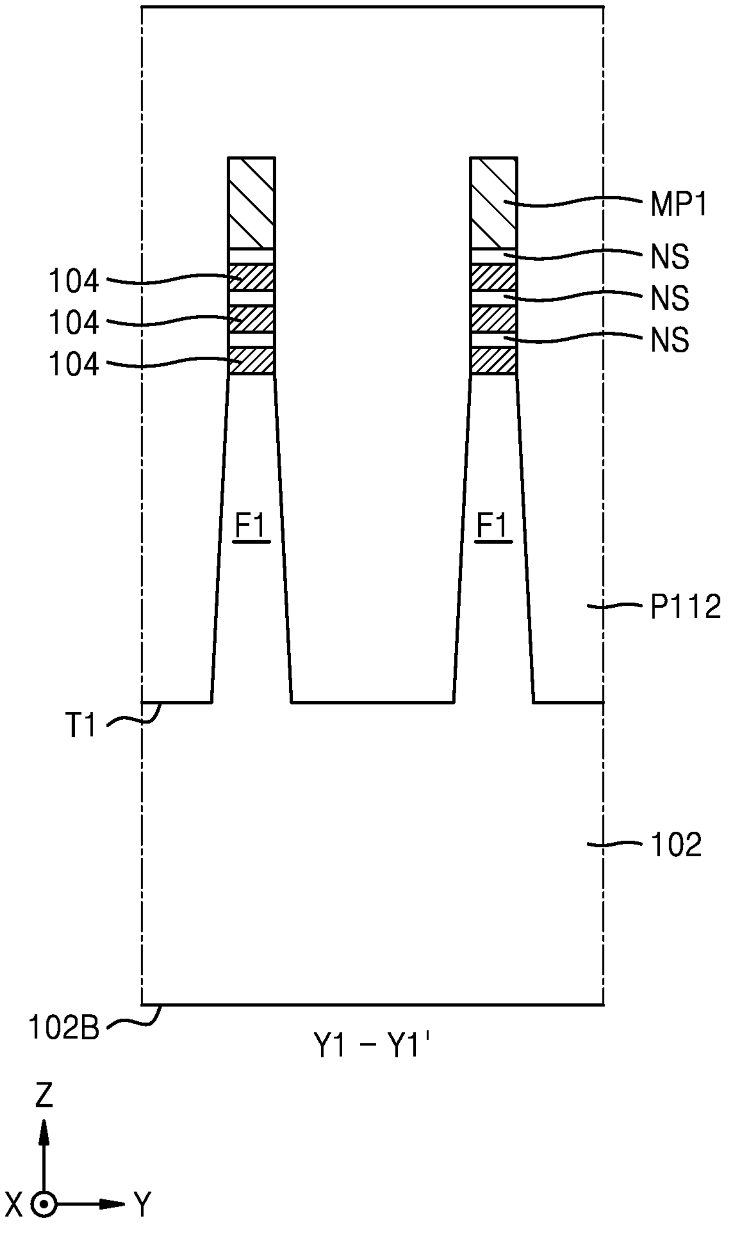

Referring to FIG. 13, a device isolation insulating film P112 may be formed on the resultant product of FIGS. 12A and 12B. The device isolation insulating film P112 may be formed, for example, to a thickness sufficient to fill the plurality of trench regions T1. In some embodiments, the device isolation insulating film P112 may include, but is not limited to, a silicon oxide film.

Figure 14A:
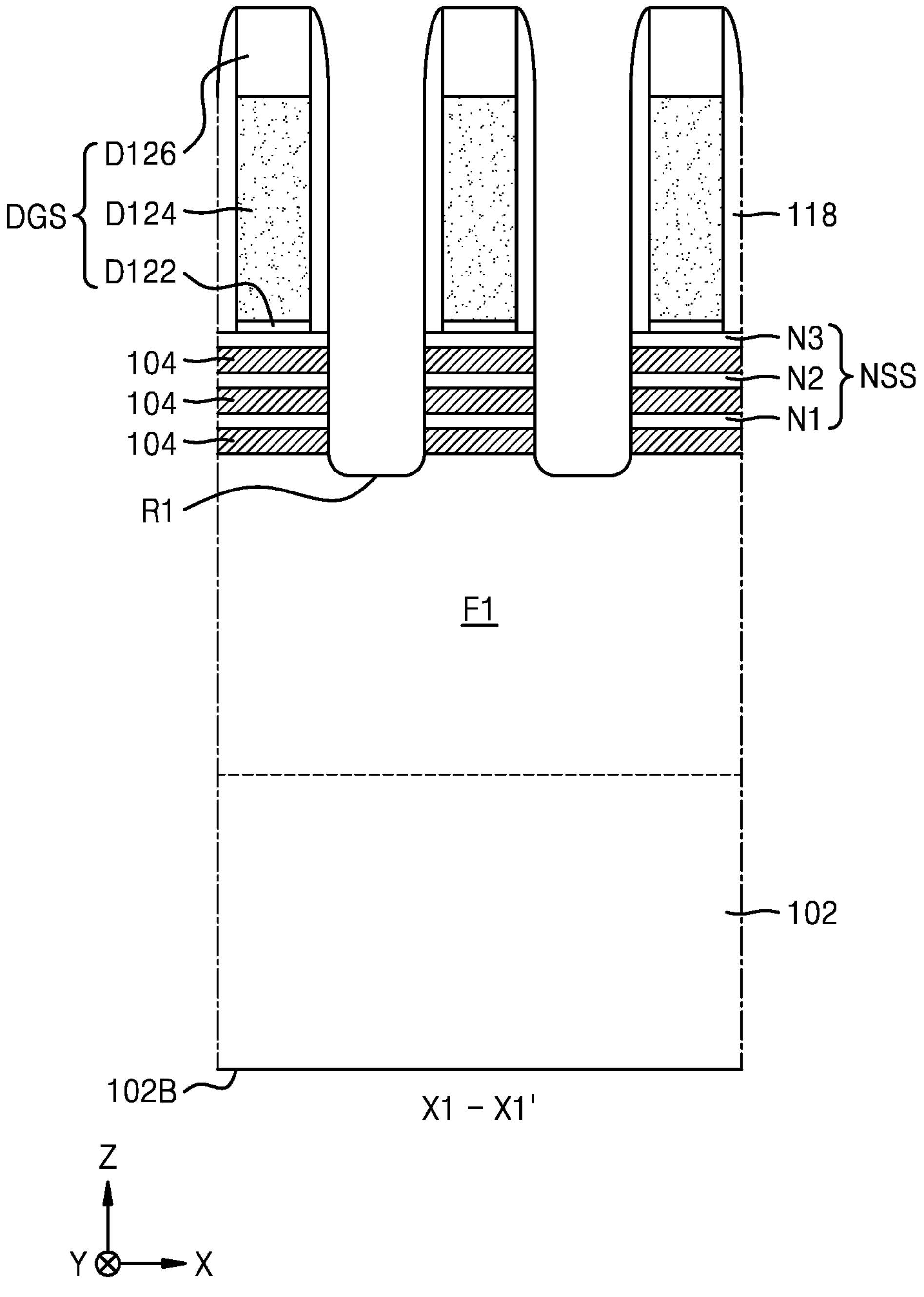
Figure 14B:
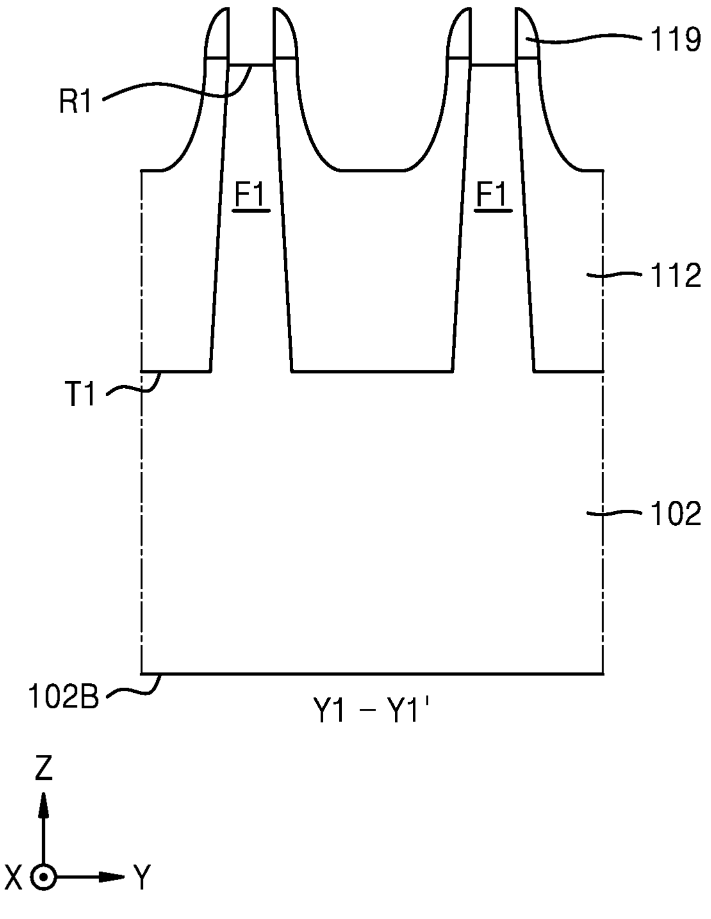
Figure 14C:
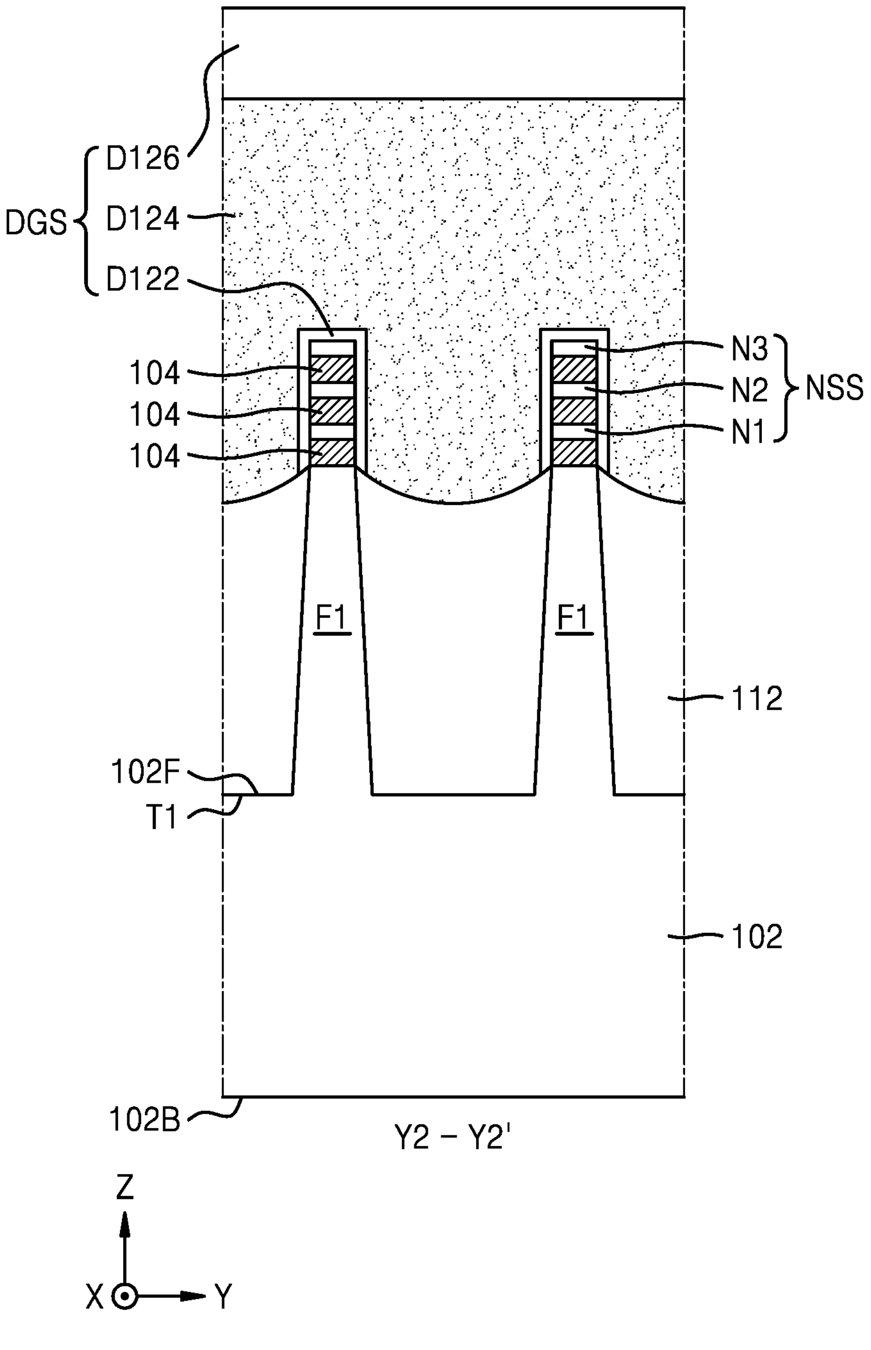
FIGS. 14C, 16B, 17C, and 23C are cross-sectional views each illustrating an example of a cross-sectional structure of a portion of the integrated circuit device, which corresponds to the cross-section taken along the line Y2-Y2' of FIG. 2, according to the sequence of processes.

Referring to FIGS. 14A, 14B, and 14C, the resultant product of FIG. 13 may be planarized to expose an upper surface of the first mask pattern MP1, followed by removing the exposed first mask pattern MP1, and then, a recess process for removing a portion of the device isolation insulating film P112 may be performed, thereby forming the device isolation film 112, which includes the remaining portion of the device isolation insulating film P112. As a result, the plurality of sacrificial semiconductor layers 104 and the plurality of nanosheet semiconductor layers NS may protrude upward from the upper surface of the device isolation film 112. To perform the recess process of the device isolation insulating film P112, a dry etching process, a wet etching process, or a combination process of dry etching and wet etching may be used.

Next, a plurality of dummy gate structures DGS may be formed on the stack structure of the plurality of sacrificial semiconductor layers 104 and the plurality of nanosheet semiconductor layers NS. Each of the plurality of dummy gate structures DGS may be formed to extend longitudinally in the second horizontal direction (e.g., Y direction). Each of the plurality of dummy gate structures DGS may have a structure in which an oxide film D122, a dummy gate layer D124, and a capping layer D126 are stacked in the stated order. In some embodiments, the oxide film D122 may be obtained by oxidizing a surface of each of the plurality of sacrificial semiconductor layers 104 and the plurality of nanosheet semiconductor layers NS (see FIG. 13). The dummy gate layer D124 may include, for example, polysilicon and the capping layer D126 may include, for example, a silicon nitride film.

A process of forming the plurality of insulating spacers 118 to cover both sidewalls of each of the plurality of dummy gate structures DGS, and a process of dividing the plurality of nanosheet semiconductor layers NS into the plurality of plurality of nanosheet stacks NSS and forming the plurality of recesses R1 in an upper portion of the fin-type active region F1, by etching a portion of each of the plurality of sacrificial semiconductor layers 104 and the plurality of nanosheet semiconductor layers NS and a portion of the fin-type active region F1 by using the plurality of dummy gate structures DGS and the plurality of outer insulating spacers 118 as an etch mask, may be performed. To form the plurality of recesses R1, the etching may be performed by dry etching, wet etching, or a combination thereof. During the formation of the plurality of insulating spacers 118 and the plurality of recesses R1, the plurality of recess-side insulating spacers 119 may be formed as shown in FIG. 14B, the plurality of recess-side insulating spacers 119 being arranged on the device isolation film 112 on both sides of each fin-type active region F1 in the second horizontal direction (e.g., Y direction) to be respectively adjacent to the plurality of recesses R1.

Figure 15A:
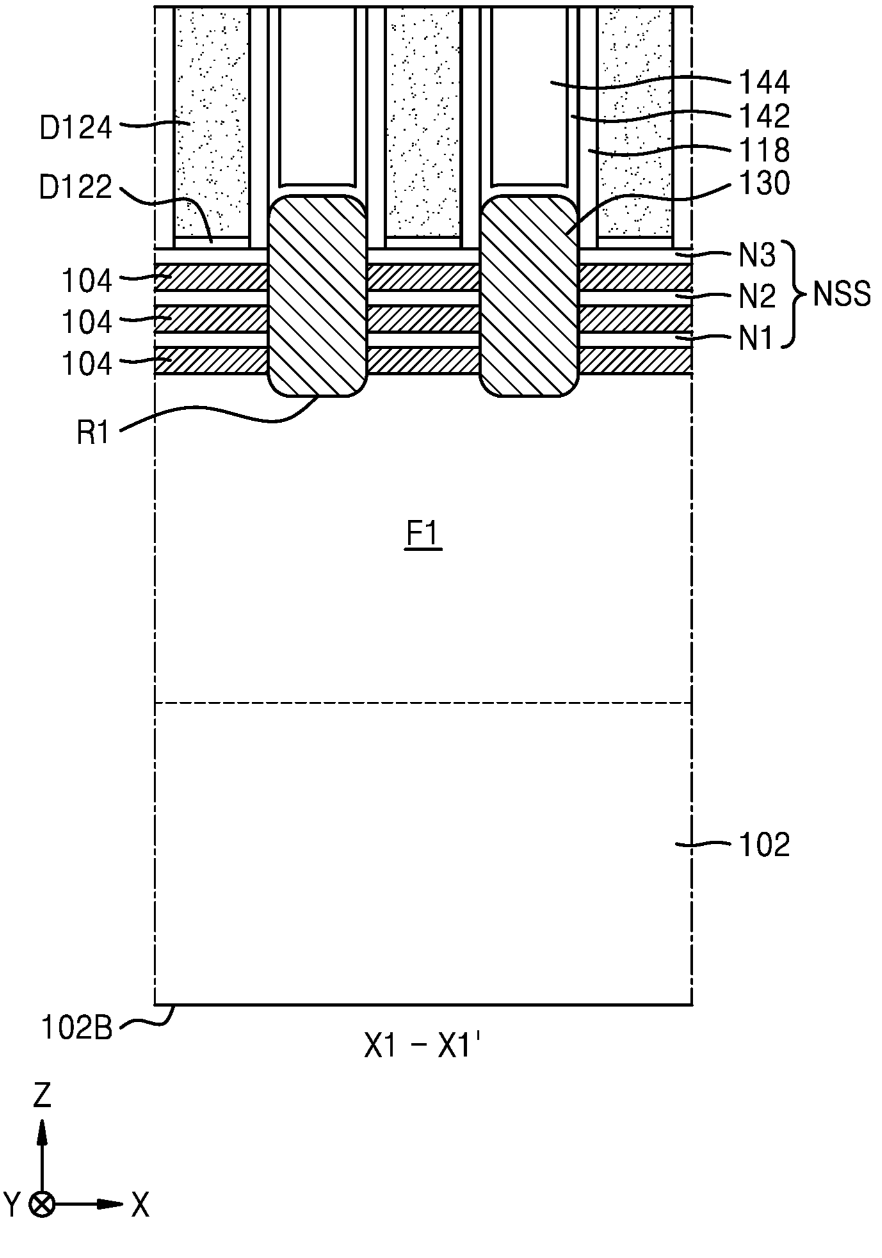
Figure 15B:
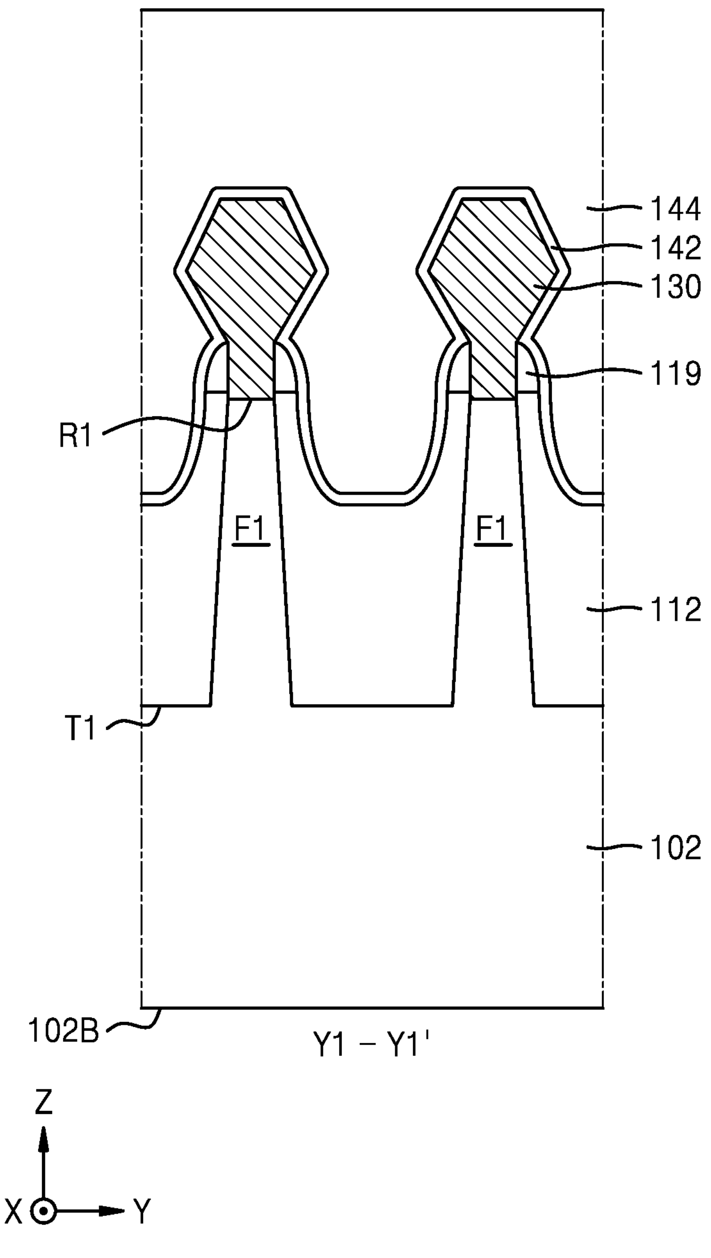

Referring to FIGS. 15A and 15B, in the resultant product of FIGS. 14A, 14B, and 14C, the plurality of source/drain regions 130 may be formed to respectively fill the plurality of recesses R1. To form the plurality of source/drain regions 130, in some embodiments, a semiconductor material may be epitaxially grown on an exposed surface of the fin-type active region F1 and an exposed sidewall of each of the first nanosheet N1, the second nanosheet N2, and the third nanosheet N3 of the nanosheet stack NSS in the plurality of recesses R1.

Next, the insulating liner 142 may be formed to cover the resultant product in which the plurality of source/drain regions 130 are formed, followed by forming the inter-gate dielectric 144 on the insulating liner 142, and then, upper surfaces of a plurality of capping layers D126 may be exposed, for example, by partially etching each of the insulating liner 142 and the inter-gate dielectric 144. Next, the dummy gate layer D124 may be exposed, for example, by removing the plurality of capping layers D126, and the insulating liner 142 and the inter-gate dielectric 144 may be partially etched such that an upper surface of the inter-gate dielectric 144 and an upper surface of the dummy gate layer D124 are at an approximately equal level.

Figure 16A:
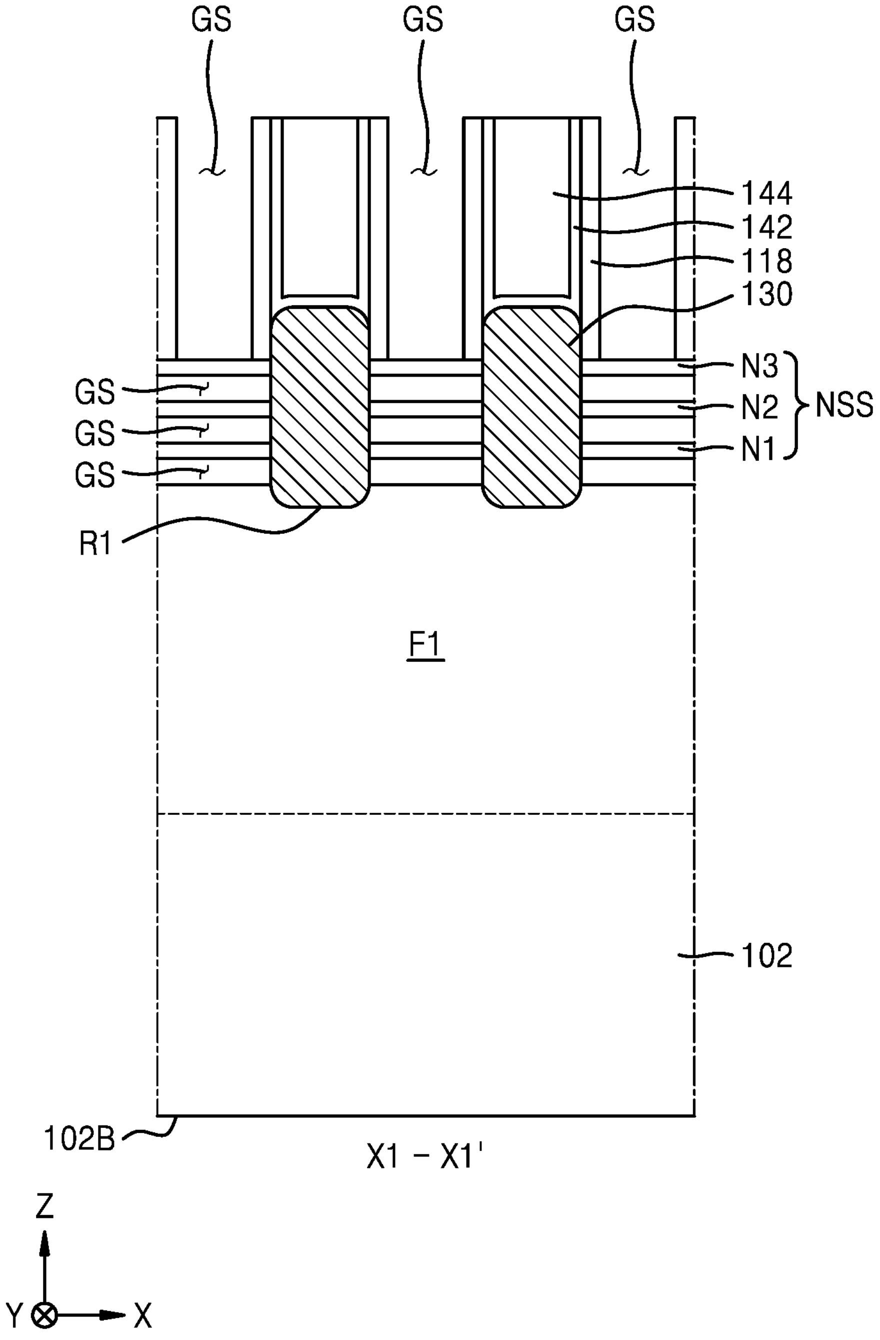
Figure 16B:
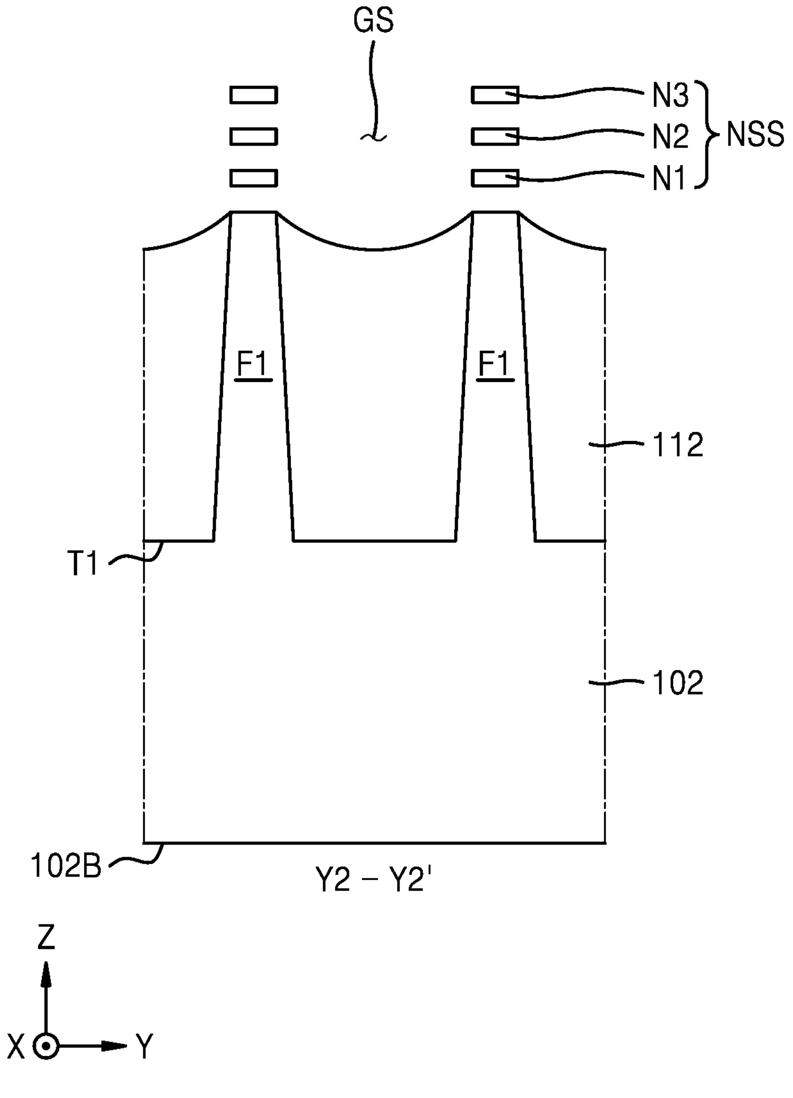

Referring to FIGS. 16A and 16B, a gate space GS may be prepared by removing the dummy gate layer D124 and the oxide film D122 thereunder from the resultant product of FIGS. 15A and 15B, and the plurality of nanosheet stacks NSS may each be exposed by the gate space GS. Next, by removing the plurality of sacrificial semiconductor layers 104 remaining on the fin-type active region F1 through the gate space GS, the gate space GS may expand up to each space between the first nanosheet N1, the second nanosheet N2, and the third nanosheet N3 and a space between the first nanosheet N1 and the fin-type active region F1.

In some embodiments, to selectively remove the plurality of sacrificial semiconductor layers 104, a difference in etch selectivity between each of the first nanosheet N1, the second nanosheet N2, the third nanosheet N3, and the fin-type active region F1 and each of the plurality of sacrificial semiconductor layers 104 may be used. To selectively remove the plurality of sacrificial semiconductor layers 104, a liquid-phase or gas-phase etchant, for example, may be used. In some embodiments, to selectively remove the plurality of sacrificial semiconductor layers 104, a $CH_3COOH$-based etching solution, for example, an etching solution including a mixture of $CH_3COOH$, $HNO_3$, and HF, or an etching solution including a mixture of $CH_3COOH$, $H_2O_2$, and HF, may be used, but the inventive concept is not limited thereto.

Figure 17A:
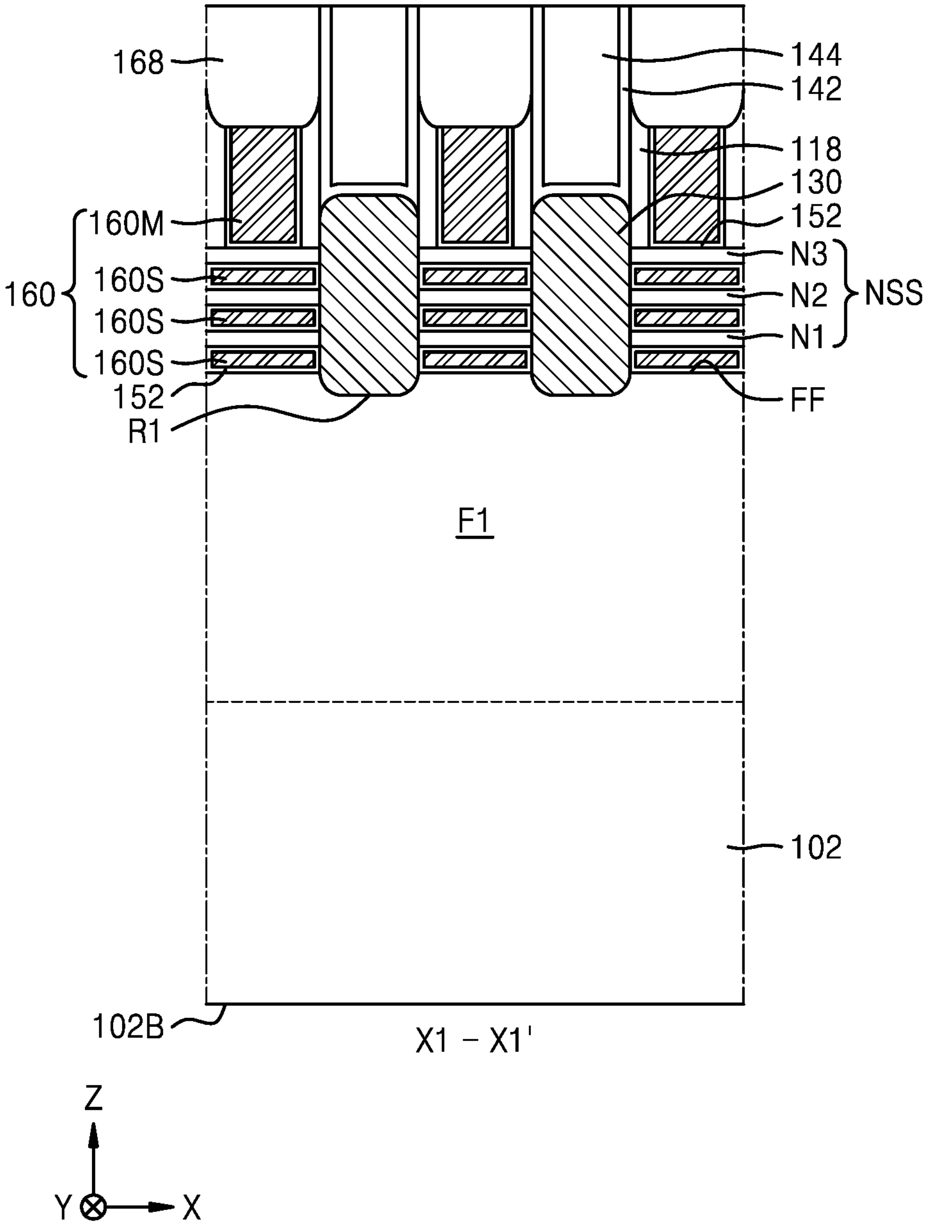
Figure 17B:
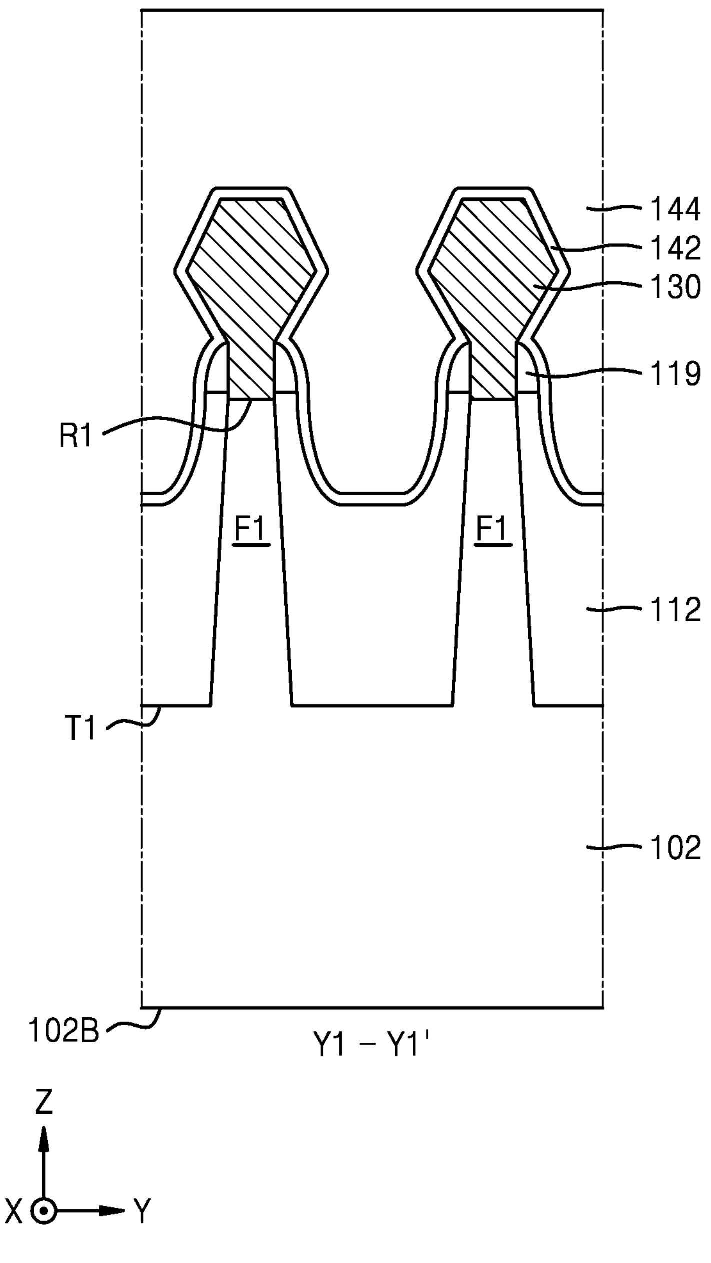
Figure 17C:
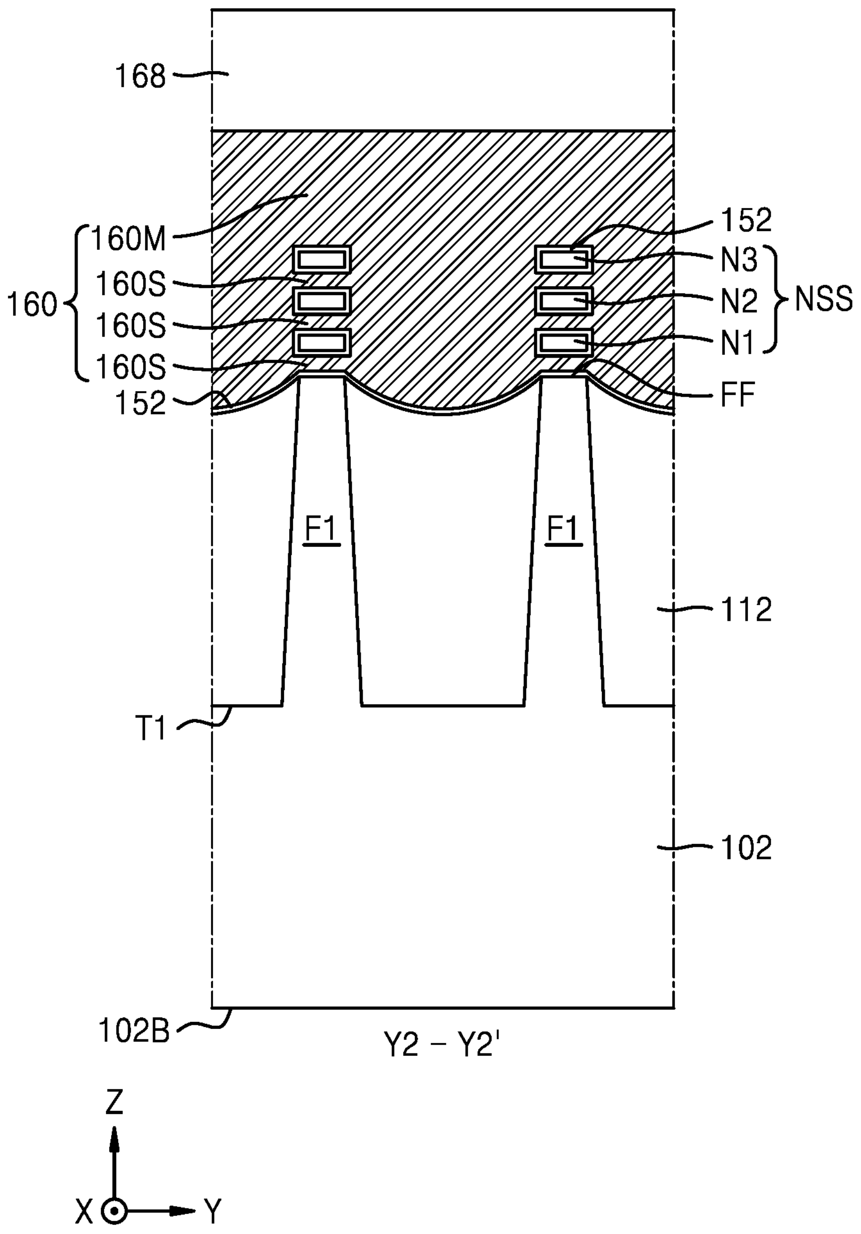

Referring to FIGS. 17A, 17B, and 17C, in the resultant product of FIGS. 16A and 16B, the gate dielectric film 152 may be formed to cover respective exposed surfaces of the first nanosheet N1, the second nanosheet N2, the third nanosheet N3, and the fin-type active region F1. To form the gate dielectric film 152, an atomic layer deposition (ALD) process may be used.

In some embodiments, the gate line 160 next may be formed on the gate dielectric film 152 to fill the gate space GS (see, e.g., FIGS. 16A and 16B), followed by partially removing each of the gate line 160, the gate dielectric film 152, and the insulating spacer 118 from an upper surface thereof to reduce the height thereof, and then, the plurality of capping insulating patterns 168 may each be formed to cover the upper surface of each of the gate line 160, the gate dielectric film 152, and the insulating spacer 118.

Figure 18:
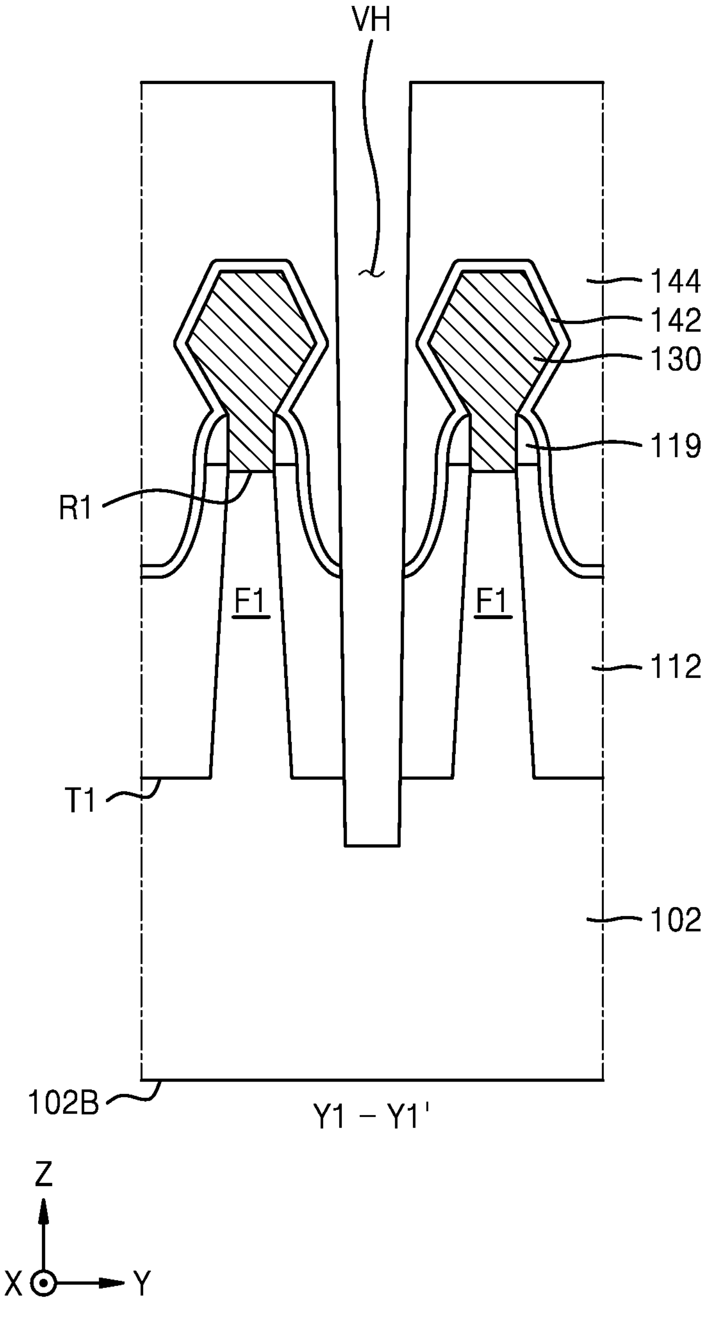

In some embodiments, referring to FIG. 18, in the resultant product of FIGS. 17A, 17B, and 17C, each of the inter-gate dielectric 144, the insulating liner 142, and the device isolation film 112 in a region, in which the via power rail VPR shown in FIGS. 2 and 3B is to be arranged, may be partially etched, followed by etching a portion of the substrate 102, which is exposed as a result thereof, thereby forming a via hole VH. In the via hole VH, a surface of an insulating structure, which includes the inter-gate dielectric 144, the insulating liner 142, and the device isolation film 112, and a surface of the substrate 102 may be exposed.

Figure 19A:
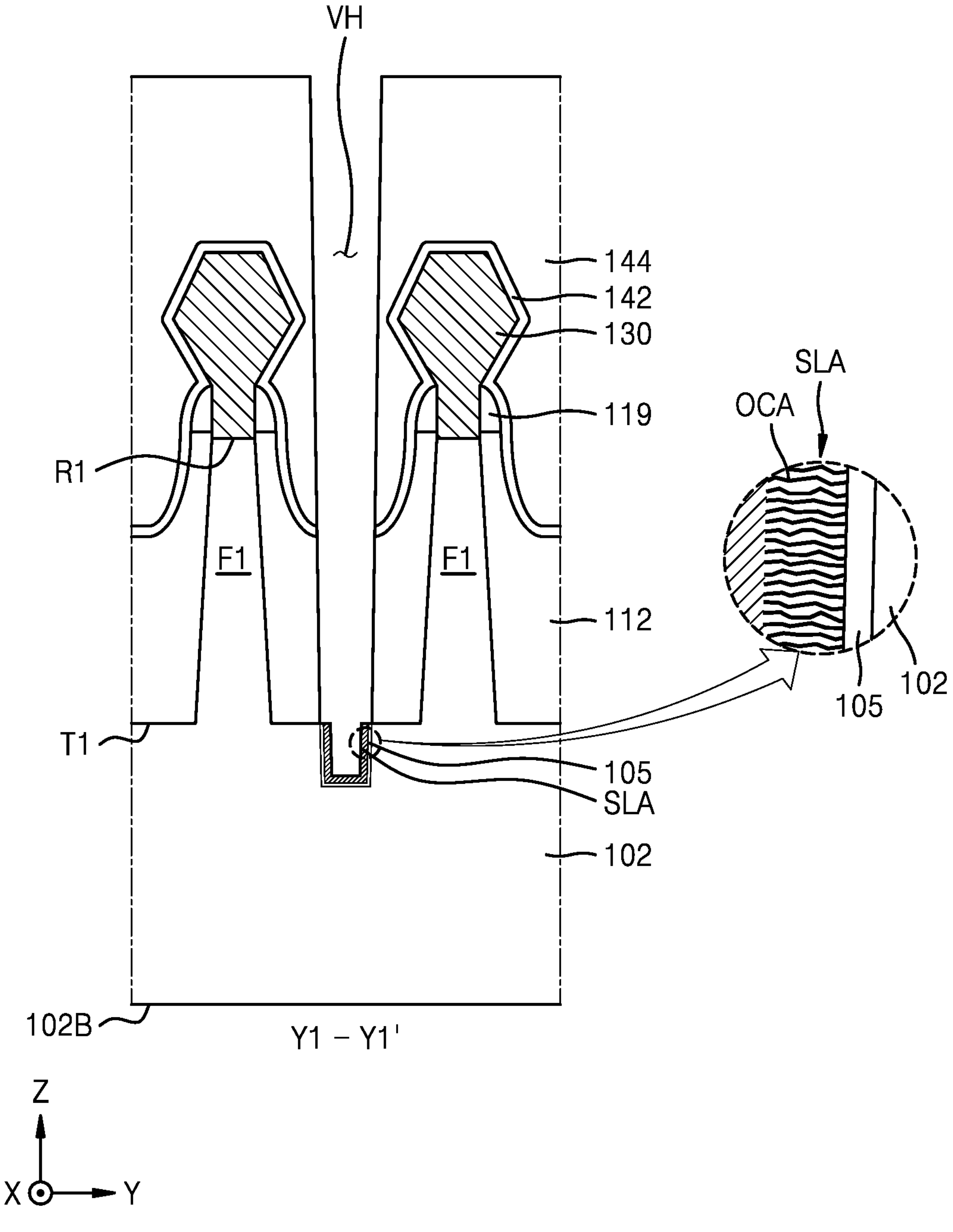
Figure 19B:
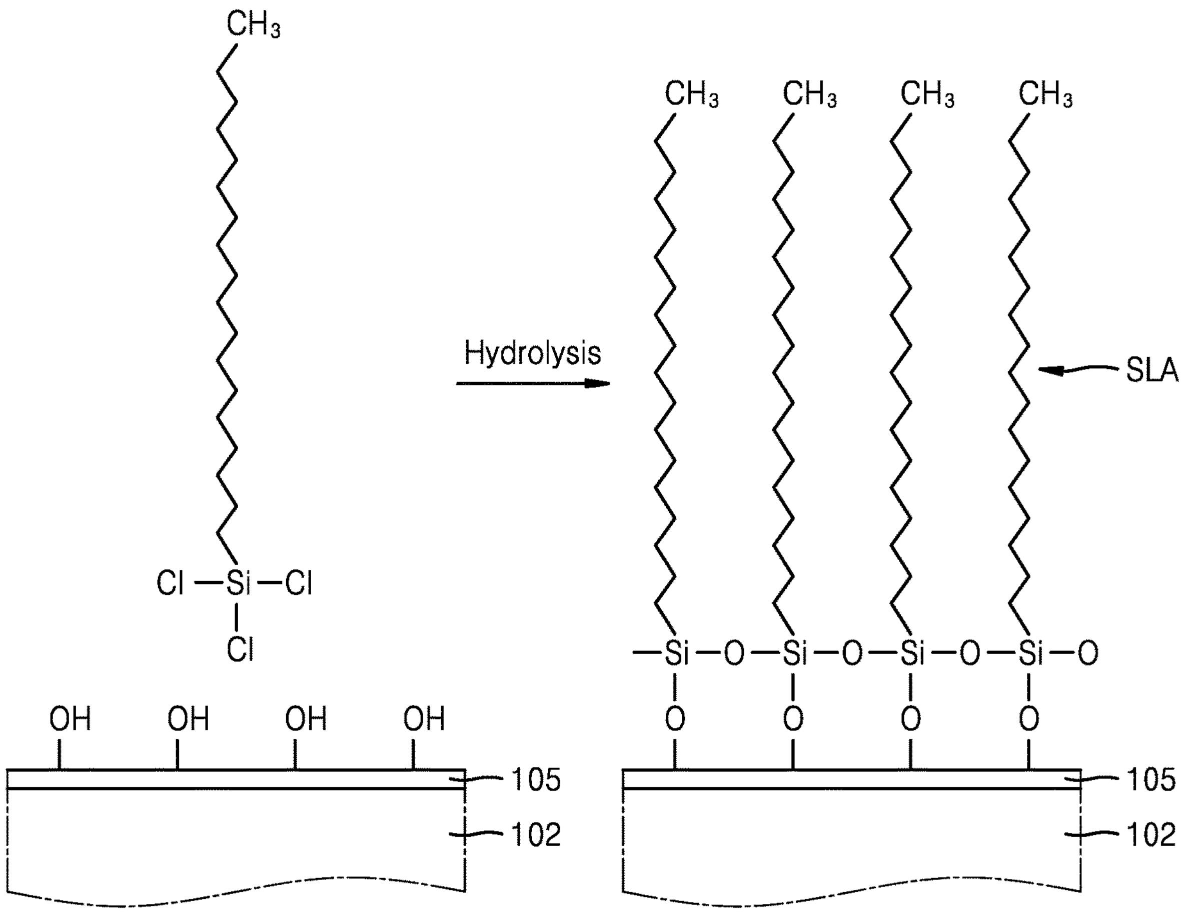
FIG. 19B is a diagram illustrating a process of forming a first self-assembled organic material insulating liner shown in FIG. 19A.

Referring to FIG. 19A, in the resultant product of FIG. 18, the first self-assembled organic material insulating liner SLA may be selectively formed only on the surface of the substrate 102 out of the surface of the insulating structure and the surface of the substrate 102, which are exposed by the via hole VH. Although not shown in FIG. 19A, the first self-assembled organic material insulating liner SLA may also be formed on an exposed surface of the backside surface 102B of the substrate 102.

In some embodiments, to selectively form the first self-assembled organic material insulating liner SLA only on the surface of the substrate 102, which is exposed by the via hole VH, the oxide film 105 may be formed on the surface of the substrate 102, which is exposed by the via hole VH, followed by supplying, to a surface of the oxide film 105, a precursor for forming the first self-assembled organic material insulating liner SLA, thereby forming the first self-assembled organic material insulating liner SLA comprising a monolayer that comprises a plurality of organic carbon chains OCA. In some embodiments, the oxide film 105 may be obtained by natural oxidation of the surface of the substrate 102. In some embodiments, the oxide film 105 may be obtained by selectively oxidizing the surface of the substrate 102 by using $O_2$ gas and $H_2$ gas.

In some embodiments, an organosilane compound may be supplied as the precursor for forming the first self-assembled organic material insulating liner SLA. Specific examples of the organosilane compound are the same as described with reference to FIGS. 3A to 3C.

FIG. 19B briefly illustrates an example process in which the first self-assembled organic material insulating liner SLA is formed from an octadecyltrichlorosilane (ODTS) precursor, when ODTS is supplied as the organosilane compound precursor into the via hole VH to form the first self-assembled organic material insulating liner SLA.

Referring to FIG. 19B, an Si—Cl attaching group, which is a reactive group in the ODTS precursor, may be hydrolyzed to form Si—OH groups on the ODTS, and the resultant product obtained by the hydrolysis of the ODTS precursor may be bonded to the surface of the oxide film 105 by a condensation reaction thereof with a hydroxyl group exposed at the surface of the oxide film 105 terminated with a hydroxyl group (—OH), to thereby form, on the surface of the oxide film 105, the first self-assembled organic material insulating liner SLA including a monolayer that includes the plurality of organic carbon chains OCA.

In some embodiments, to form the first self-assembled organic material insulating liner SLA, a wet process may be used. For example, the resultant product, in which the surface of the substrate 102 is exposed by the via hole VH, may be exposed to a solution including the organosilane compound. Specific examples of materials that may be used as the organosilane compound are the same as described with reference to FIGS. 3A to 3C.

In an example embodiment, the process of forming the first self-assembled organic material insulating liner SLA may comprise a process of exposing the resultant product, in which the surface of the substrate 102 is exposed by the via hole VH, to an ODTS solution. The ODTS solution may be a solution in which ODTS is included at a certain concentration in an organic solvent. The organic solvent may include, but is not limited to, hexane, heptane, dodecane, or toluene. The process of exposing the resultant product, in which the surface of the substrate 102 is exposed, to the ODTS solution may be performed by, but is not limited to, immersion or spin coating.

In some embodiments, to form the first self-assembled organic material insulating liner SLA, a dry process may be used. The dry process may include, but is not limited to, a chemical vapor deposition process, a molecular beam epitaxy process, or an ALD process. For example, by supplying an organosilane compound precursor gas onto the surface of the substrate 102, which is exposed by the via hole VH, the first self-assembled organic material insulating liner SLA may be selectively formed only on the surface of the substrate 102 through a spontaneous chemical reaction.

In some embodiments, the resultant product of FIG. 19A, in which the first self-assembled organic material insulating liner SLA is formed, may undergo heat treatment, thereby removing impurities which may remain in the first self-assembled organic material insulating liner SLA, and densifying the first self-assembled organic material insulating liner SLA. The heat treatment may be performed, for example, at a temperature of about 100° C. to about 500° C. for about 10 minutes to about 1 hour. For example, the heat treatment may be performed at a temperature of about 200° C. to about 400° C. for about 20 minutes to about 40 minutes.

Figure 20:
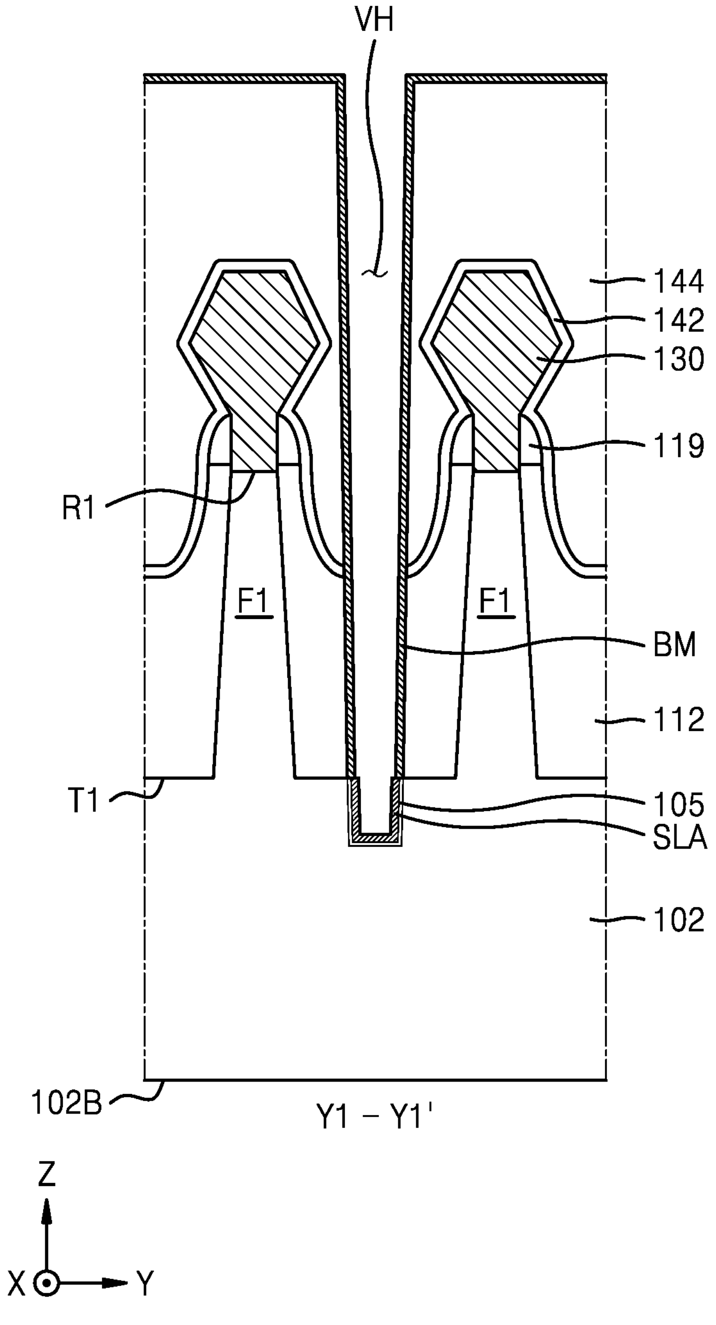

Referring to FIG. 20, in the resultant product of FIG. 19A, the conductive barrier film BM may be selectively formed on the surface of the insulating structure including the inter-gate dielectric 144, the insulating liner 142, and the device isolation film 112. The conductive barrier film BM may not be formed on the first self-assembled organic material insulating liner SLA.

In some embodiments, to form the conductive barrier film BM, a selective ALD process may be performed. In some embodiments, to form the conductive barrier film BM, the conductive barrier film BM may be formed, for example, while the first self-assembled organic material insulating liner SLA is covered by a sacrificial film, and then, the first self-assembled organic material insulating liner SLA may be exposed by removing the sacrificial film. In some embodiments, the process described with reference to FIG. 20 to form the conductive barrier film BM may be omitted.

Figure 21:
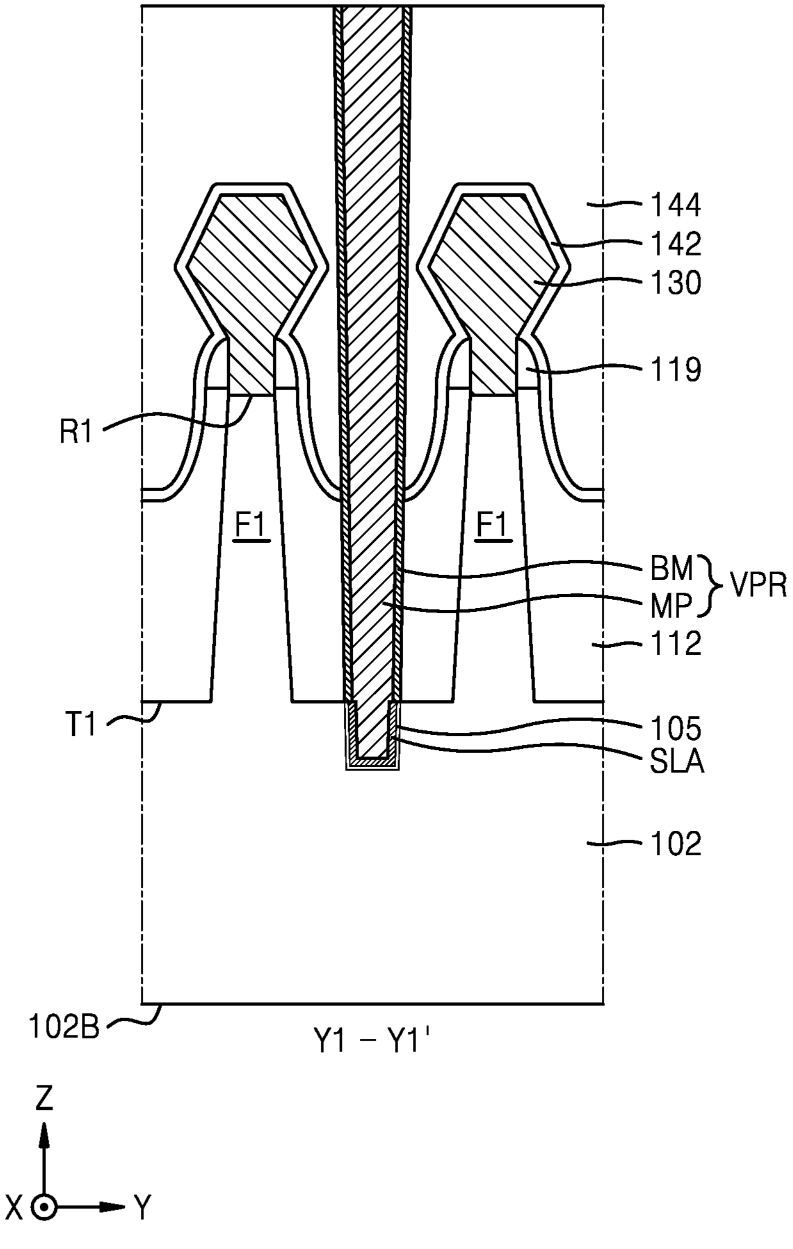

Referring to FIG. 21, the via power rail VPR may be formed by forming the metal plug MP on the conductive barrier film BM to fill the via hole VH, followed by planarizing the obtained resultant product, thereby exposing the upper surface of the inter-gate dielectric 144.

When the process described with reference to FIG. 20 to form the conductive barrier film BM is omitted, in some embodiments, a space over the first self-assembled organic material insulating liner SLA in the via hole VH may be filled with only the metal plug MP, and the metal plug MP may be in direct contact with the insulating structure including the inter-gate dielectric 144, the insulating liner 142, and the device isolation film 112.

Figure 22A:
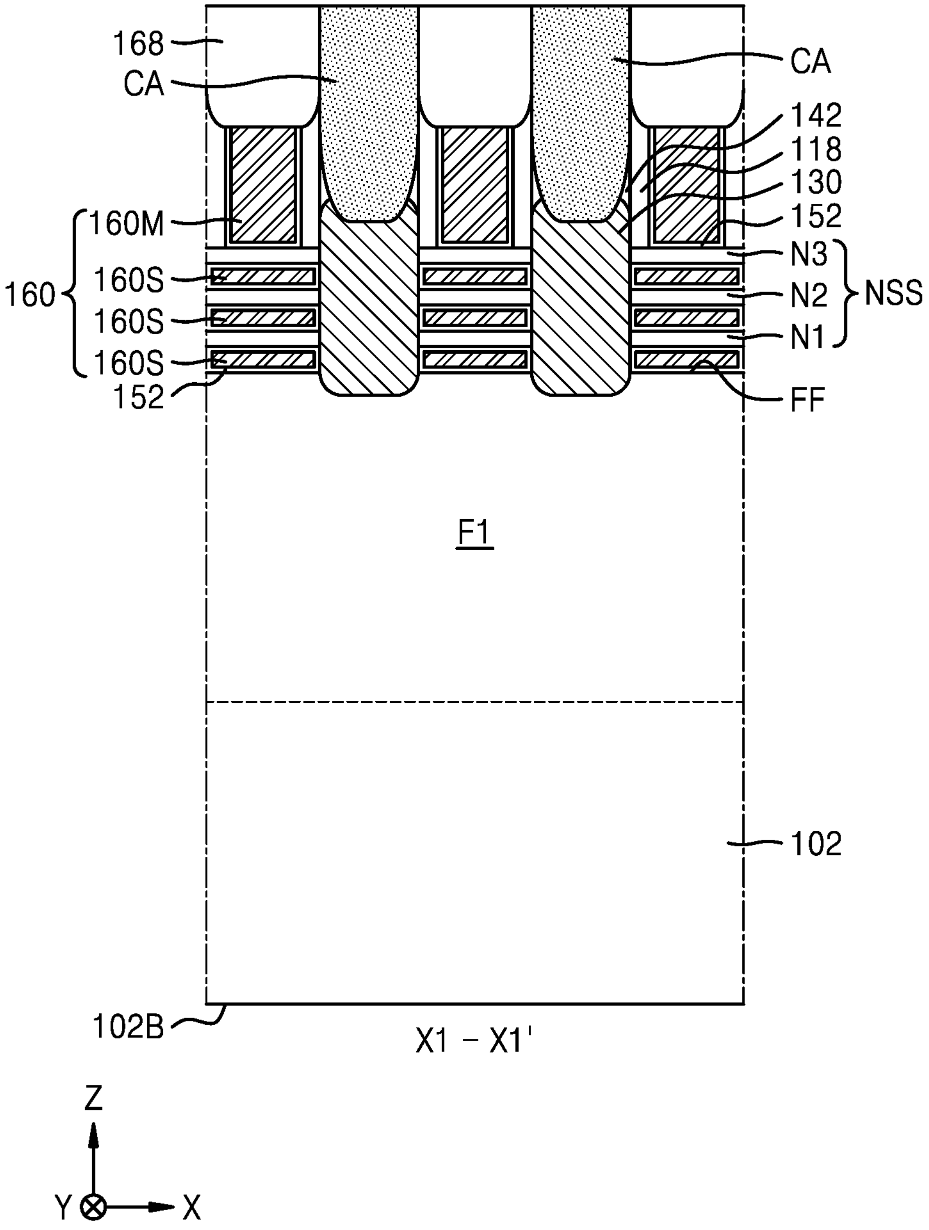
Figure 22B:
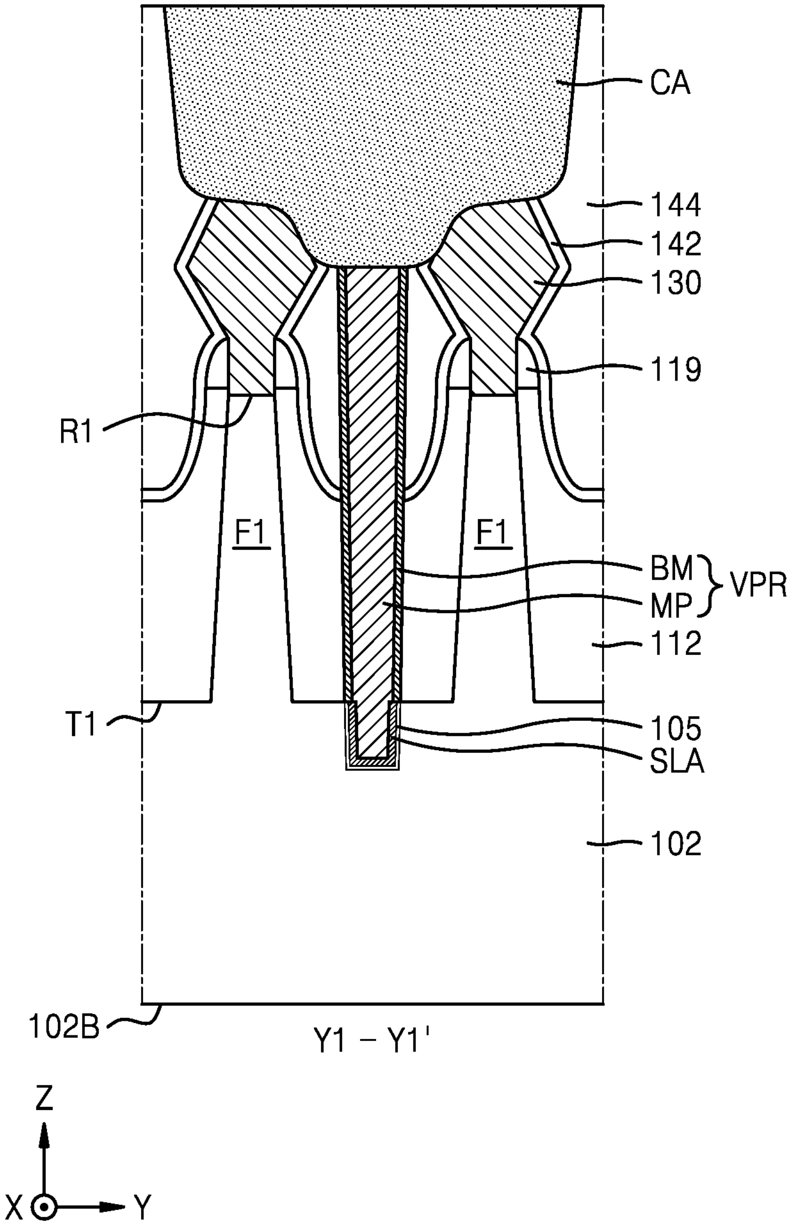

In some embodiments, with reference to FIGS. 22A and 22B, a plurality of source/drain contact holes may be formed between the plurality of gate lines 160 to respectively expose the plurality of source/drain regions 130, and the plurality of source/drain contacts CA may be respectively formed in the plurality of source/drain contact holes. In some embodiments, at least one of the plurality of source/drain contacts CA may be formed to be connected to the via power rail VPR.

In some embodiments, after the plurality of source/drain contact holes are formed and before the plurality of source/drain contacts CA are formed, a process of forming a metal silicide film on exposed surfaces of the plurality of source/drain regions 130 may be further performed.

Figure 23A:
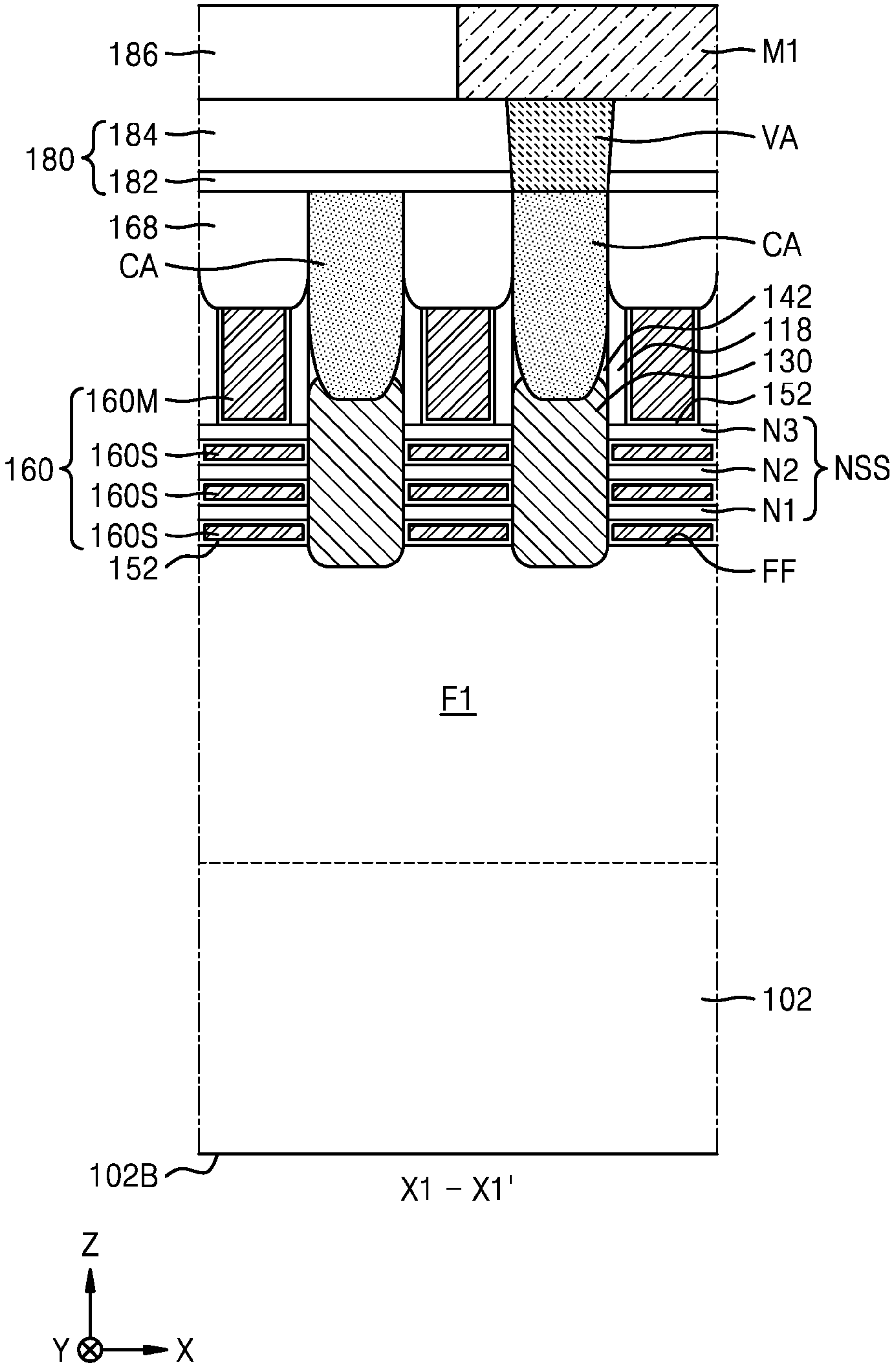
Figure 23B:
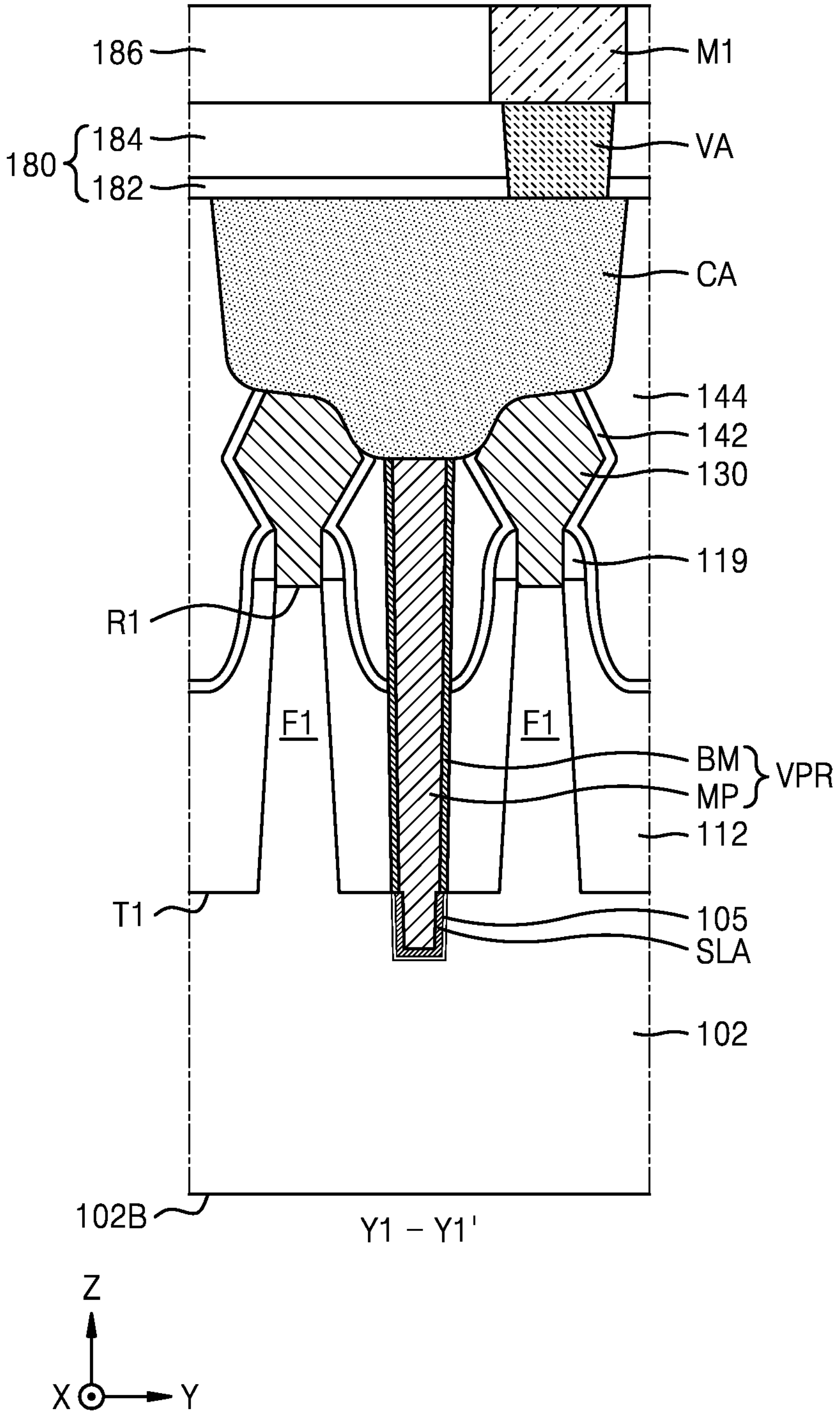
Figure 23C:
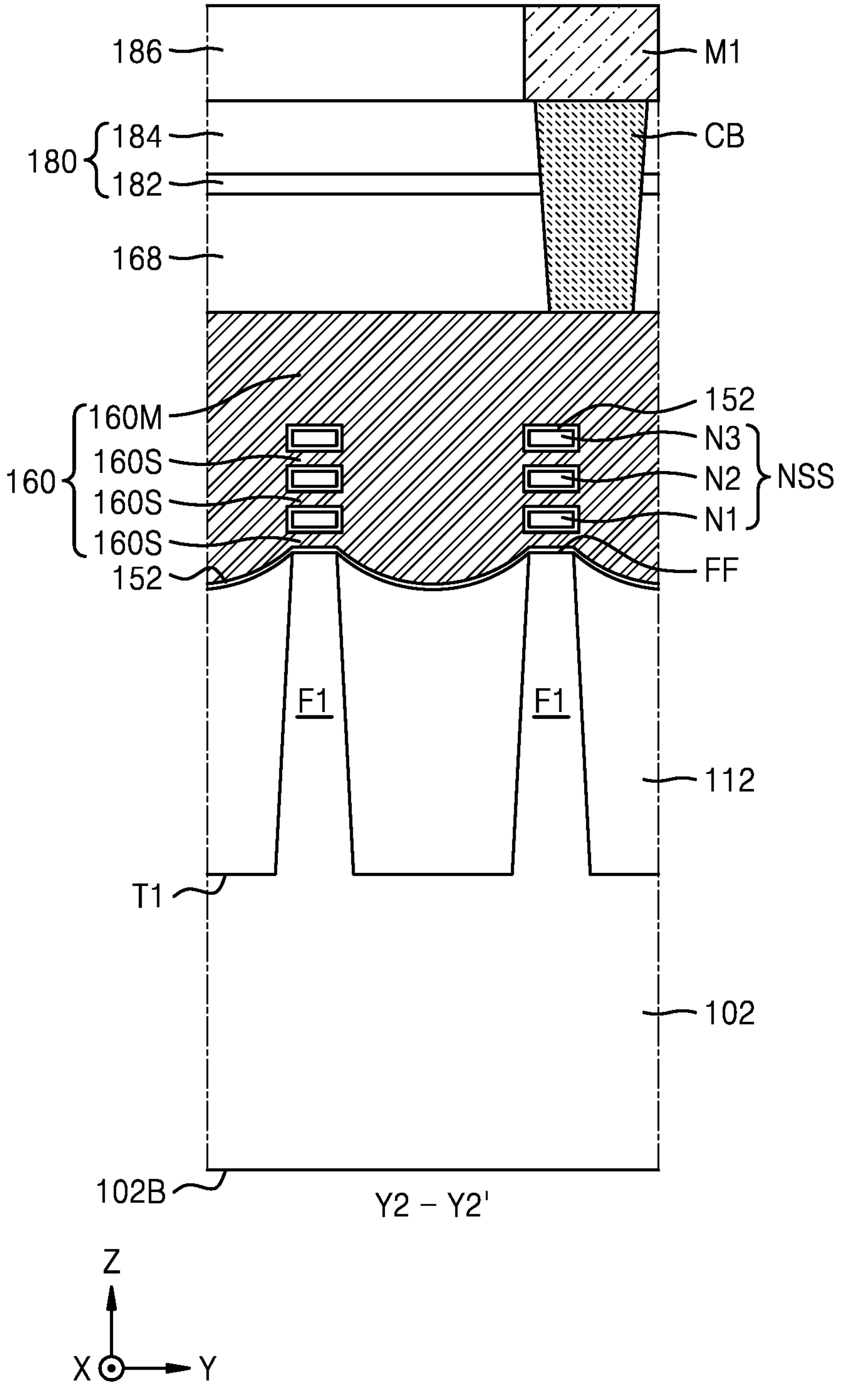

Referring to FIGS. 23A, 23B, and 23C, in some embodiments, the etch stop film 182 and the upper insulating film 184 may be formed in that order to cover the respective upper surfaces of the plurality of source/drain contacts CA, the plurality of capping insulating patterns 168, and the inter-gate dielectric 144, thereby forming the upper insulating structure 180. Next, the source/drain via contact VA, which extends through the upper insulating structure 180 in the vertical direction (e.g., Z direction) to be connected to the source/drain contact CA, and the gate contact CB, which extends through the upper insulating structure 180 and the capping insulating pattern 168 in the vertical direction (e.g., Z direction) to be connected to the gate line 160, may be formed. The source/drain via contact VA and the gate contact CB may be simultaneously formed or may be separately formed by separate processes from each other. Next, the interlayer dielectric 186, which covers the upper insulating structure 180, and the plurality of upper wiring layers M1, which extend through the interlayer dielectric 186, may be formed. The plurality of upper wiring layers M1 may include an upper wiring layer M1 connected to the source/drain via contact VA and an upper wiring layer M1 connected to the gate contact CB.

Next, a frontside wiring structure may be formed on the interlayer dielectric 186 and the plurality of upper wiring layers M1.

Figure 24:
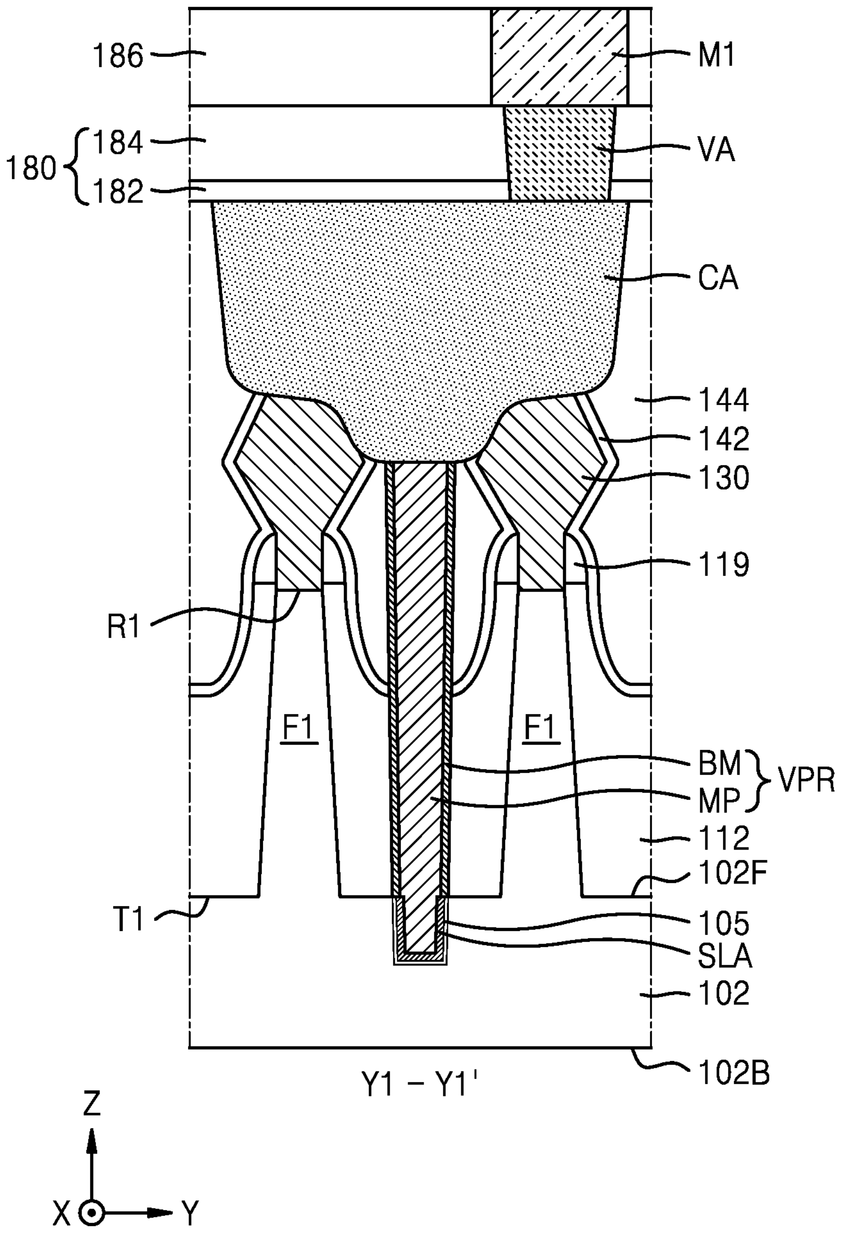

Referring to FIG. 24, the thickness of the substrate 102 in the vertical direction (e.g., Z direction) may be reduced by removing a portion of the substrate 102 from the backside surface 102B of the substrate 102. As a result, the distance between the frontside surface 102F and the backside surface 102B of the substrate 102 may be reduced. To remove the portion of the substrate 102, at least one process selected from a mechanical grinding process, a chemical mechanical polishing (CMP) process, a wet etching process, and a combination thereof may be used.

Figure 25:
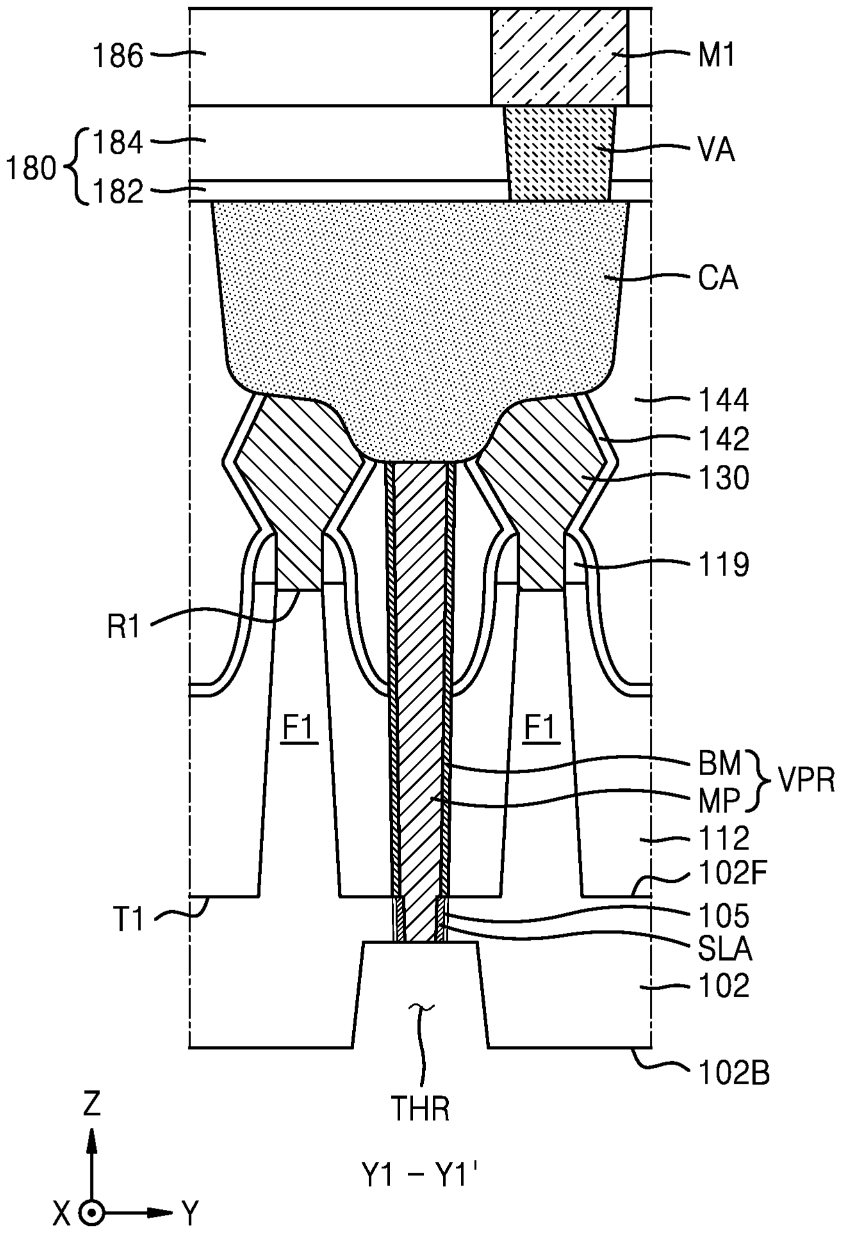

Referring to FIG. 25, in the resultant product of FIG. 24, a portion of the substrate 102 may be etched from the backside surface 102B of the substrate 102, thereby forming a through-region THR to extend through the portion of the substrate 102 in the vertical direction (e.g., Z direction). During the formation of the through-region THR, each of the first self-assembled organic material insulating liner SLA, the oxide film 105, and the metal plug MP may be partially removed, and the respective portions of the first self-assembled organic material insulating liner SLA, the oxide film 105, and the metal plug MP may be exposed by the through-region THR.

Figure 26:
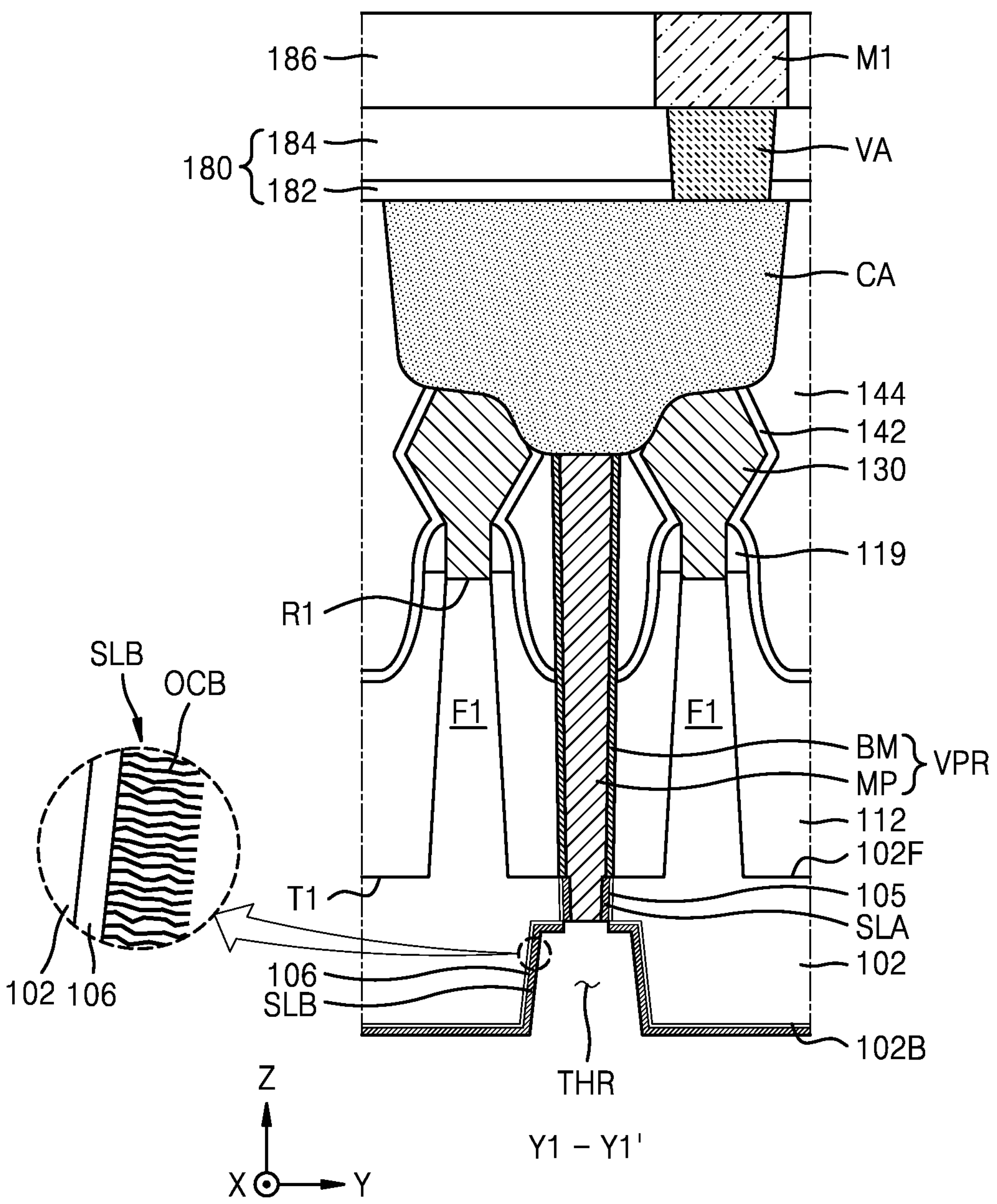

Referring to FIG. 26, the oxide film 106 and the second self-assembled organic material insulating liner SLB may be formed on an exposed surface of the substrate 102 in the resultant product in which the through-region THR is formed. In some embodiments, to form the oxide film 106 and the second self-assembled organic material insulating liner SLB, a the process described with reference to FIGS. 19A and 19B to form the oxide film 105 and the first self-assembled organic material insulating liner SLA may be similarly performed.

Figure 27:
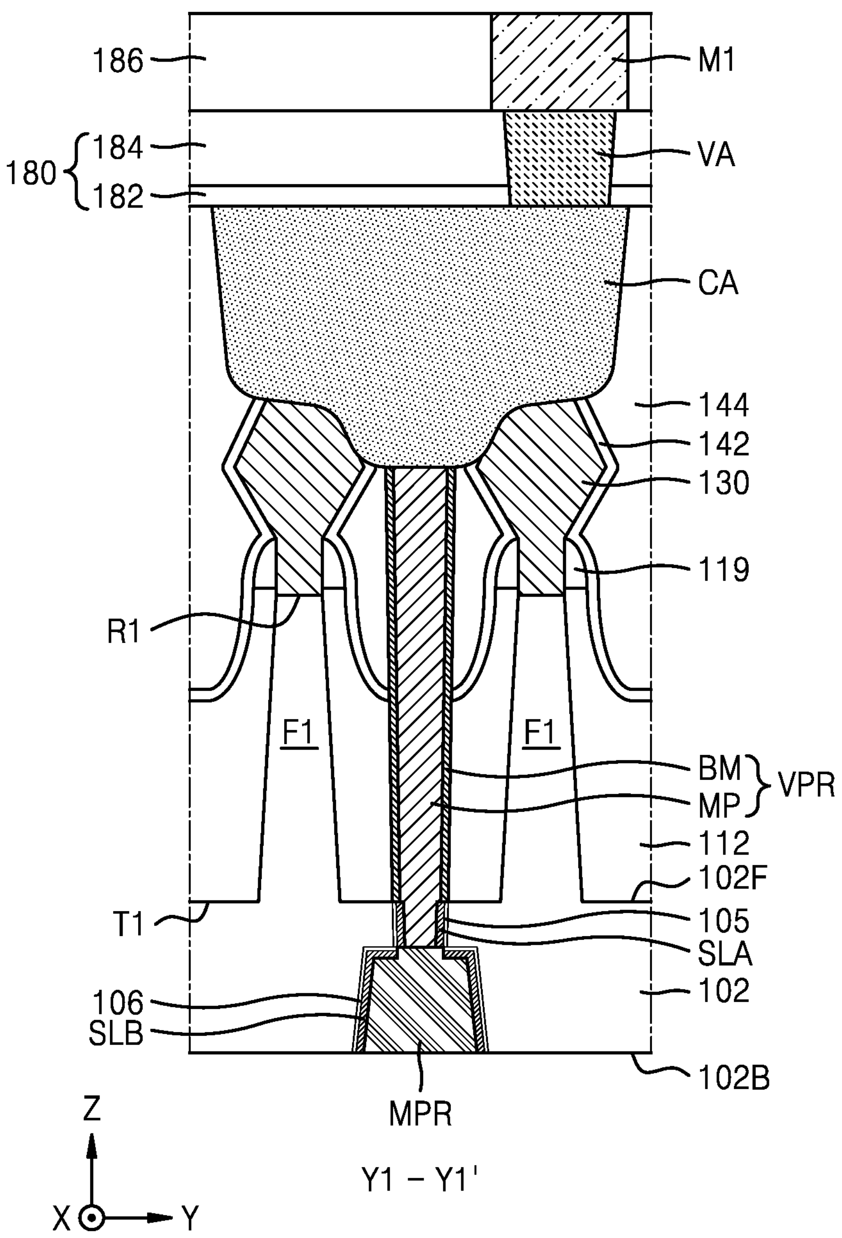

Referring to FIG. 27, in the resultant product of FIG. 26, the power rail wiring line MPR may be formed to fill the through-region THR, and then, the resultant product obtained thereby may be planarized to expose the backside surface 102B of the substrate 102. Next, a backside wiring structure may be formed on the power rail wiring line MPR and the backside surface 102B of the substrate 102, thereby fabricating the integrated circuit device 100 described with reference to FIGS. 2 and 3A to 3C.

Figure 28A:
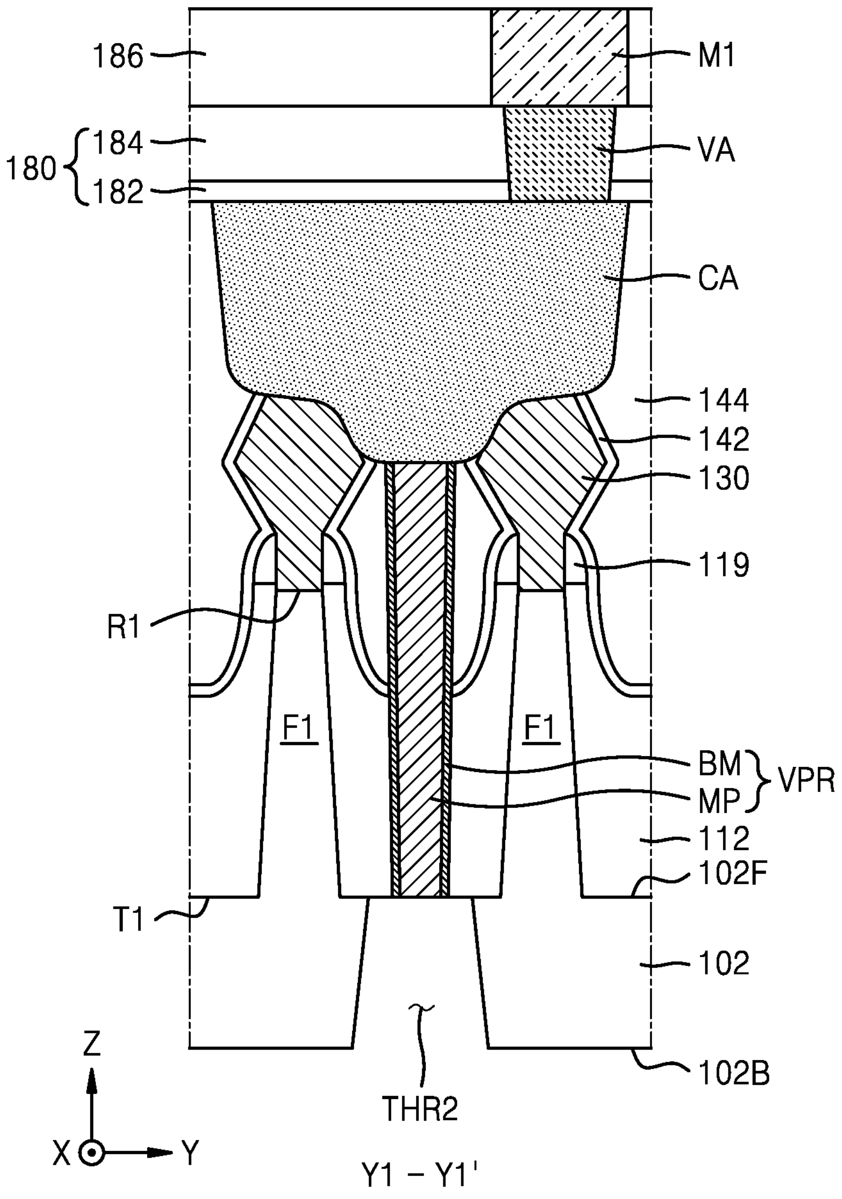
FIGS. 28A and 28B are cross-sectional views respectively illustrating corresponding processes thereto from among a sequence of processes of a method of fabricating an integrated circuit device, according to some embodiments of the present inventive concept.
Figure 28B:
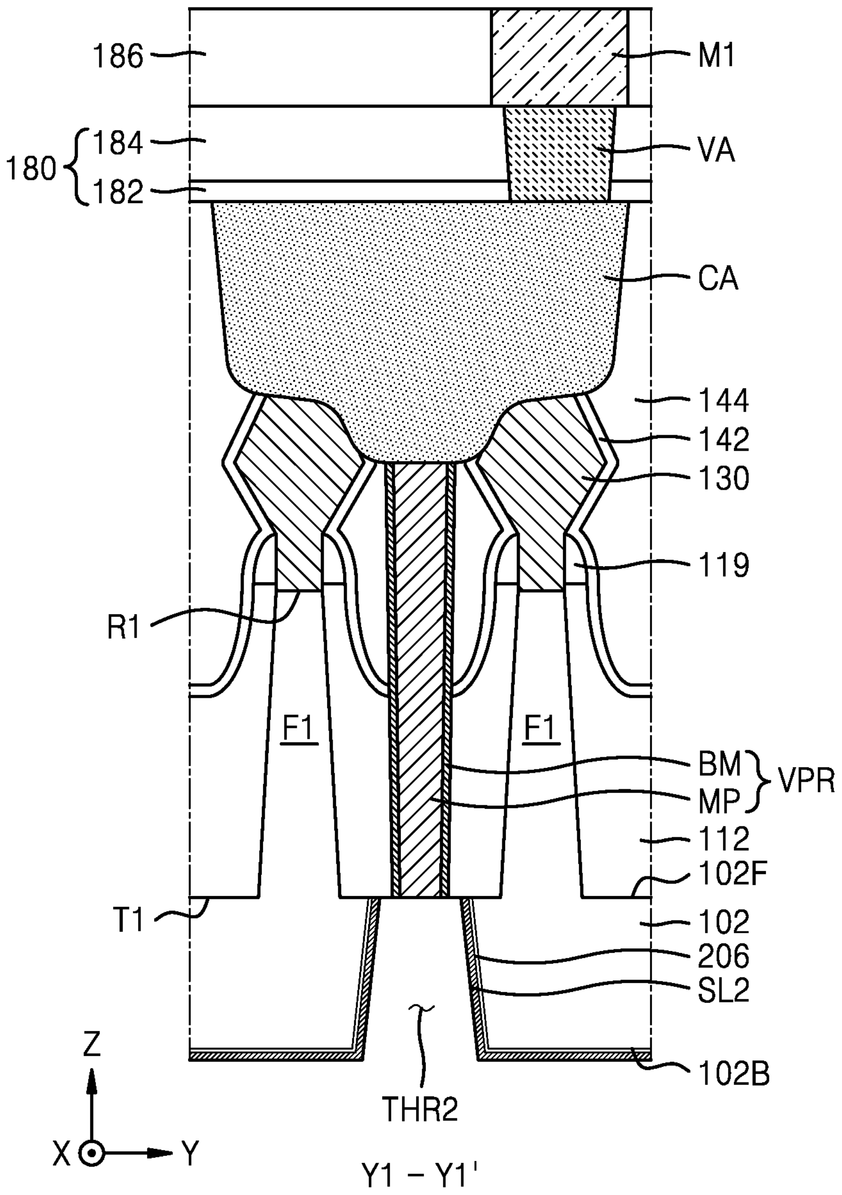

FIGS. 28A and 28B are cross-sectional views respectively illustrating corresponding processes thereto from among a sequence of processes of a method of fabricating an integrated circuit device, according to some embodiments. FIGS. 28A and 28B each illustrate an example of a cross-sectional structure of a portion of the integrated circuit device, which corresponds to the cross-section taken along the line Y1-Y1' of FIG. 2, according to the sequence of processes. An example of a method of fabricating the integrated circuit device 200A shown in FIG. 5 is described with reference to FIGS. 28A and 28B. In FIGS. 28A and 28B, the same reference numerals as in FIGS. 2 to 27 respectively denote the same members, and here, repeated descriptions thereof are omitted.

Referring to FIG. 28A, the processes described with reference to FIGS. 11A to 25 may be performed. However, the process described with reference to FIG. 19A to form each of the oxide film 105 and the first self-assembled organic material insulating liner SLA may be omitted. In addition, in the process described with reference to FIG. 25, instead of the through-region THR, a through-region THR2 may be formed to completely extend through the substrate 102 in the vertical direction (e.g., Z direction). A portion of each of the conductive barrier film BM and the metal plug MP may be exposed by the through-region THR2.

Referring to FIG. 28B, in a similar manner to that described with reference to FIG. 26, the oxide film 206 and the self-assembled organic material insulating liner SL2 may be formed on an exposed surface of the substrate 102 in the resultant product in which the through-region THR2 is formed. To form the oxide film 206 and the self-assembled organic material insulating liner SL2, a similar process to the process described with reference to FIGS. 19A and 19B to form the oxide film 105 and the first self-assembled organic material insulating liner SLA may be performed. Next, similar processes to those described with reference to FIG. 27 may be performed, thereby fabricating the integrated circuit device 200A shown in FIG. 5.

Heretofore, although the examples of the methods of fabricating the integrated circuit device 100 described with reference to FIGS. 2 and 3A to 3C and the integrated circuit device 200A shown in FIG. 5 have been described with reference to FIGS. 11A to 28D, it will be understood by those of ordinary skill in the art that, by making various modifications and changes to the examples described with reference to FIGS. 11A to 28D without departing from the spirit and scope of the inventive concept, the integrated circuit devices 200B, 300, and 400 shown in FIGS. 6 to 10B and integrated circuit devices having various structures modified and changed therefrom may be fabricated.

For example, to fabricate the integrated circuit device 400 described with reference to FIGS. 9, 10A, and 10B, similar processes to those described with reference to FIGS. 11A to 27 may be performed. However, the processes described with reference to FIGS. 18 to 21 may be omitted. In addition, in a similar manner to that described with reference to FIG. 24, the thickness of the substrate 102 in the vertical direction (e.g., Z direction) may be reduced by removing a portion of the substrate 102 from the backside surface 102B of the substrate 102, and then, a contact space DBH1, which extends through one fin-type active region F1 selected from the plurality of fin-type active regions F1 in the vertical direction (e.g., Z direction), and a contact space DBH2, which extends through the substrate 102 in the vertical direction (e.g., Z direction), may be formed, for example, by using a hardmask pattern as an etch mask. As a result, the one fin-type active region F1 may be divided into the first fin portion F1A and the second fin portion F1B, with the contact space DBH1 being therebetween. The contact spaces DBH1 and DBH2 may be connected to each other. In some embodiments, the source/drain region 130, the device isolation film 112, the first fin portion FlA, and the second fin portion F1B may be exposed by the contact spaces DBH1 and DBH2.

Next, a portion of the source/drain region 130, which is exposed by the contact spaces DBH1 and DBH2, may be removed, for example, by an anisotropic etching process, thereby allowing the contact space DBH1 to further extend toward the inside of the source/drain region 130. In some embodiments, the anisotropic etching process for forming the contact space DBH1 may be performed by using plasma. Next, the metal silicide film 192 may be formed on a surface of the source/drain region 130, which is exposed by the contact spaces DBH1 and DBH2, and the oxide film 406 and the self-assembled organic material insulating liner SL4 may be selectively formed on respective surfaces of the first fin portion FlA, the second fin portion F1B, and the substrate 102, which are exposed at inner sidewalls of the contact spaces DBH1 and DBH2. To form the oxide film 406 and the self-assembled organic material insulating liner SL4, a similar process to the process described with reference to FIGS. 19A and 19B to form the oxide film 105 and the first self-assembled organic material insulating liner SLA may be performed.

Although terms (e.g., first, second or third) may be used herein to describe various elements, these elements should not be limited by these terms. These terms are only used to distinguish one element from another. For example, a first element may be referred to as a second element, and, similarly a second element may be referred to as a first element without departing from the teachings of the disclosure.

As used herein, an element or region that is “covering” or “surrounding” or “filling” another element or region may completely or partially cover or surround or fill the other element or region.

While the inventive concept has been particularly shown and described with reference to some example embodiments thereof, it will be understood that various changes in form and details may be made therein without departing from the scope of the following claims. Accordingly, the above-disclosed subject matter is to be considered illustrative, and not restrictive, and the appended claims are intended to cover all such modifications, enhancements, and other embodiments, which fall within the scope of the inventive concept.

What is claimed is:

1. An integrated circuit device comprising:

a substrate;

an inter-cell isolation region comprising an insulating structure on a frontside surface of the substrate;

a contact structure, which comprises a first plug portion extending through the substrate and a second plug portion which extends through the insulating structure in a vertical direction and is in contact with the first plug portion, in the inter-cell isolation region; and a self-assembled organic material insulating liner between the first plug portion and the substrate.

2. The integrated circuit device of claim 1, wherein the self-assembled organic material insulating liner comprises a monolayer comprising a silicon atom.

3. The integrated circuit device of claim 1, wherein the self-assembled organic material insulating liner has a thickness of about 1 Å to about 40 Å at the smallest dimension between the substrate and the first plug portion.

4. The integrated circuit device of claim 1, wherein the self-assembled organic material insulating liner comprises a plurality of organic material chains, which each comprise a C1 to C30 alkyl group.

5. The integrated circuit device of claim 1, further comprising an oxide film between the substrate and the self-assembled organic material insulating liner, wherein the self-assembled organic material insulating liner is bonded to a surface of the oxide film, and the oxide film has a thickness of 10 Å or less.

6. The integrated circuit device of claim 1, wherein the second plug portion is connected to the first plug portion, and the second plug portion comprises a conductive barrier film, which is in contact with the insulating structure, and a metal plug that comprises a portion on which the conductive barrier film extends on and is spaced apart from the insulating structure with the conductive barrier film therebetween.

7. The integrated circuit device of claim 1, wherein the second plug portion is connected to the first plug portion, and the second plug portion comprises a metal plug, which is in contact with the insulating structure.

8. The integrated circuit device of claim 1, further comprising:

a fin-type active region protruding in the vertical direction from the frontside surface of the substrate;

a source/drain region, which is on the fin-type active region and is spaced apart from the substrate in the vertical direction with the fin-type active region therebetween; and a source/drain contact, which is spaced apart from the substrate in the vertical direction with the fin-type active region and the source/drain region therebetween and is connected to the source/drain region, wherein the second plug portion comprises a first end contacting the first plug portion, a second end contacting the source/drain contact, and a sidewall facing the fin-type active region and the source/drain region in a horizontal direction.

9. The integrated circuit device of claim 1, wherein the substrate comprises a pair of cell regions, which are spaced apart from each other in a first horizontal direction, and wherein the inter-cell isolation region is between the pair of cell regions and extends longitudinally in a second horizontal direction intersecting with the first horizontal direction, the inter-cell isolation region comprising the insulating structure.

10. The integrated circuit device of claim 9, further comprising:

a power line, which extends longitudinally in the first horizontal direction on a backside surface of the substrate and comprises portions respectively overlapping the pair of cell regions and the inter-cell isolation region in the vertical direction; and an upper wiring structure, which is spaced apart from the frontside surface of the substrate in the vertical direction with the insulating structure therebetween, wherein the first plug portion of the contact structure is connected to the power line, and the second plug portion of the contact structure is connected to the upper wiring structure.

11. The integrated circuit device of claim 1, further comprising:

a fin-type active region comprising a first fin portion and a second fin portion, which are spaced apart from each other in a first horizontal direction with the contact structure therebetween and extends longitudinally along a straight line extending in the first horizontal direction, each of the first fin portion and the second fin portion comprising a sidewall on which the insulating structure extends on;

a gate line traversing the first fin portion and extending longitudinally in a second horizontal direction that is perpendicular to the first horizontal direction; and a source/drain region on the fin-type active region and adjacent to the gate line, the source/drain region being connected to the contact structure, wherein the second plug portion extends longitudinally in the vertical direction between the first fin portion and the second fin portion, and the second plug portion comprises a first end connected to the first plug portion, a second end connected to the source/drain region, first sidewalls facing the first fin portion and the second fin portion in the first horizontal direction, and second sidewalls facing the insulating structure in the second horizontal direction.

12. An integrated circuit device comprising:

an inter-cell isolation region comprising a substrate comprising a frontside surface and a backside surface opposite to the frontside surface;

a plurality of fin-type active regions protruding in a vertical direction from the substrate and extending longitudinally in a first horizontal direction;

an insulating structure comprising a device isolation film, which extends on a sidewall of each of the plurality of fin-type active regions;

a plurality of gate lines traversing the plurality of fin-type active regions;

a plurality of source/drain regions on the plurality of fin-type active regions, respectively;

a contact structure extending through the substrate and the insulating structure in the vertical direction; and a self-assembled organic material insulating liner between the contact structure and the substrate, wherein the contact structure comprises a first plug portion, which extends through the substrate and is in contact with the self-assembled organic material insulating liner, and a second plug portion, which extends through the insulating structure and is connected to the first plug portion, in the inter-cell isolation region.

13. The integrated circuit device of claim 12, wherein the self-assembled organic material insulating liner comprises a monolayer comprising a silicon atom.

14. The integrated circuit device of claim 12, wherein the self-assembled organic material insulating liner comprises a plurality of organic material chains, which each comprise a C1 to C30 alkyl group.

15. The integrated circuit device of claim 12, further comprising an oxide film between the substrate and the self-assembled organic material insulating liner, wherein the self-assembled organic material insulating liner is bonded to a surface of the oxide film.

16. The integrated circuit device of claim 12, wherein the first plug portion of the contact structure comprises a frontside plug, which has a first width in a second horizontal direction intersecting with the first horizontal direction, and a backside plug, which has a second width that is greater than the first width of the frontside plug in the second horizontal direction, and the self-assembled organic material insulating liner comprises a first self-assembled organic material insulating liner, which is between the frontside plug and the substrate, and a second self-assembled organic material insulating liner, which is between the backside plug and the substrate.

17. The integrated circuit device of claim 12, further comprising a source/drain contact connected to a pair of source/drain regions, which are selected from the plurality of source/drain regions and are adjacent to each other, wherein the source/drain contact is spaced apart from the frontside surface of the substrate with the pair of source/drain regions therebetween, and the second plug portion of the contact structure extends longitudinally in the vertical direction and extends between a pair of fin-type active regions, which are selected from the plurality of fin-type active regions and are adjacent to each other, and between the pair of source/drain regions, the second plug portion being in contact with the source/drain contact.

18. The integrated circuit device of claim 12, further comprising:

a pair of cell regions that are spaced apart from each other in the first horizontal direction in the substrate;

wherein the inter-cell isolation region is between the pair of cell regions in the substrate;

a plurality of dummy gate insulating lines in the inter-cell isolation region;

an upper wiring layer, which is spaced apart from the frontside surface of the substrate in the vertical direction with the insulating structure therebetween in the inter-cell isolation region; and a power line, which extends longitudinally in the first horizontal direction on the backside surface of the substrate and comprises portions respectively overlapping the pair of cell regions and the inter-cell isolation region in the vertical direction, wherein the first plug portion of the contact structure is connected to the power line in the inter-cell isolation region, and the second plug portion of the contact structure extends through the insulating structure in the vertical direction in the inter-cell isolation region to be connected to the upper wiring layer.

19. The integrated circuit device of claim 12, wherein a first fin-type active region selected from the plurality of fin-type active regions comprises a first fin portion and a second fin portion, which are spaced apart from each other in the first horizontal direction with the contact structure therebetween and extend longitudinally along a straight line extending in the first horizontal direction, each of the first fin portion and the second fin portion comprising a sidewall on which the insulating structure extends on, a first source/drain region selected from the plurality of source/drain regions is connected to the second plug portion of the contact structure, and the self-assembled organic material insulating liner is between the first plug portion and the substrate, between the second plug portion and the first fin portion, and between the second plug portion and the second fin portion.

20. An integrated circuit device comprising:

an inter-cell isolation region comprising a substrate comprising a frontside surface and a backside surface opposite to the frontside surface;

a fin-type active region protruding in a vertical direction from the substrate and extending longitudinally in a first horizontal direction;

a gate line traversing the fin-type active region and extending longitudinally in a second horizontal direction that intersects with the first horizontal direction;

at least one nanosheet that is between the fin-type active region and the gate line and comprises a portion in the gate line;

a source/drain region on the fin-type active region and contacting the at least one nanosheet;

an insulating structure comprising a device isolation film that is on both sidewalls of the fin-type active region;

a contact structure extending through the substrate and the insulating structure in the vertical direction, the contact structure comprising a first plug portion which extends through the substrate and a second plug portion which extends through the insulating structure in the vertical direction and is in contact with the first plug portion, in the inter-cell isolation region; and a self-assembled organic material insulating liner between the contact structure and the substrate, wherein the self-assembled organic material insulating liner comprises a plurality of organic material chains, each comprising a silicon atom and a C1 to C30 alkyl group.

* * * * *